(12) United States Patent
Mizutami et al.

(10) Patent No.: US 7,691,560 B2
(45) Date of Patent: Apr. 6, 2010

(54) RESIST COMPOSITION AND PATTERN FORMING METHOD USING THE SAME

(75) Inventors: Kazuyoshi Mizutami, Haibara-gun (JP); Shinichi Sugiyama, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 453 days.

(21) Appl. No.: 11/727,002

(22) Filed: Mar. 23, 2007

(65) Prior Publication Data
US 2007/0224539 A1     Sep. 27, 2007

(30) Foreign Application Priority Data

| Mar. 23, 2006 | (JP) | ............................... 2006-081108 |
| Aug. 10, 2006 | (JP) | ............................... 2006-218462 |
| Feb. 14, 2007 | (JP) | ............................... 2007-033845 |

(51) Int. Cl.
*G03F 7/00*     (2006.01)

(52) U.S. Cl. .............. 430/270.1; 430/282.1; 430/283.1; 430/284.1

(58) Field of Classification Search .............. 430/270.1, 430/282.1, 283.1, 284.1
See application file for complete search history.

(56) References Cited

U.S. PATENT DOCUMENTS

| 4,251,626 | A * | 2/1981 | Minamizono et al. ....... 430/527 |
| 5,919,608 | A | 7/1999 | Haque et al. |
| 6,274,286 | B1 | 8/2001 | Hatakeyama et al. |
| 6,642,404 | B2 * | 11/2003 | Kobayashi et al. ............ 558/47 |
| 6,749,987 | B2 * | 6/2004 | Kodama et al. .......... 430/270.1 |
| 2004/0152012 | A1 | 8/2004 | Iwato |

FOREIGN PATENT DOCUMENTS

| EP | 0 708 368 A1 | 4/1996 |
| EP | 0 881 539 A1 | 2/1998 |
| EP | 0 887 705 A | 12/1998 |
| EP | 0881539 A1 | 12/1998 |
| EP | 0919867 A2 | 6/1999 |
| EP | 1 598 701 A1 | 11/2005 |
| EP | 1688791 A2 | 8/2006 |
| JP | 3-200968 A | 9/1991 |
| JP | 7-92680 A | 4/1995 |
| JP | 7-234504 A | 9/1995 |
| JP | 7-508840 | 9/1995 |
| JP | 11-44950 A | 2/1999 |
| JP | 11-084639 A | 3/1999 |
| JP | 2000-181065 A | 6/2000 |
| JP | 2002-341522 A | 11/2002 |
| WO | 03/045306 A2 * | 6/2003 |

OTHER PUBLICATIONS

Database WPI Week 200369 XP-002444266 (JP 2002 363146 A and JP 2002 363146 A).

* cited by examiner

*Primary Examiner*—Thorl Chea
(74) *Attorney, Agent, or Firm*—Sughrue Mion, PLLC

(57) ABSTRACT

A resist composition comprising at least one kind of a nitrogen-containing compound selected from the group consisting of an amine compound having a phenoxy group, an ammonium salt compound having a phenoxy group, an amine compound having a sulfonic acid ester group and an ammonium salt compound having a sulfonic acid ester group; and a pattern forming method using the composition.

18 Claims, No Drawings

RESIST COMPOSITION AND PATTERN FORMING METHOD USING THE SAME

BACKGROUND OF THE INVENTION

1. Field of the Invention

The present invention relates to a resist composition suitable for use in the ultramicrolithography process such as production of VLSI or high-capacity microchip or in other photofabrication processes, and a pattern forming method using the composition. More specifically, the present invention relates to a resist composition capable of forming a high-resolution pattern by using electron beam, X-ray, excimer laser or the like, and a pattern forming method using the composition.

2. Description of the Related Art

The electron beam lithography is positioned as the next-generation or next-next-generation pattern formation technique, and a resist assured of high resolution and good line edge roughness is strongly demanded.

As regards the resist for electron beam or X-ray, the resist technique for KrF excimer laser has been heretofore mainly utilized and studied. For example, there are disclosed a combination of a compound capable of generating an acid upon irradiation with electron beams and an amine compound having a boiling point of 250° C. or less in JP-A-2000-181065 (the term "JP-A" as used herein means an "unexamined published Japanese patent application"), a combination use of an acid-decomposable group-containing polymer, an acid generator and an electron beam sensitizer in European Patent 0919867, and a combination use of an amide compound in JP-T-7-508840 (the term (the term "JP-T" as used herein means a "published Japanese translation of a PCT patent application"). Furthermore, JP-A-3-200968 discloses use of a maleimide compound, JP-A-7-92680 discloses use of a sulfonamide compound, and JP-A-11-44950 discloses a sulfonimide compound containing an —$SO_2$—NH—$SO_2$— partial structure. However, in all of these attempts for improvement, both high resolution and good line edge roughness cannot be satisfied at the same time. The edge roughness as used herein means to have an appearance such that due to properties of the resist, the edge at the interface between the resist line pattern and the substrate is irregularly fluctuated in the direction perpendicular to the line direction. When this pattern is viewed from right above, irregularities are observed on the edge. These irregularities are transferred to the substrate in the etching step and if the irregularities are large, this causes electrical characteristic failure and reduction of the yield.

In this way, conventionally known combinations can hardly realize both sufficiently high resolution and good edge roughness under irradiation with electron beams or X rays, and it is strongly demanded to satisfy these two properties at the same time.

Formation of an ultrafine pattern of 0.20 μm or less is targeted also in the lithography using short-wavelength excimer laser light such as KrF or ArF for the exposure light source, but it is impossible to satisfy both the resolution and the sidelobe margin at the same time, and a resist composition capable of simultaneously satisfying these properties is strongly demanded.

SUMMARY OF THE INVENTION

An object of the present invention is to solve the problems in the technology for enhancing the performance at the time of fine-processing a semiconductor device by using actinic rays or radiation, particularly, electron beam, X-ray, KrF excimer laser light or ArF excimer laser light, and provide a resist composition excellent in the resolution, line edge roughness and sidelobe margin, and a pattern forming method using the composition.

The object of the present invention is attained by the following constitutions.

(1) A resist composition, which comprises:

at least one kind of a nitrogen-containing compound selected from the group consisting of an amine compound having a phenoxy group and an ammonium salt compound having a phenoxy group.

(2) The resist composition as described in (1) above, wherein the at least one kind of the nitrogen-containing compound selected from the group consisting of an amine compound having a phenoxy group and an ammonium salt compound having a phenoxy group has at least one oxyalkylene group between the phenoxy group and the nitrogen atom.

(3) The resist composition as described in (1) or (2) above, wherein the at least one kind of the nitrogen-containing compound is an amine compound having a phenoxy group, and the amine compound having a phenoxy group is a tertiary amine compound.

(4) The resist composition as described in any of (1) to (3) above, wherein the at least one kind of the nitrogen-containing compound is an amine compound having a phenoxy group, and the amine compound having a phenoxy group has a molecular weight of from 300 to 1000.

(5) The resist composition as described in any of (1) to (4) above, which is a positive resist composition that comprises:

(C1) at least one kind of a nitrogen-containing compound selected from the group consisting of an amine compound having a phenoxy group and an ammonium salt compound having a phenoxy group;

(B) a compound of which solubility in an alkali developer increases under an action of an acid; and (A) a compound capable of generating an acid upon irradiation with actinic rays or radiation.

(6) The resist composition as described in (5) above, wherein the (B) compound of which solubility in an alkali developer increases under an action of an acid is a resin having a repeating unit represented by formula (A1) or (A2):

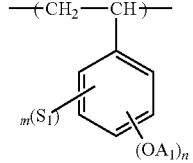

(A1)

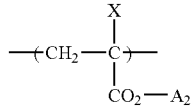

(A2)

wherein in formula (A1), $A_1$ represents a group which is eliminated under an action of an acid, represented by —$C(R^{01})(R^{02})(R^{03})$ or —$C(R^{04})(R^{05})$—O—$R^{06}$, wherein $R^{01}$ to $R^{03}$ each independently represents an alkyl group, a cycloalkyl group or an aryl group and may combine with each other to form a ring or a crosslinked ring; $R^{04}$ and $R^{05}$ each independently represents a hydrogen atom, an alkyl group, a cycloalkyl group or an aryl group; and $R^{06}$ represents an alkyl group, a cycloalkyl group or an aryl group;

$S_1$ represents a substituent, and when a plurality of $S_1$s are present, the plurality of $S_1$s may be the same or different;

n represents an integer of 0 to 3; and m represents an integer of 0 to 3, provided that m+n≦5, and in formula (A2), $A_2$ represents a group which is eliminated under an action of an acid, represented by —C($R^{O1}$)($R^{O2}$)($R^{O3}$), wherein $R^{O1}$ to $R^{O3}$ each independently represents an alkyl group, a cycloalkyl group or an aryl group and may combine with each other to form a ring or a crosslinked ring; and X represents a hydrogen atom, an alkyl group, a halogen atom, a cyano group or an alkyloxycarbonyl group.

(7) The resist composition as described in (5) above, wherein the (B) compound of which solubility in an alkali developer increases under an action of an acid is a resin having a repeating unit represented by formula (A3):

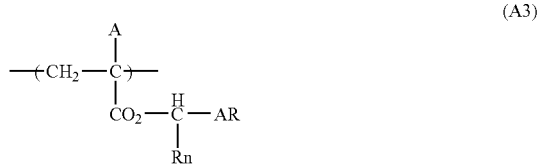

(A3)

wherein in formula (A3), AR represents a benzene ring or a naphthalene ring;

Rn represents an alkyl group, a cycloalkyl group or an aryl group;

Rn and AR may be combined together to form a ring; and

A represents a hydrogen atom, an alkyl group, a cycloalkyl group, a halogen atom, a cyano group or an alkyloxycarbonyl group.

(8) The resist composition as described in any of (5) to (7) above, which comprises:

at least one kind of a compound selected from the group consisting of a triarylsulfonium salt of an organosulfonic acid; and at least one kind of a compound selected from the group consisting of a diazodisulfone derivative and an oxime ester of an organosulfonic acid, as the (A) compound capable of generating an acid upon irradiation with actinic rays or radiation.

(9) The resist composition as described in any of (5) to (7) above, which comprises:

at least one kind of a compound selected from the group consisting of a compound capable of generating an organosulfonic acid upon irradiation with actinic rays or radiation; and at least one kind of a compound selected from the group consisting of a compound capable of generating a carboxylic acid or an imide acid upon irradiation with actinic rays or radiation, as the (A) compound capable of generating an acid upon irradiation with actinic rays or radiation.

(10) A resist composition, which comprises:

at least one kind of a nitrogen-containing compound selected from the group consisting of an amine compound having a sulfonic acid ester group and an ammonium salt compound having a sulfonic acid ester group.

(11) The resist composition as described in (10) above, wherein the at least one kind of the nitrogen-containing compound selected from the group consisting of an amine compound having a sulfonic acid ester group and an ammonium salt compound having a sulfonic acid ester group has at least one oxyalkylene group between the sulfonic acid ester group and the nitrogen atom.

(12) The resist composition as described in (10) or (11) above, which is a positive resist composition that comprises:

(C2) at least one kind of a nitrogen-containing compound selected from the group consisting of an amine compound having a sulfonic acid ester group and an ammonium salt compound having a sulfonic acid ester group;

(B) a compound of which solubility in an alkali developer increases under an action of an acid; and (A) a compound capable of generating an acid upon irradiation with actinic rays or radiation.

(13) A pattern forming method, which comprises:

forming a resist film from a resist composition as described in any of (1) to (12) above; and exposing and developing the resist film.

DETAILED DESCRIPTION OF THE INVENTION

The best mode for carrying out the present invention is described below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] (C) Nitrogen-containing Compound

The resist composition of the present invention comprises at least one kind of nitrogen-containing compound selected from amine compounds having a phenoxy group, ammonium salt compounds having a phenoxy group, amine compounds having a sulfonic acid ester group and ammonium salt compounds having a sulfonic acid ester group (hereinafter sometimes referred to as a "nitrogen-containing compound (C)" or a "component (C)").

As for the amine compound, a primary, secondary or tertiary amine compound can be used, and an amine compound where at least one alkyl group is bonded to the nitrogen atom is preferred. The amine compound is preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. Examples of the organic sulfonate include an alkyl sulfonate having a carbon number of 1 to 20 and an aryl sulfonate. The alkyl group of the alkyl sulfonate may have a substituent, and examples of the substituent include fluorine, chlorine, bromine, an alkoxy group, an acyl group and an aryl group. Specific examples of the alkyl sulfonate include methanesulfonate, ethanesulfonate, butanesulfonte, hexanesulfonate, octanesulfonate, benzylsulfonate, trifluoromethanesulfonate, pentafluoroethanesulfonte and nonafluorobutanesulfonate. The aryl group of the aryl sulfonate includes a benzene ring, a naphthalene ring and an anthracene ring. The benzene ring, naphthalene ring and anthracene ring may have a substituent and as for the substituent, a linear or branched alkyl group having a carbon number of 1 to 6 and a cycloalkyl group having a carbon number of 3 to 6 are preferred. Specific examples of the linear or branched alkyl group and the cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The amine compound having a phenoxy group and the ammonium salt compound having a phenoxy group are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution position of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

The sulfonic acid ester group in the amine compound having a sulfonic acid ester group and the ammonium salt compound having a sulfonic acid ester group may be any of an akylsulfonic acid ester, a cycloalkylsulfonic acid ester and an arylsulfonic acid ester. In the case of an alkylsulfonic acid ester, the alkyl group preferably a carbon number of 1 to 20, in the case of a cycloalkylsulfonic acid ester, the cycloalkyl group preferably has a carbon number of 3 to 20, and in the case of an arylsulfonic acid ester, the aryl group preferably has a carbon number of 6 to 12. The akylsulfonic acid ester, cycloalkylsulfonic acid ester and arylsulfonic acid ester may have a substituent and as for the substituent, a halogen atom, a cyano group, a nitro group, a carboxyl group, a carboxylic acid ester group and a sulfonic acid ester group are preferred.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

The molecular weight of the nitrogen-containing compound (C) is preferably from 300 to 1000.

Specific examples of the nitrogen-containing compound (C) are set forth below, but the present invention is not limited thereto.

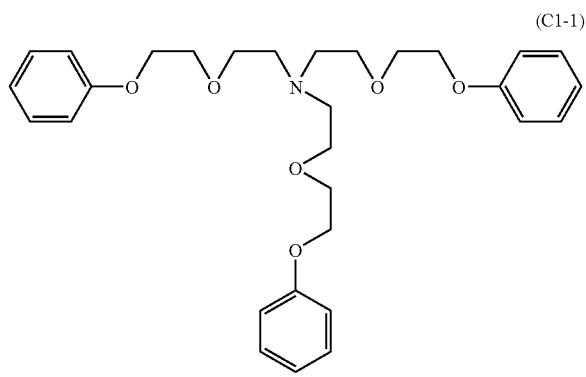

(C1-1)

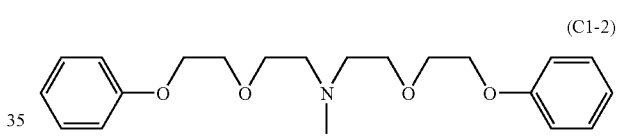

(C1-2)

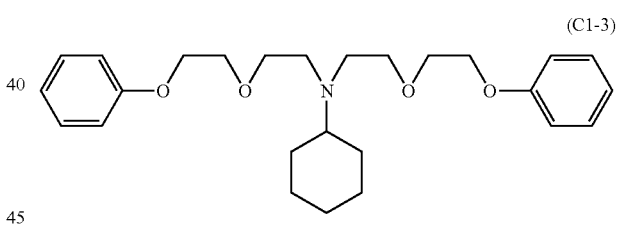

(C1-3)

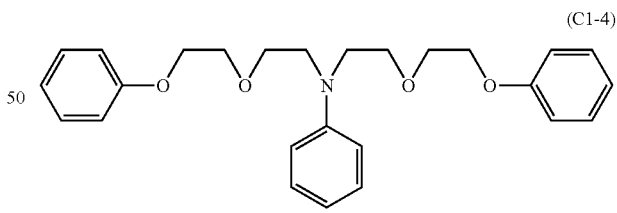

(C1-4)

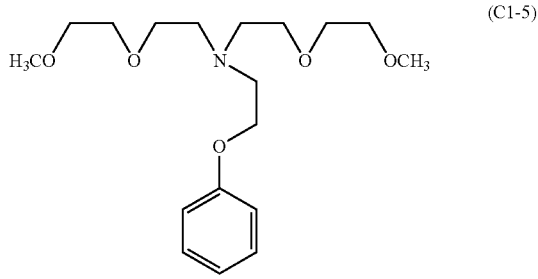

(C1-5)

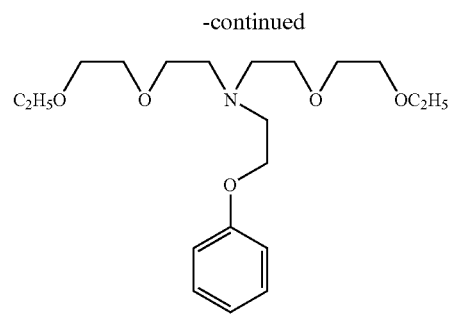 (C1-6)
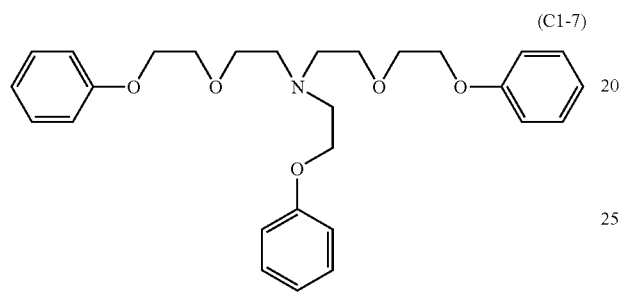 (C1-7)
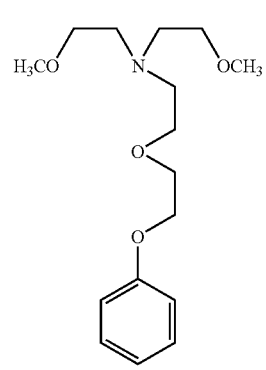 (C1-8)
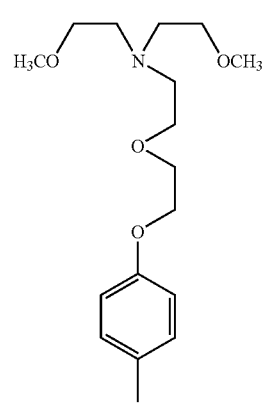 (C1-9)
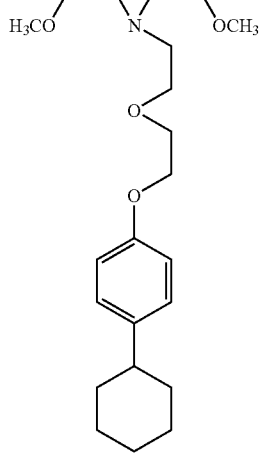 (C1-10)
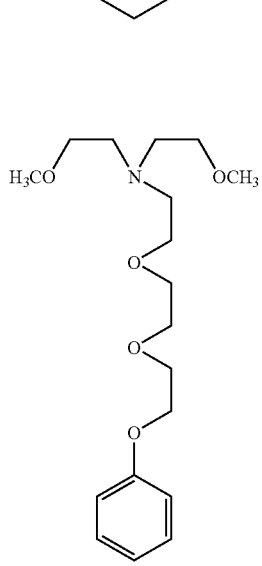 (C1-11)
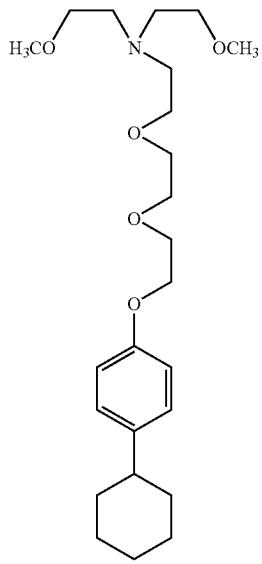 (C1-12)

-continued
(C1-13)
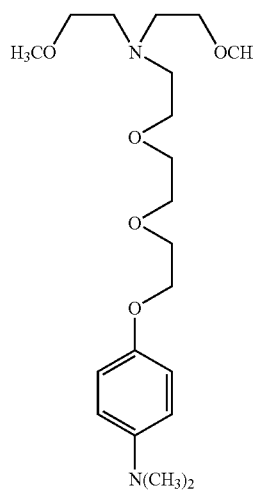
(C1-14)
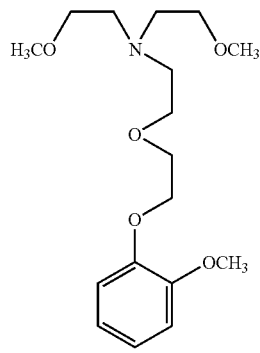
(C1-15)
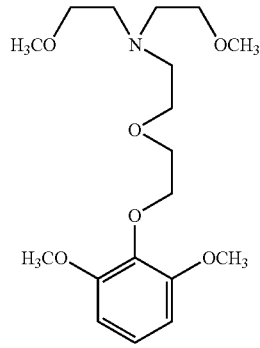
(C1-16)
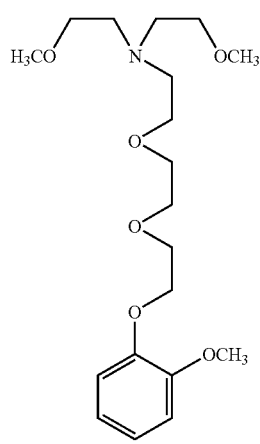
-continued
(C1-17)
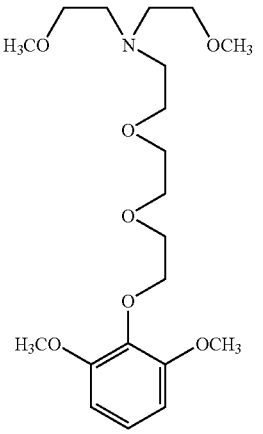
(C1-18)
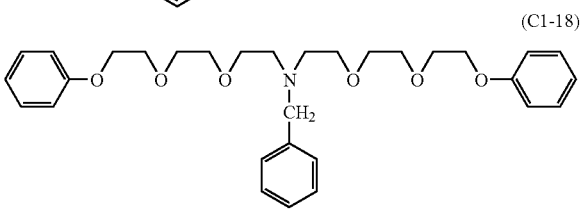
(C1-19)
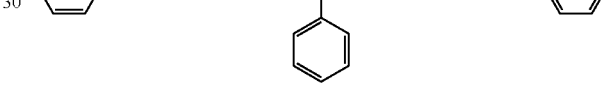
(C1-20)
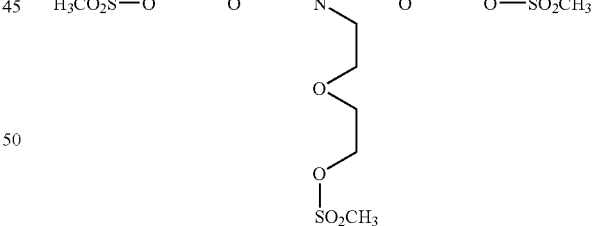
(C2-1)
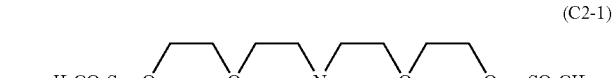
(C2-2)
(C2-3)
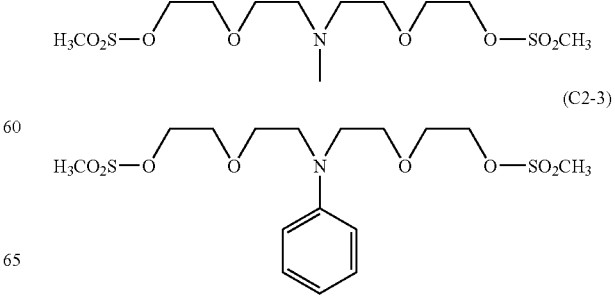

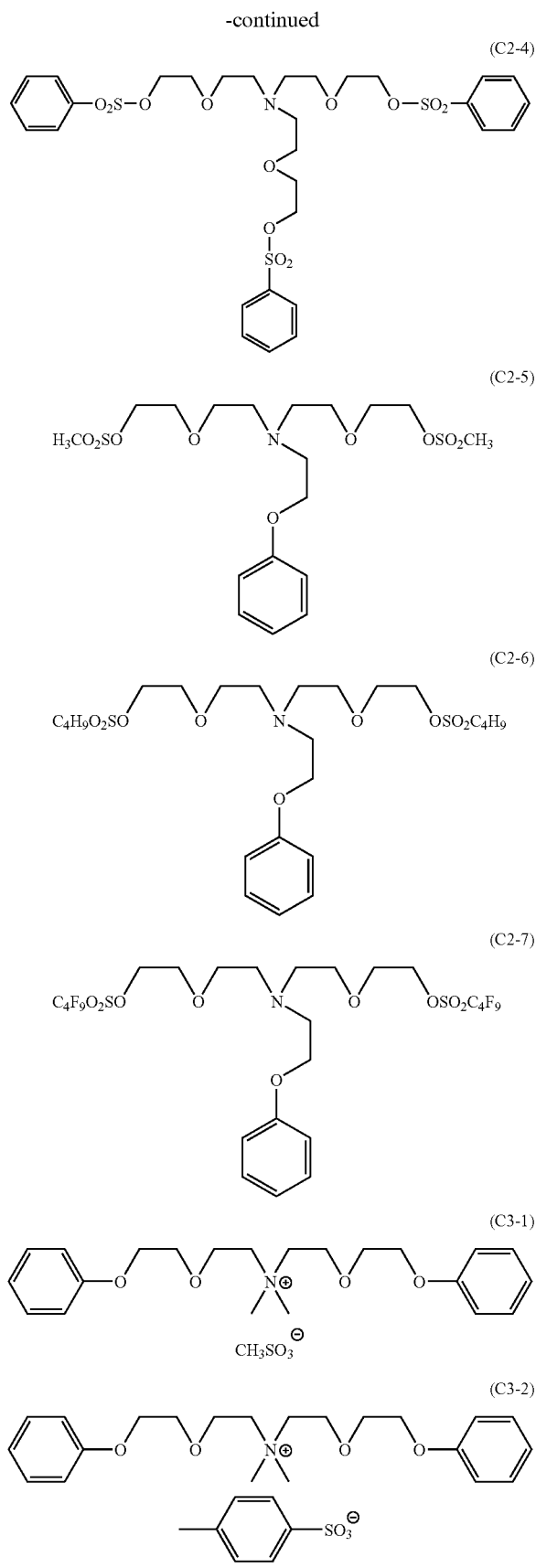

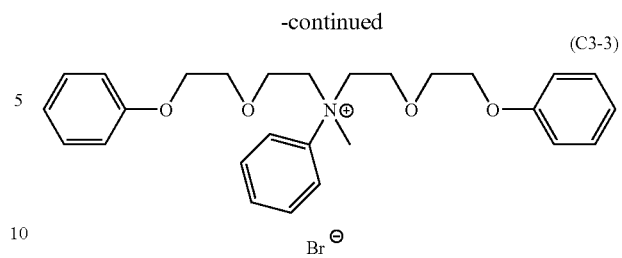

The amine compound having a phenoxy group can be obtained by reacting under heating a primary or secondary amine having a phenoxy group with a haloalkyl ether, adding an aqueous solution of strong base such as sodium hydroxide, potassium hydroxide and tetraalkylammonium, and performing extraction with an organic solvent such as ethyl acetate and chloroform, or by reacting under heating a primary or secondary amine with a haloalkyl ether having a phenoxy group at the terminal, adding an aqueous solution of strong base such as sodium hydroxide, potassium hydroxide and tetraalkylammonium, and performing extraction with an organic solvent such as ethyl acetate and chloroform.

The resist composition comprising (C) a nitrogen-containing compound may take forms of a positive resist composition and a negative resist composition.

The resist composition comprising (C) a nitrogen-containing compound, (B) a compound of which solubility in an alkali developer increases under the action of an acid, and (A) a compound capable of generating an acid upon irradiation with actinic rays or radiation is a positive resist composition, and when a resist film is formed, irradiated with actinic rays or radiation and developed, the exposed area is dissolved and removed, whereby a pattern is formed.

The resist composition comprising (C) a nitrogen-containing compound, (D) an alkali-soluble compound, (E) an acid-crosslinking agent capable of crosslinking the alkali-soluble compound under the action of an acid, and (A) a compound capable of generating an acid upon irradiation with actinic rays or radiation is a negative resist composition, and when a resist film is formed, irradiated with actinic rays or radiation and developed, the unexposed area is dissolved and removed, whereby a pattern is formed.

The amount of the (C) nitrogen-containing compound used is usually from 0.001 to 10 mass %, preferably from 0.01 to 5 mass %, based on the solid content of the resist composition. (In this specification, mass ratio is equal to weight ratio.)

[2] (A) Compound Capable of Generating Acid Upon Irradiation with Actinic Rays or Radiation The compound capable of generating an acid upon irradiation with actinic rays or radiation (hereinafter sometimes referred to as an "acid generator" or a "component (A)") contained in the positive resist composition of the present invention is preferably a compound capable of generating a sulfonic acid upon irradiation with actinic rays or radiation (hereinafter sometimes referred to as a "component (A1)").

The compound capable of generating a sulfonic acid upon irradiation with actinic rays or radiation is a compound capable of generating a sulfonic acid upon irradiation with actinic rays or radiation such as KrF excimer laser, electron beam and EUV, and examples thereof include a diazonium salt, a phosphonium salt, a sulfonium salt, an iodonium salt, an imidosulfonate, an oxime sulfonate, a diazodisulfone, a disulfone and an o-nitro-benzylsulfonate.

Also, a compound where such a group or compound capable of generating a sulfonic acid upon irradiation with actinic rays or radiation is introduced into the main or side chain of a polymer may be used, and examples thereof include the compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Furthermore, compounds capable of generating a sulfonic acid by the effect of light described, for example, in U.S. Pat. No. 3,779,778 and European Patent 126,712 may also be used.

In the present invention, the sulfonic acid generator preferred from the standpoint of enhancing the image performance such as resolving power and pattern profile includes a sulfonium salt, an iodonium salt, an imidosulfonate, an oxime sulfonate, a diazodisulfone and a disulfone.

Preferred acid generators include compounds represented by the following formulae (ZI), (ZII) and (ZIII):

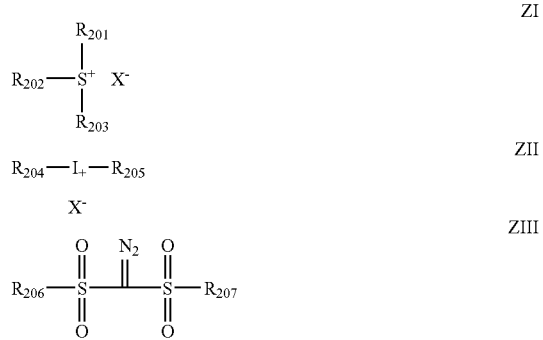

In formula (ZI), $R_{201}$, $R_{202}$ and $R_{203}$ each independently represents an organic group. Two members out of $R_{201}$ to $R_{203}$ may combine to form a ring structure X represents an organic sulfonate anion.

The carbon number of the organic group as $R_{201}$, $R_{202}$ and $R_{203}$ is generally from 1 to 30, preferably from 1 to 20.

Examples of the group formed by combining two members out of $R_{201}$ to $R_{203}$ include an alkylene group (e.g., butylene, pentylene). The ring may contain an oxygen atom, a sulfur atom, an ester bond, an amide bond or a carbonyl group.

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{201}$ to $R_{203}$ in another compound represented by formula (ZI).

The component (ZI) is preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound includes an aryl group composed of hydrocarbon and a heteroaryl group having a heteroatom such as nitrogen atom, sulfur atom and oxygen atom. The aryl group composed of hydrocarbon is preferably a phenyl group or a naphthyl group, more preferably a phenyl group. Examples of the heteroaryl group include a pyrrole group, an indole group, a carbazole group, a furan group and a thiophene group, with an indole group being preferred. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group, a phenylthio group or the like. The substituent is preferably a linear or branched alkyl group having a carbon number of 1 to 12, a cycloalkyl group having a carbon number of 3 to 12, or an alkoxy group having a carbon number of 1 to 12, more preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

Examples of the organic sulfonate anion of $X^-$ include an aliphatic sulfonate anion, an aromatic sulfonate anion and a camphorsulfonate anion.

Examples of the aliphatic group in the aliphatic sulfonate anion include an alkyl group having a carbon number of 1 to 30, such as methyl group, ethyl group, propyl group, isopropyl group, n-butyl group, isobutyl group, sec-butyl group, pentyl group, neopentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group and eicosyl group, and a cycloalkyl group having a carbon number of 3 to 30, such as cyclopropyl group, cyclopentyl group, cyclohexyl group, adamantyl group, norbornyl group or bornyl group.

The aromatic group in the aromatic sulfonate anion is preferably an aryl group having a carbon number of 6 to 14, such as phenyl group, tolyl group and naphthyl group.

The alkyl group, cycloalkyl group and aryl group in the aliphatic sulfonate anion and aromatic sulfonate anion may have a substituent.

Examples of the substituent include a nitro group, a halogen atom (e.g., fluorine, chlorine, bromine, iodine), a carboxyl group, a hydroxyl group, an amino group, a cyano group, an alkoxy group (preferably having a carbon number of 1 to 5), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7) and an alkylthio group (preferably having a carbon number of 1 to 15). As for the aryl group or ring structure in each group, examples of the substituent further include an alkyl group (preferably having a carbon number of 1 to 15).

The organic sulfonate anion of $X^-$ is preferably an aliphatic sulfonate anion with the sulfonic acid being substituted by a fluorine atom at the α-position, or an aromatic sulfonate anion substituted by a fluorine atom or a fluorine atom-containing group. The organic sulfonate anion is more preferably a perfluoroaliphatic sulfonate anion having a carbon number of 4 to 8 or an aromatic sulfonate anion having a fluorine atom, still more preferably nonafluorobutanesulfonate anion, perfluorooctanesulfonate anion, pentafluoroebenzenesulfonate anion or 3,5-bis(trifluoromethyl)benzenesulfonate anion.

The compound (ZI-2) is described below.

The compound (ZI-2) is a compound where $R_{201}$ to $R_{203}$ in formula (ZI) each independently represents an aromatic ring-free organic group.

The aromatic ring-free organic group as $R_{201}$ to $R_{203}$ generally has a carbon number of 1 to 30, preferably from 1 to 20.

$R_{201}$ to $R_{203}$ are preferably each independently an alkyl group, a cycloalkyl group, an allyl group or a vinyl group, more preferably a linear, branched or cyclic 2-oxoalkyl group or an alkoxycarbonylmethyl group, and most preferably a linear or branched 2-oxoalkyl group.

The alkyl group as $R_{201}$ to $R_{203}$ may be either linear or branched and is preferably a linear or branched alkyl group having a carbon number of 1 to 10, such as methyl group, ethyl group, propyl group, butyl group and pentyl group. The alkyl group is more preferably a linear or branched 2-oxoalkyl group or an alkoxycarbonylmethyl group.

The cycloalkyl group as $R_{201}$ to $R_{203}$ is preferably a cycloalkyl group having a carbon number of 3 to 10, such as cyclopentyl group, cyclohexyl group and norbornyl group. The cycloalkyl group is more preferably a cyclic 2-oxoalkyl group.

The 2-oxoalkyl group may be linear, branched or cyclic and is preferably a group having $>C=O$ at the 2-position of the above-described alkyl or cycloalkyl group.

The alkyl group in the alkoxycarbonylmethyl group is preferably an alkyl group having a carbon number of 1 to 5 (e.g., methyl, ethyl, propyl, butyl, pentyl).

$R_{201}$ to $R_{203}$ each may be further substituted-by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

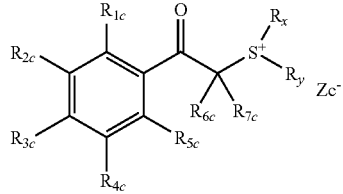

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{7c}$ or a pair of $R_x$ and $R_y$ may combine with each other to form a ring structure. This ring structure may contain an oxygen atom, a sulfur atom, an ester bond or an amido bond.

$Zc^-$ represents an organic sulfonate anion, and examples thereof are the same as those of the n organic sulfonate anion of $X^-$ in formula (ZI).

The alkyl group as $R_{1c}$ to $R_{7c}$ is preferably a linear or branched alkyl group having a carbon number of 1 to 20, and examples thereof include a methyl group, an ethyl group, a linear or branched propyl group, a linear or branched butyl group, and a linear or branched pentyl group.

The cycloalkyl group as $R_{1c}$ to $R_{7c}$ is preferably a cycloalkyl group having a carbon number of 3 to 8, such as cyclopentyl group and cyclohexyl.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy group, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of such a constitution, the solubility in a solvent is more enhanced and production of particles during storage can be suppressed.

Examples of the alkyl group and cycloalkyl group as $R_x$ and $R_y$ are the same as those of the alkyl group and cycloalkyl group as $R_{1c}$ to $R_{7c}$. A 2-oxoalkyl group and an alkoxycarbonylmethyl group are more preferred.

The 2-oxoalkyl group includes a group having $>C=O$ at the 2-position of the alkyl group or cycloalkyl group as $R_{1c}$ to $R_{7c}$.

Examples of the alkoxy group in the alkoxycarbonylmethyl group are the same as those of the alkoxy group as $R_{1c}$ to $R_{5c}$.

Examples of the group formed by combining any two or more members out of $R_{1c}$ to $R_{7c}$ or a pair of $R_x$ and $R_y$ include a butylene group and a pentylene group.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ includes an aryl group composed of hydrocarbon and a heteroaryl group having a heteroatom such as nitrogen atom, sulfur atom and oxygen atom. The aryl group composed of hydrocarbon is preferably a phenyl group or a naphthyl group, more preferably a phenyl group. Examples of the heteroaryl group include a pyrrole group, an indole group, a carbazole group, a furan group and a thiophene group, with an indole group being preferred.

The alkyl group as $R_{204}$ to $R_{207}$ is preferably a linear or branched alkyl group having a carbon number of 1 to 10, such as methyl group, ethyl group, propyl group, butyl group and pentyl group.

The cycloalkyl group as $R_{204}$ to $R_{207}$ is preferably a cycloalkyl group having a carbon number of 3 to 10, such as cyclopentyl group, cyclohexyl group and norbornyl group.

Examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents an organic sulfonate anion, and examples thereof are the same as those of the organic sulfonate anion of $X^-$ in formula (ZI).

Preferred acid generators further include compounds represented by the following formulae (ZIV), (ZV) and (ZVI):

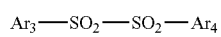

ZIV

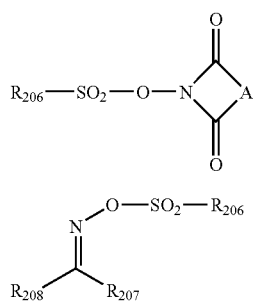

ZV

ZVI

In formulae (ZIV) to (ZVI), $Ar_3$ and $Ar_4$ each independently represents an aryl group.

$R_{206}$, $R_{207}$ and $R_{208}$ each represents an alkyl group, a cycloalkyl group or an aryl group.

A represents an alkylene group, an alkenylene group or an arylene group.

Preferred acid generators further include a compound represented by the following formula (ZVII):

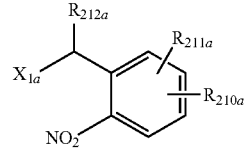

(ZVII)

In formula (ZVII), $R_{210a}$ and $R_{211a}$ each independently represents a hydrogen atom, an alkyl group, a cycloalkyl group, a cyano group, a nitro group or an alkoxycarbonyl group and is preferably a halogen-substituted alkyl or cycloalkyl group, a nitro group or a cyano group.

$R_{212a}$ represents a hydrogen atom, an alkyl group, a cycloalkyl group, a cyano group or an alkoxycarbonyl group.

$X_{1a}$ represents a monovalent group resulting from removal of the hydrogen atom in $-SO_3H$ of an organosulfonic acid.

Preferred acid generators further include a compound represented by the following formula (ZVIII):

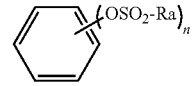

(ZVIII)

In formula (ZVIII), Ra represents an alkyl group, a cycloalkyl group or an aryl group. When a plurality of Ra's are present, the plurality of Ra's may be the same or different.

n represents an integer of 1 to 6.

Specific examples of the acid generator are set forth below, but the present invention is not limited thereto.

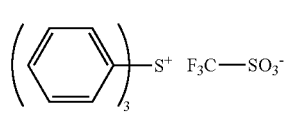

A-1

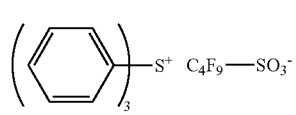

A-2

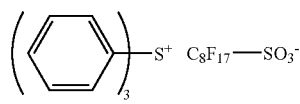

A-3

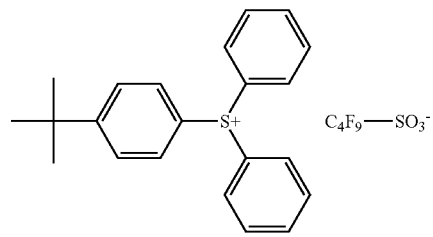

A-4

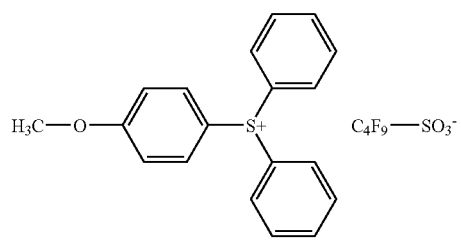

A-5

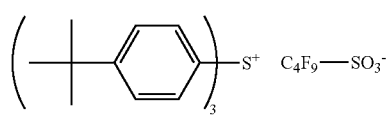

A-6

-continued
A-7 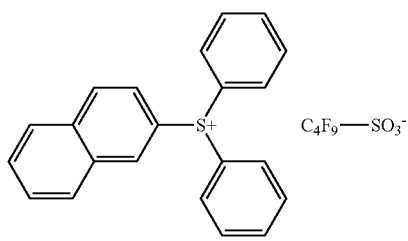 A-8 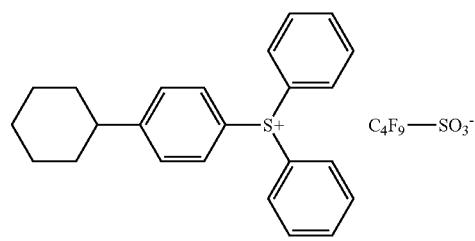
A-9 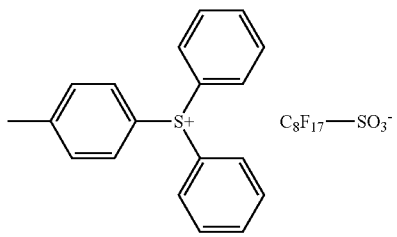 A-10 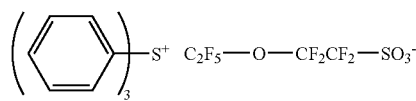
A-11 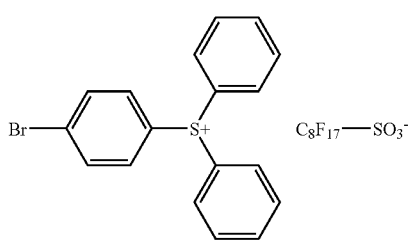 A-12 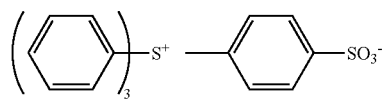
A-13 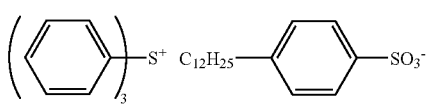 A-14 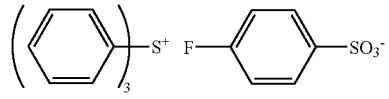
A-15 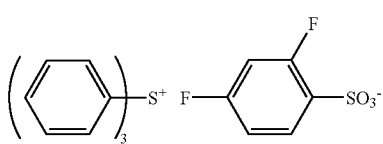 A-16 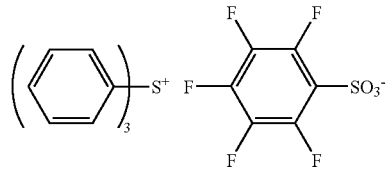
A-17 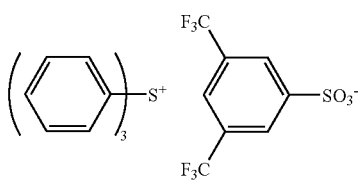 A-18 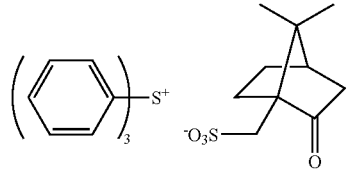
A-19 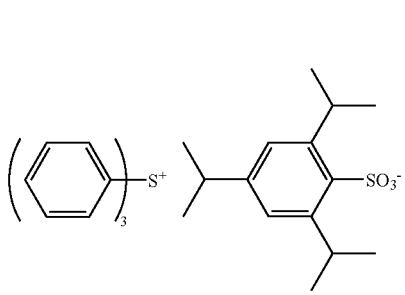 A-20 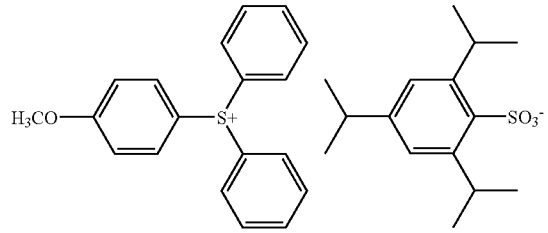

-continued
A-21
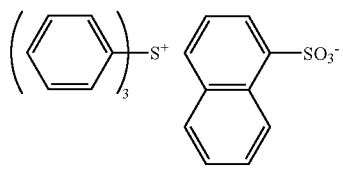
A-22
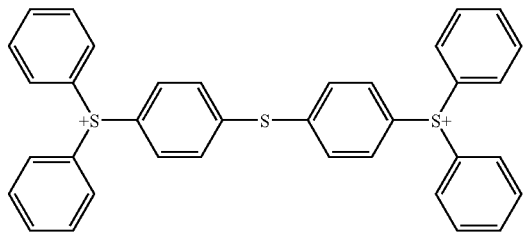
A-23
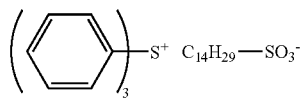
A-24
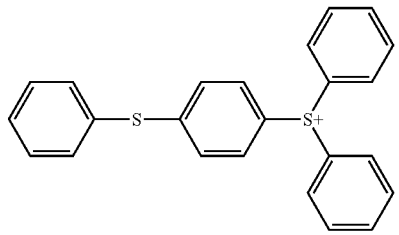
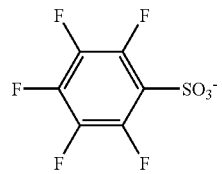
A-25
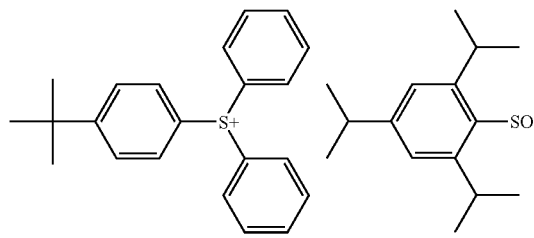
A-26
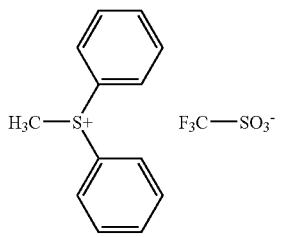
A-27
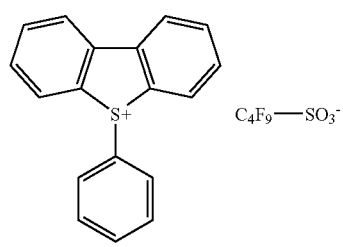
A-28
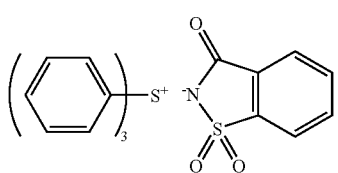
A-29
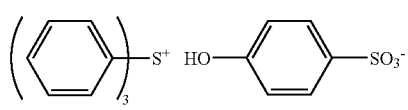
A-30
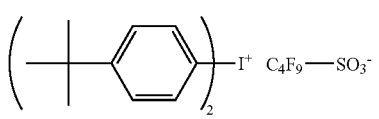

-continued
A-31 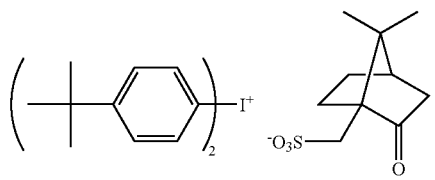
A-32 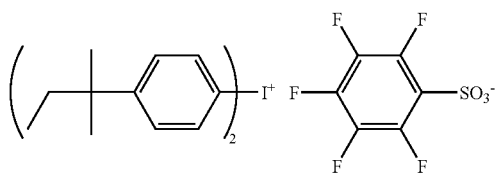
A-33 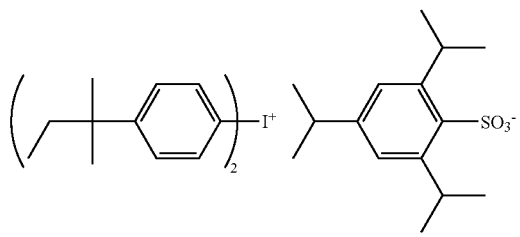
A-34 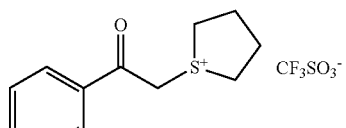
A-35 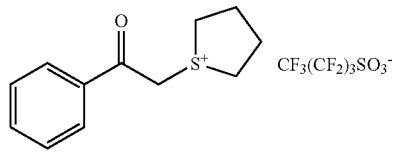
A-36 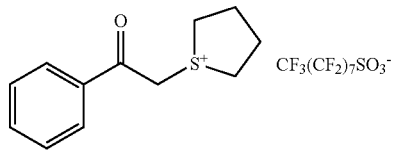
A-37 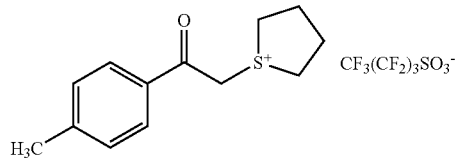
A-38 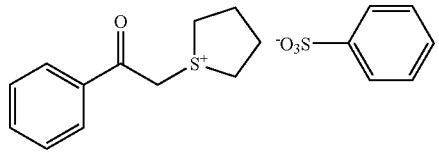
A-39 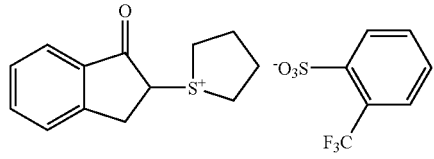
A-40 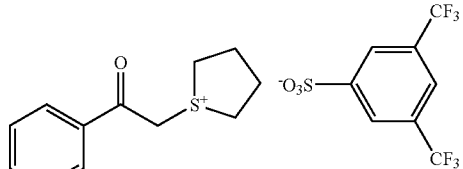
A-41 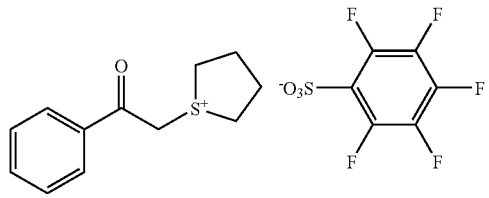
A-42 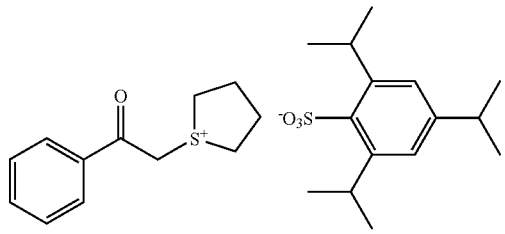
A-43 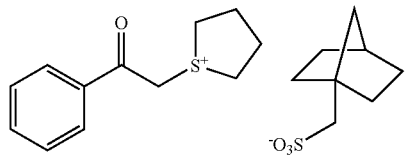
A-44 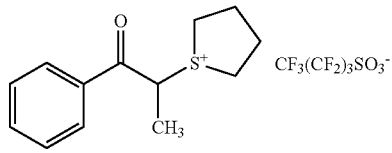
A-45 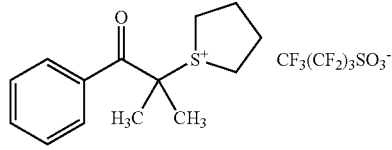
A-46 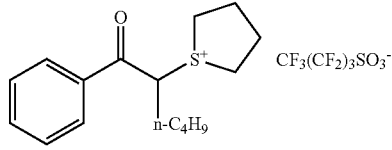

-continued
A-47
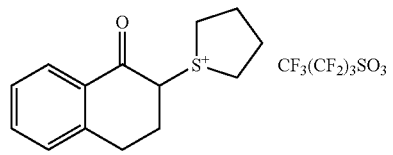
A-48
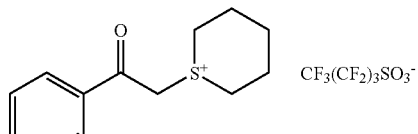
A-49
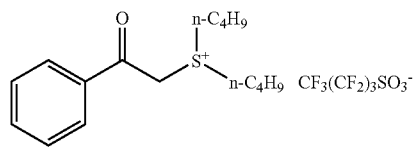
A-50
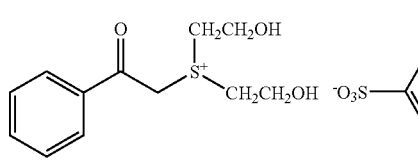
A-51
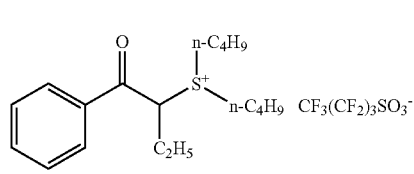
A-52
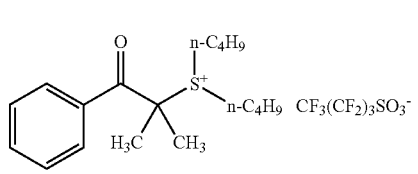
A-53
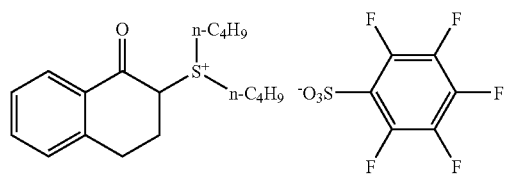
A-54
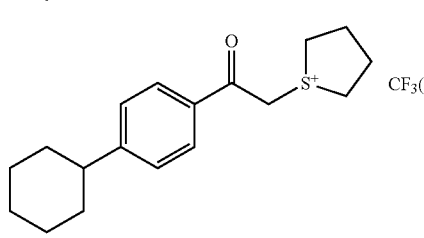
A-55
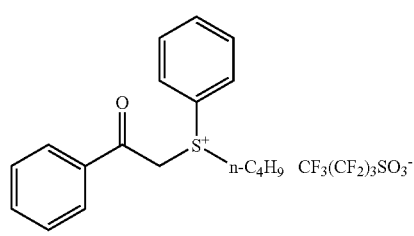
A-56
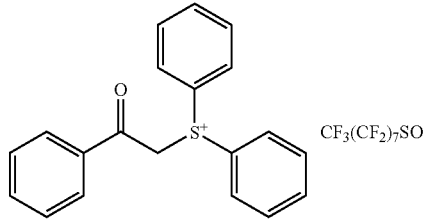
A-57
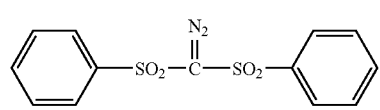
A-58
A-59
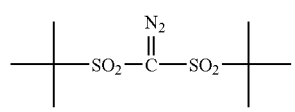
A-60
A-61
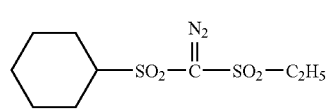
A-62
A-63
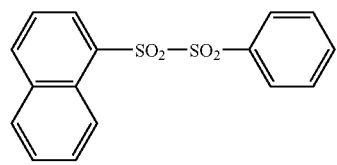
A-64
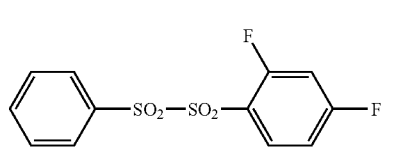
A-65
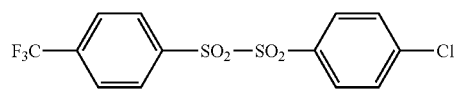
A-66
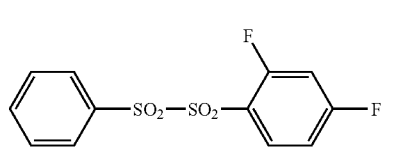

-continued
| | |
|---|---|
| 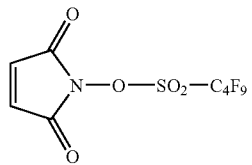 A-67 | 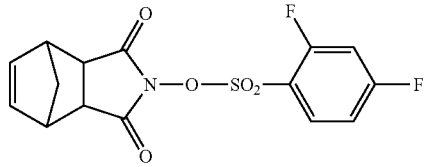 A-68 |
| 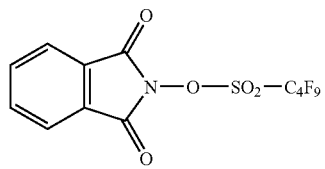 A-69 | 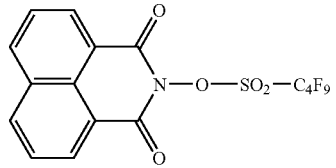 A-70 |
| 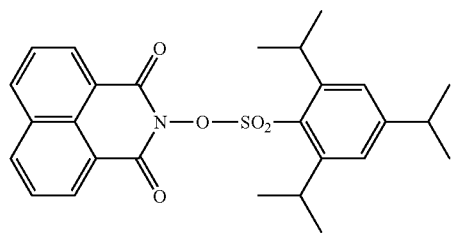 A-71 | 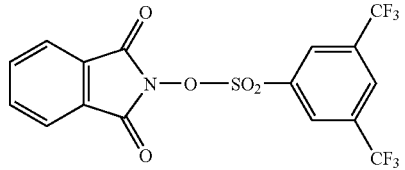 A-72 |
| 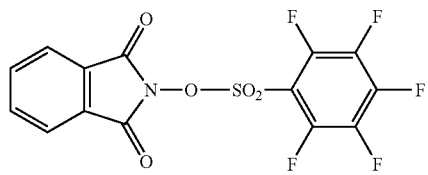 A-73 | 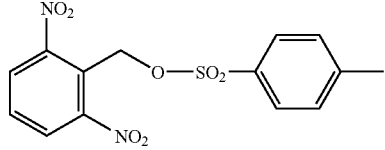 A-74 |
| 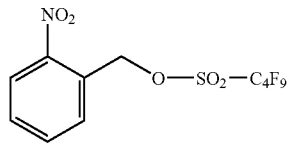 A-75 | 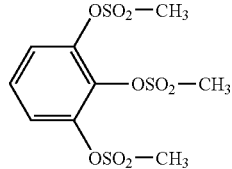 A-76 |
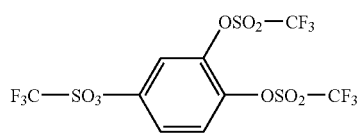
A-77
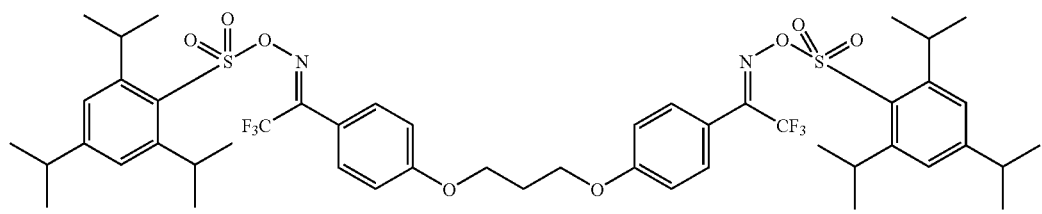
A-78
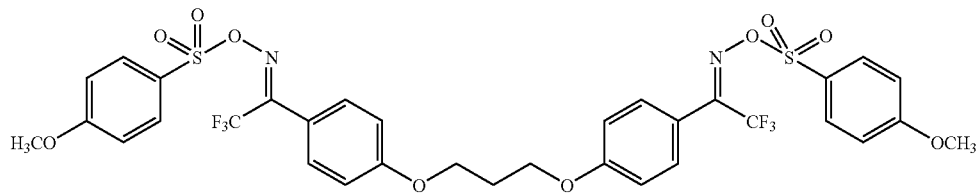
A-79

-continued

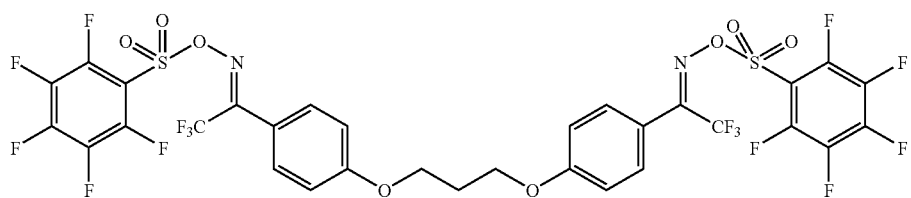

A-80

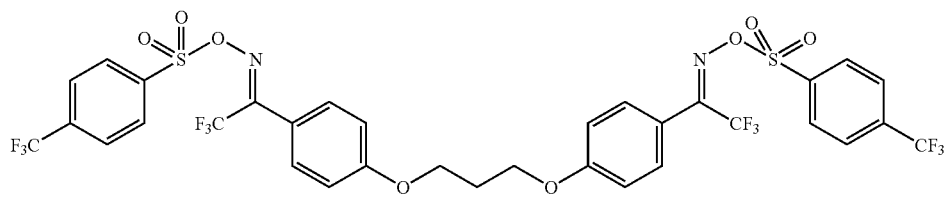

A-81

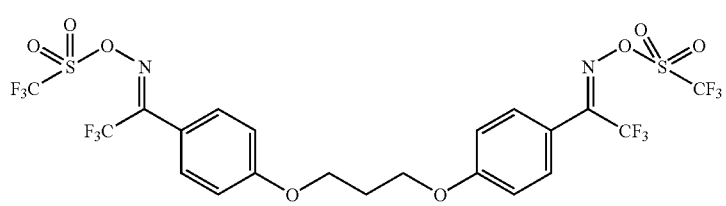

A-82

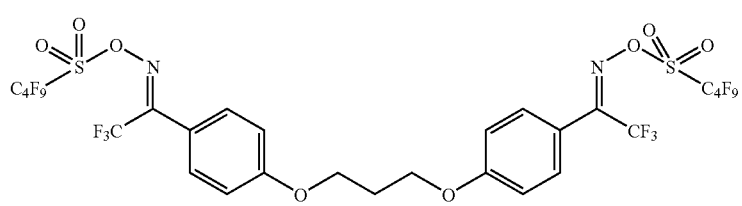

A-83

The content of the acid generator is from 5 to 20 mass %, preferably from 6 to 18 mass %, more preferably from 7 to 16 mass %, based on the solid content of the positive resist composition. The content is 5 mass % or more in view of sensitivity or line edge roughness and 20 mass % or less in view of resolving power, pattern profile and film quality. One species of the acid generator may be used, or two or more species may be mixed and used. For example, as the acid generator, a compound capable of generating an arylsulfonic acid upon irradiation with actinic rays or radiation and a compound capable of generating an alkyl-sulfonic acid upon irradiation with actinic rays or radiation may be used in combination.

The acid generator can be synthesized by a known method such as a synthesis method described in JP-A-2002-27806.

In the positive resist composition of the present invention, a compound capable of generating a carboxylic acid or an imide acid upon irradiation with actinic rays or radiation (hereinafter sometimes referred to as a "component (A2)") may be used together with the component (A1).

The component (A2) is preferably a compound represented by the following formula (C):

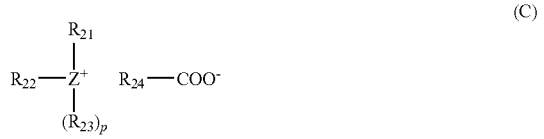

(C)

In formula (C), $R_{21}$ to $R_{23}$ each independently represents an alkyl group, a cycloalkyl group, an alkenyl group or an aryl group, $R_{24}$ represents a hydrogen atom, an alkyl group, a cycloalkyl group, an alkenyl group or an aryl group, and Z represents a sulfur atom or an iodine atom. When Z is a sulfur atom, p is 1, and when Z is an iodine atom, p is 0.

In formula (C), $R_{21}$ to $R_{23}$ each independently represents an alkyl group, a cycloalkyl group, an alkenyl group or an aryl group, and these groups each may have a substituent.

Examples of the substituent which the alkyl group, cycloalkyl group and alkenyl group each may have include a halogen atom (e.g., chlorine, bromine, fluorine), an aryl group (e.g., phenyl, naphthyl), a hydroxy group and an alkoxy group (e.g., methoxy, ethoxy, butoxy).

Examples of the substituent which the aryl group may have include a halogen atom (e.g., chlorine, bromine, fluorine), a nitro group, a cyano group, an alkyl group (e.g., methyl, ethyl, tert-butyl, tert-amyl, octyl), a hydroxy group and an alkoxy group (e.g., methoxy, ethoxy, butoxy).

$R_{21}$ to $R_{23}$ are preferably each independently an alkyl group having a carbon number of 1 to 12, a cycloalkyl group having a carbon number of 3 to 12, an alkenyl group having a carbon number of 2 to 12 or an aryl group having a carbon number of 6 to 24, more preferably an alkyl group having a carbon number of 1 to 6, a cycloalkyl group having a carbon number of 3 to 6 or an aryl group having a carbon number of 6 to 18, still more preferably an aryl group having a carbon number of 6 to 15, and these groups each may have a substituent.

$R_{24}$ represents a hydrogen atom, an alkyl group, a cycloalkyl group, an alkenyl group or an aryl group.

Examples of the substituent which the alkyl group, cycloalkyl group and alkenyl group each may have are the same as those of the substituent described above when $R_{21}$ is an alkyl group. Examples of the substituent for the aryl group are the same as those of the substituent described above when $R_{21}$ is an aryl group.

$R_{24}$ is preferably a hydrogen atom, an alkyl group having a carbon number of 1 to 30, a cycloalkyl group having a carbon number of 3 to 30, an alkenyl group having a carbon number of 2 to 30 or an aryl group having a carbon number of 6 to 24, more preferably an alkyl group having a carbon number of 1 to 18, a cycloalkyl group having a carbon number of 3 to 18 or an aryl group having a carbon number of 6 to 18, still more preferably an alkyl group having a carbon number of 1 to 12, a cycloalkyl group having a carbon number of 3 to 12 or an aryl group having a carbon number of 6 to 15, and these groups each may have a substituent.

Z represents a sulfur atom or an iodine atom. p is 1 when Z is a sulfur atom, and 0 when Z is an iodine atom.

Incidentally, two or more cation moieties of formula (C) may combine through a single bond or a linking group (e.g., —S—, —O—) to form a cation structure having a plurality of cation moieties of formula (C).

Specific preferred examples of the component (A2) are set forth below, but the present invention is of course not limited thereto.

C-1
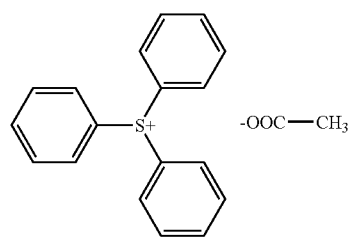

C-2
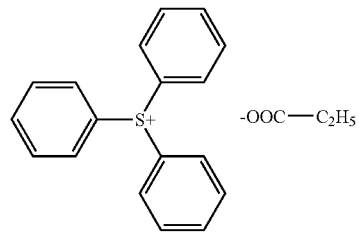

C-3
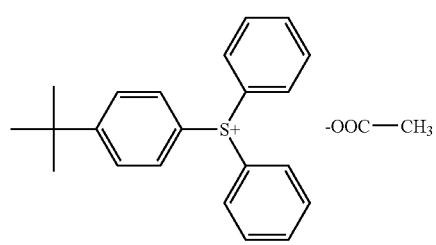

C-4
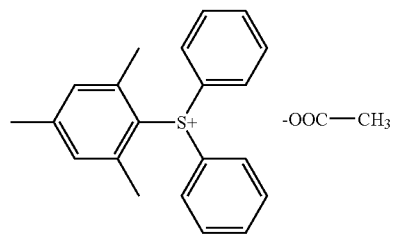

-continued

C-5
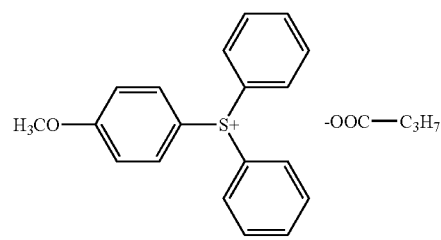

C-6
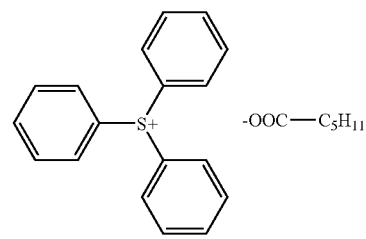

C-7
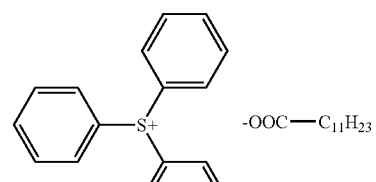

C-8
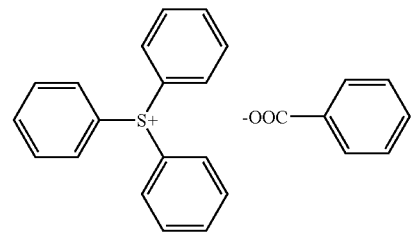

C-9
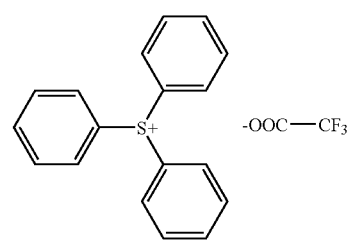

C-10
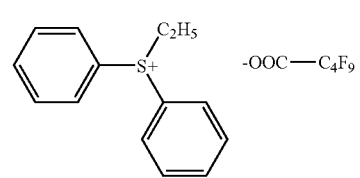

C-11
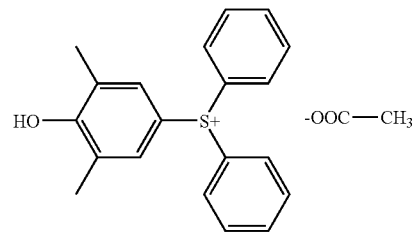

-continued
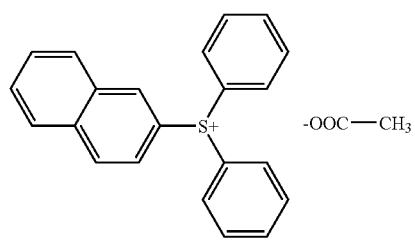 C-12
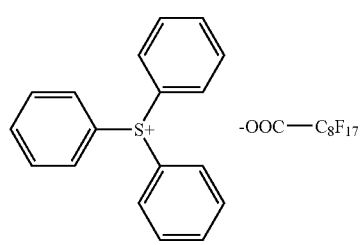 C-13
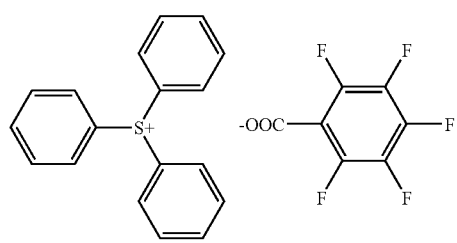 C-14
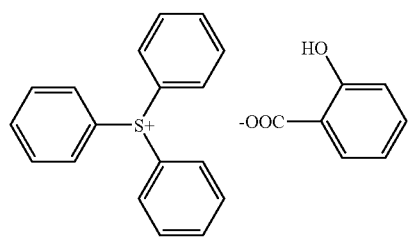 C-15
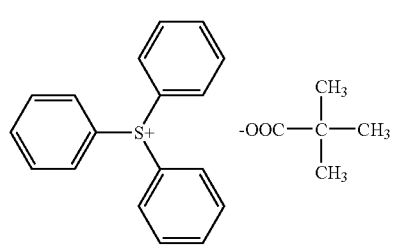 C-16
-continued
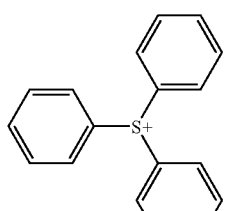 C-17
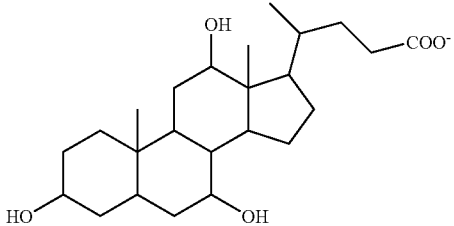 
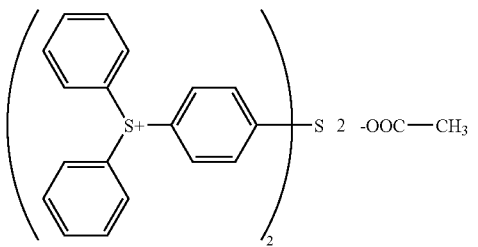 C-18
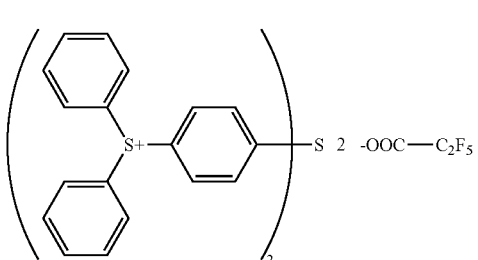 C-19
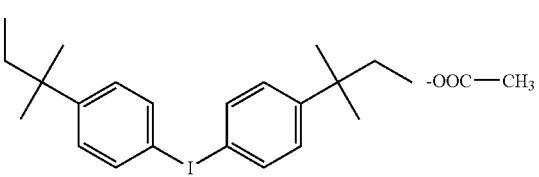 C-20
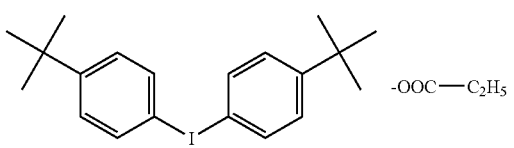 C-21
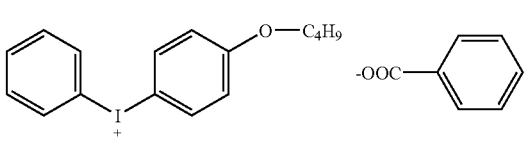 C-22

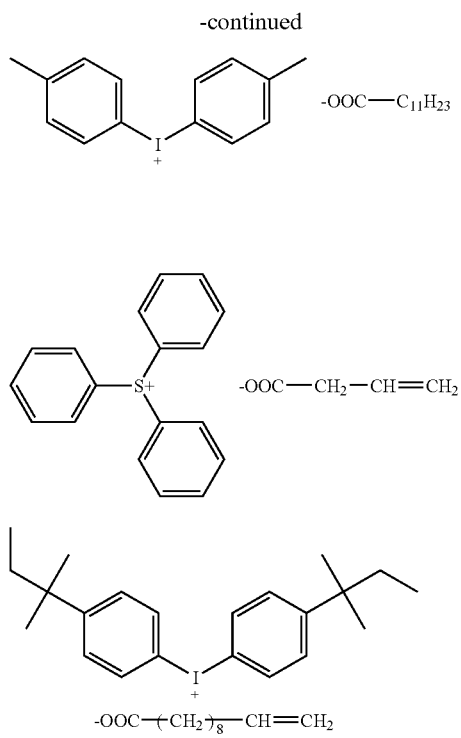

C-23

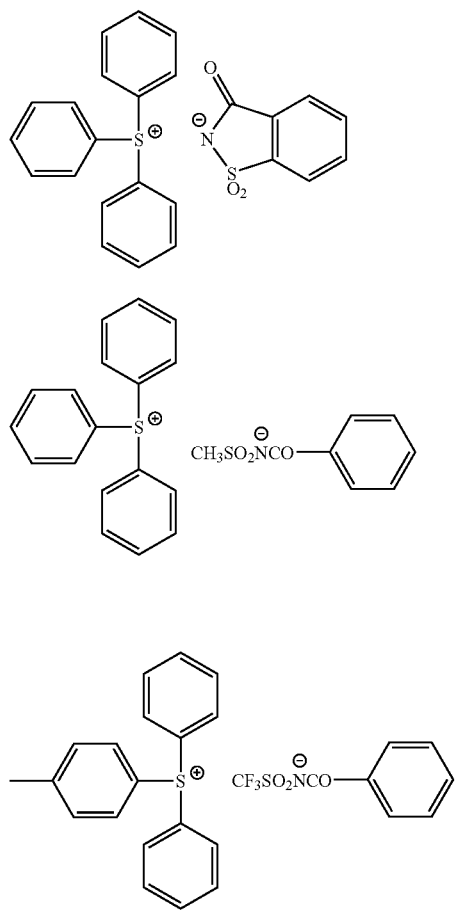

C-24

C-25

C-26

C-27

C-28

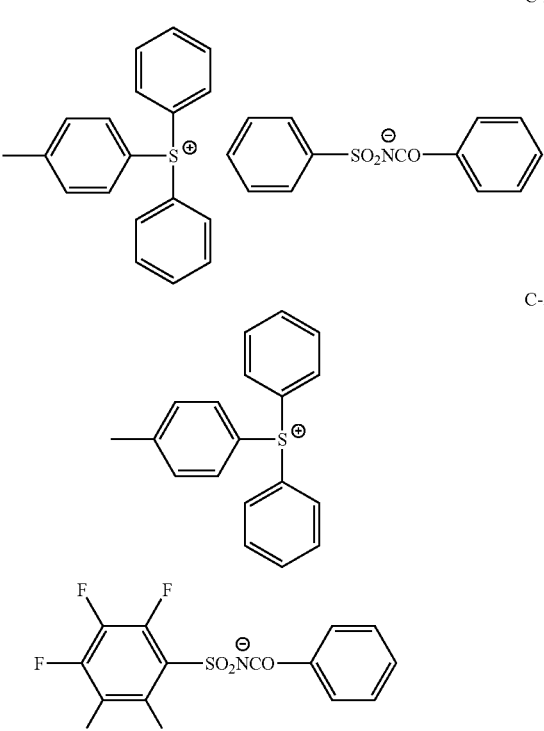

C-29

C-30

The content of the component (A2) in the positive resist composition of the present invention is preferably from 0.01 to 10 mass %, more preferably from 0.03 to 5 mass %, still more preferably from 0.05 to 3 mass %, based on the entire solid content of the composition. One of these components (A2) may be used, or two or more species thereof may be mixed and used.

The component (A2)/component (A1) (ratio by mass) is usually from 99.9/0.1 to 50/50, preferably from 99/1 to 60/40, more preferably from 98/2 to 70/30.

The component (A2) can be synthesized by a known method such as a synthesis method described in JP-A-2002-27806.

In the present invention, at least one kind of compound selected from triarylsulfonium salts of organosulfonic acid and at least one kind of compound selected from diazodisulfone derivatives and oxime esters of organosulfonic acid are preferably used as the compound capable of generating an acid upon irradiation with actinic rays or radiation.

In the present invention, at least one kind of compound selected from compounds capable of generating an organosulfonic acid upon irradiation with actinic rays or radiation and at least one kind of compound selected from compounds capable of generating a carboxylic acid or an imide acid upon irradiation with actinic rays or radiation are preferably used as the compound capable of generating an acid upon irradiation with actinic rays or radiation.

[3] (B) Compound of Which Solubility in an Alkali Developer Increases Under the Action of an Acid The compound of which solubility in an alkali developer increases under the action of an acid (hereinafter sometimes referred to as a "component (B)"), used in the positive resist composition of the present invention, is preferably a resin having a group capable of decomposing under the action of an acid in the main or side chain or both the main and side chains of the resin. Of these resins, a resin having in the side chain a group capable of decomposing under the action of an acid is more preferred.

The group capable of decomposing under the action of an acid is preferably a —COOA$^0$ group or a —O—B$^0$ group, and examples of the group containing such a group include those represented by —R$^0$—COOA$^0$ and —Ar—O—B$^0$.

In the formulae above, A$^0$ represents —C(R$^{01}$)(R$^{02}$)(R$^{03}$), —Si(R$^{01}$)(R$^{02}$)(R$^{03}$) or —C(R$^{04}$)(R$^{05}$)—O—R$^6$.

B$^0$ represents A$^0$ or a —CO—O-A$^0$ group.

Ar represents an arylene group (preferably having a carbon number of 6 to 12) and is preferably a phenylene group.

R$^0$ represents a single bond or an alkylene group (preferably having a carbon number of 1 to 6) and is preferably a single bond or an alkylene group having a carbon number of 1 to 4, more preferably a single bond or an alkylene group having a carbon number of 1 or 2.

R$^{01}$ to R$^{03}$ each independently represents an alkyl group (preferably having a carbon number of 1 to 8), a cycloalkyl group (preferably having a carbon number of 4 to 10), or an aryl group (preferably having a carbon number of 6 to 15), and these groups may form a ring or a crosslinked ring in cooperation with each other.

R$^{01}$ to R$^{03}$ are preferably each independently an alkyl group having a carbon number of 1 to 6, a cycloalkyl group having a carbon number of 5 to 8, or an aryl group having a carbon number of 6 to 12, more preferably each independently an alkyl group having a carbon number of 1 to 4, a cyclohexyl group or a phenyl group.

R$^{04}$ and R$^{05}$ each independently represents a hydrogen atom, an alkyl group (preferably having a carbon number of 1 to 8) and is preferably a hydrogen atom, an alkyl group having a carbon number of 1 to 6, more preferably a hydrogen atom or an alkyl group having a carbon number of 1 to 4.

R$^{06}$ represents an alkyl group (preferably having a carbon number of 1 to 15) which may contain an ether group or a thioether group, a cycloalkyl group (preferably having a carbon number of 4 to 10), an aryl group (preferably having a carbon number of 6 to 15), or a mixture thereof. R$^{06}$ is preferably an alkyl group having a carbon number of 1 to 12 which may contain an ether group or a thioether group, a cycloalkyl group having a carbon number of 5 to 8, an aryl group having a carbon number of 6 to 12, or a mixture thereof, more preferably an alkyl group having a carbon number of 1 to 8 which may contain an ether group or a thioether group, a cyclohexyl group, a phenyl group, a naphthyl group, or a mixture thereof.

It is also preferred that R$^{06}$ forms a ring in cooperation with R$^{04}$ or R$^{05}$.

Preferred examples of the acid decomposable group include a silyl ether group, a cumyl ester group, an acetal group, a tetrahydropyranyl ether group, an enol ether group, an enol ester group, a tertiary alkyl ether group, a tertiary alkyl ester group and a tertiary alkyl carbonate group. Among these, more preferred are a tertiary alkyl ester group, a tertiary alkyl carbonate group, a cumyl ester group, an acetal group and a tetrahydropyranyl ether group.

In the case where such a group capable of decomposing by an acid is bonded as a side chain, the mother resin is an alkali-soluble resin having an —OH or —COOH group, preferably a —R$^0$—COOH or —Ar—OH group, in the side chain. Examples thereof include the alkali-soluble resins described later.

The alkali dissolution rate of the alkali-soluble resin is preferably 170 Å/sec or more, more preferably 330 Å/sec or more, as measured (at 23° C.) in 0.261N tetramethylammonium hydroxide (TMAH).

From this standpoint, the alkali-soluble resin is preferably an o-, m- or p-poly(hydroxystyrene) or a copolymer thereof, a hydrogenated poly(hydroxystyrene), a halogen- or alkyl-substituted poly(hydroxystyrene), a partially O-alkylated or O-acylated poly(hydroxystyrene), a styrene-hydroxystyrene copolymer, an α-methylstyrene-hydroxystyrene copolymer or a hydrogenated novolak resin.

The component (B) for use in the present invention can be obtained by reacting an acid decomposable group precursor with an alkali-soluble resin or copolymerizing an acid decomposable group-bonded alkali-soluble resin monomer with various monomers, and this is disclosed in European Patent 254853, JP-A-2-25850, JP-A-3-223860 and JP-A-4-251259.

The component (B) is preferably a resin having a repeating unit represented by the following formula (A1) or (A2):

(A1)

(A2)

In formula (A1), A$_1$ represents a group capable of desorbing under the action of an acid, represented by —C(R$^{01}$)(R$^{02}$)(R$^{03}$) or —C(R$^{04}$)(R$^{05}$)—O—R$^{06}$, wherein R$^{01}$ to R$^{03}$ each independently represents an alkyl group, a cycloalkyl group or an aryl group, and these may combine with each other to form a ring or a crosslinked ring; R$^{04}$ and R$^{05}$ each independently represents a hydrogen atom, an alkyl group, a cycloalkyl group or an aryl group; and R$^{06}$ represents an alkyl group, a cycloalkyl group or an aryl group.

S$_1$ represents a substituent, and when a plurality of S$_1$s are present, the plurality of S$_1$s may be the same or different.

n represents an integer of 0 to 3, and m represents an integer of 0 to 3, provided that m+n≦5.

In formula (A2), A$_2$ represents a group capable of desorbing under the action of an acid, represented by —C(R$^{01}$)(R$^{02}$)(R$^{03}$), wherein R$^{01}$ to R$^{03}$ each independently represents an alkyl group, a cycloalkyl group or an aryl group, and these may combine with each other to form a ring or a crosslinked ring.

X represents a hydrogen atom, an alkyl group, a halogen atom, a cyano group or an alkyloxycarbonyl group.

The alkyl group of R$^{01}$ to R$^{06}$ in formulae (A1) and (A2) is preferably an alkyl group having a carbon number of 1 to 8.

The cycloalkyl group of R$^{01}$ to R$^{06}$ is preferably a cycloalkyl group having a carbon number of 4 to 10.

The aryl group of R$^{01}$ to R$^{06}$ is preferably an aryl group having a carbon number of 6 to 15.

The alkyl group of X may have a substituent. Examples of the alkyl group having a substituent include a CF$_3$ group, an alkyloxycarbonylmethyl group, an alkylcarbonyloxymethyl group, a hydroxymethyl group and an alkoxymethyl group.

Examples of the substituent of $S_1$ include an alkyl group, an alkoxy group, a halogen atom, cyano, an acyl group, an acyloxy group, an aryl group, an aryloxy group and an aralkyl group.
Specific examples of the component (B) for use in the present invention are set forth below, but the present invention is not limited thereto.
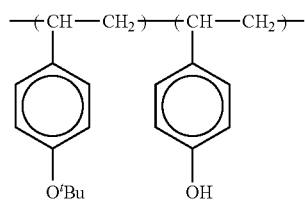
(B-1)
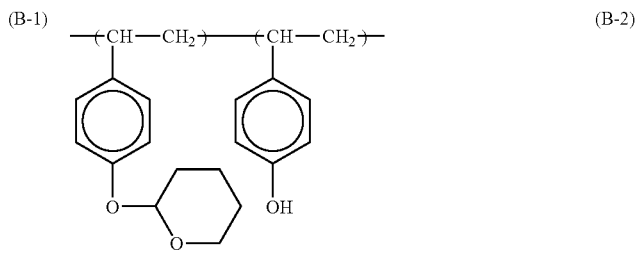
(B-2)
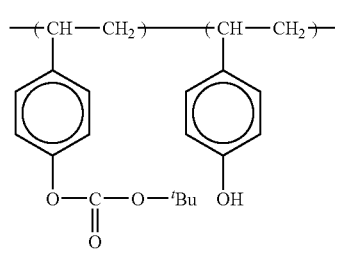
(B-3)
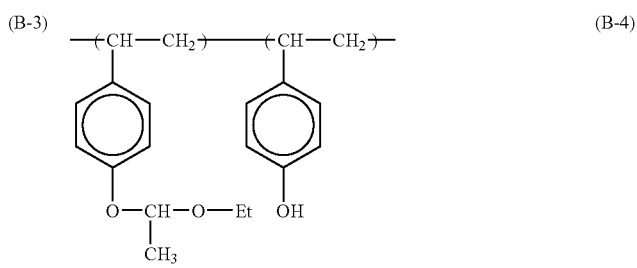
(B-4)
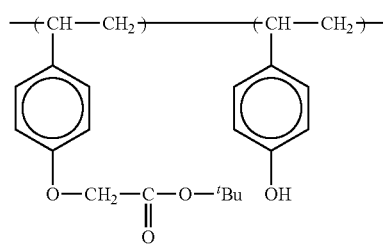
(B-5)
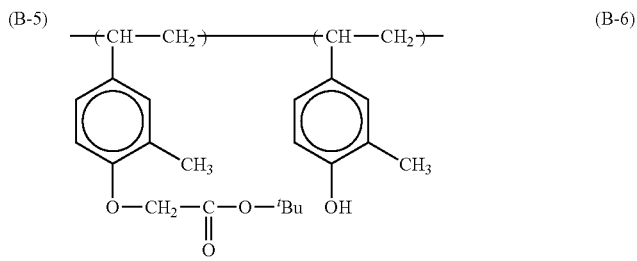
(B-6)
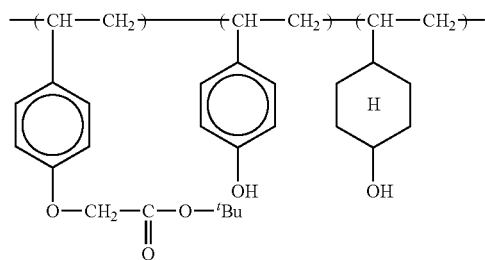
(B-7)
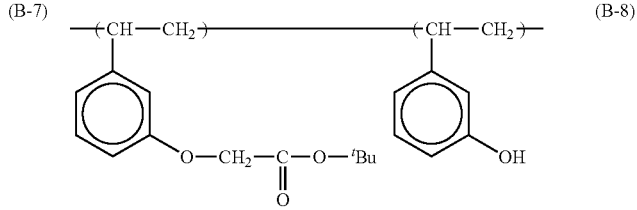
(B-8)
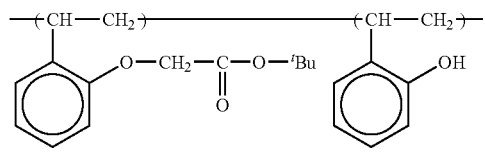
(B-9)
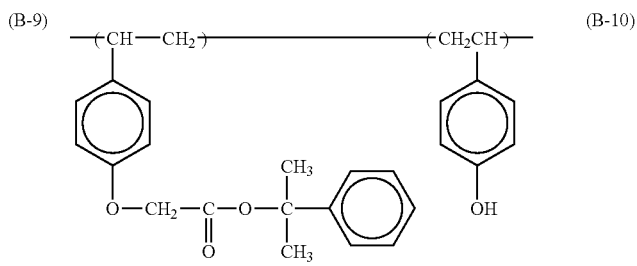
(B-10)
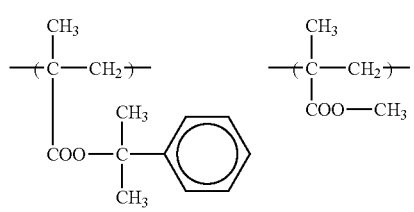
(B-11)
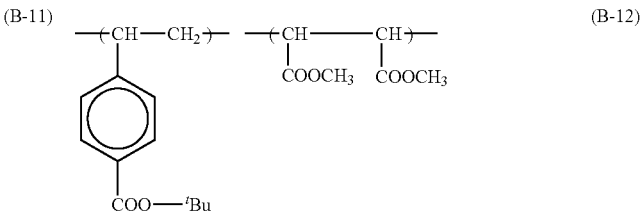
(B-12)

-continued
(B-13) 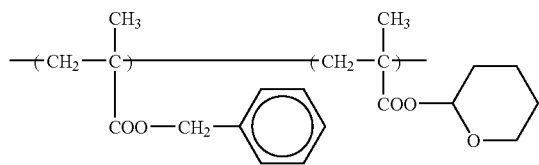
(B-14) 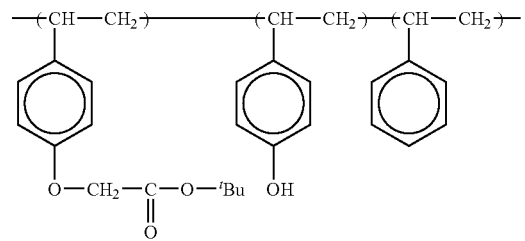
(B-15) 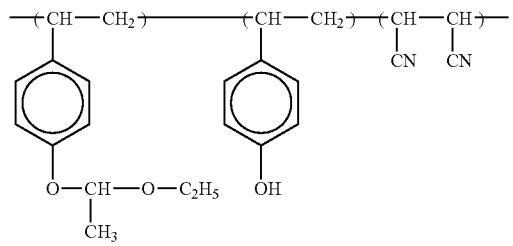
(B-16) 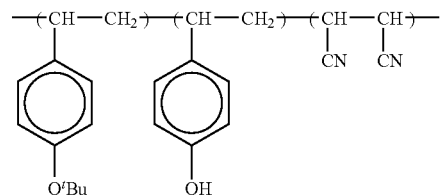
(B-17) 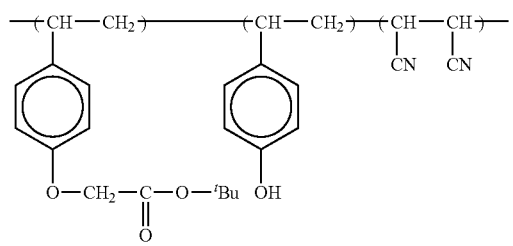
(B-18) 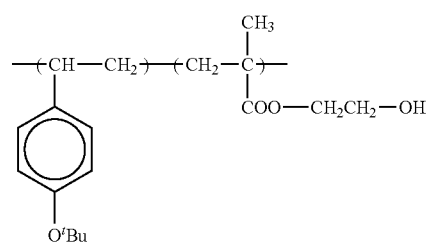
(B-19) 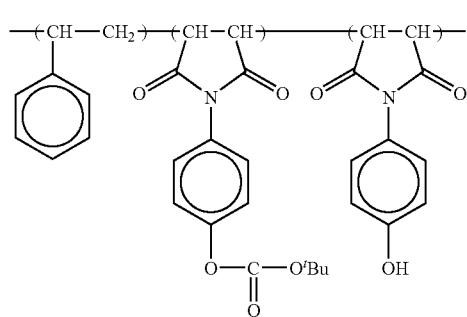
(B-20) 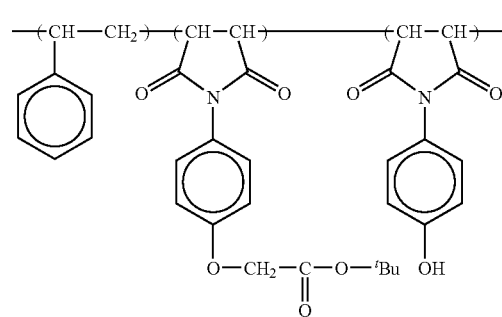
(B-21) 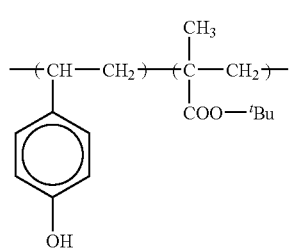
(B-22) 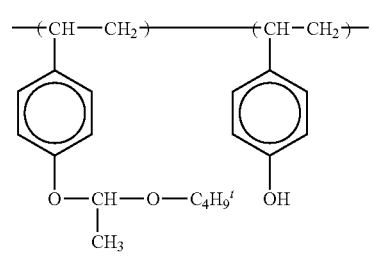
(B-23) 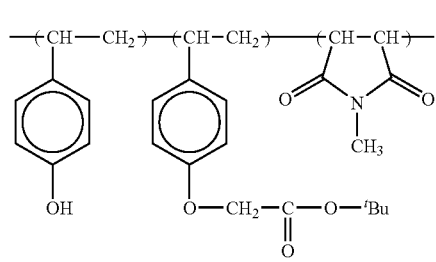
(B-24) 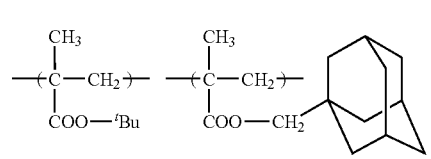

-continued
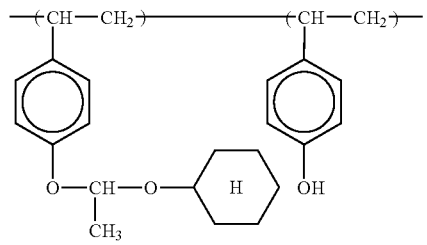 (B-25)
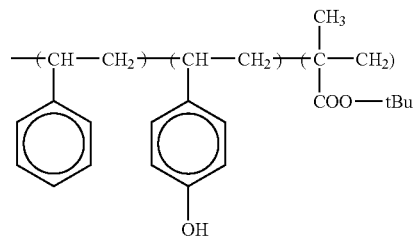 (B-26)
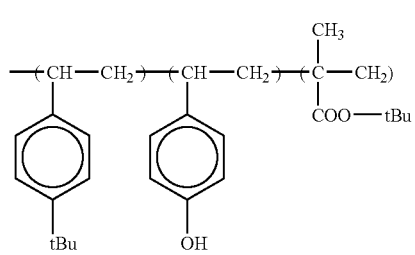 (B-27)
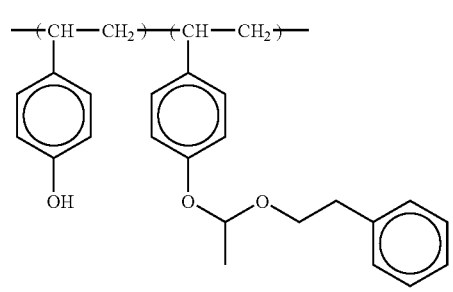 (B-28)
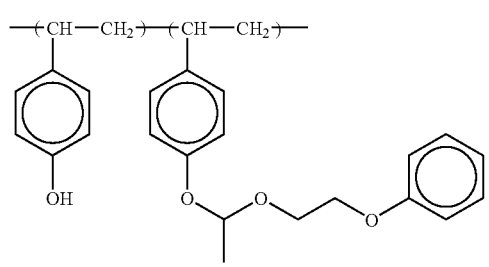 (B-29)
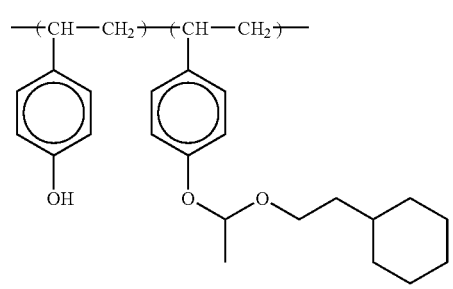 (B-30)
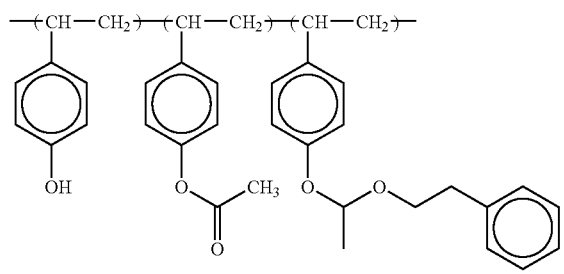 (B-31)
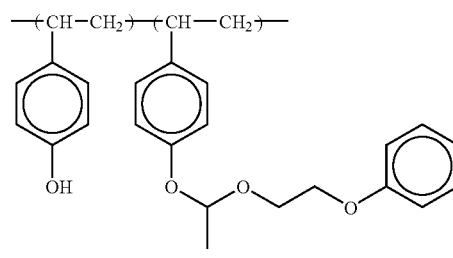 (B-32)
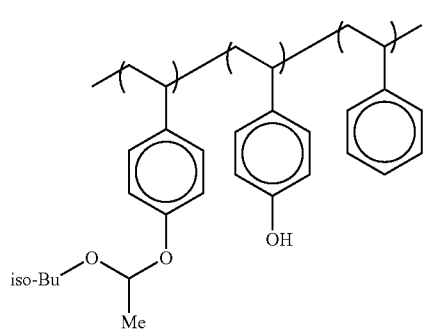 (B-33)
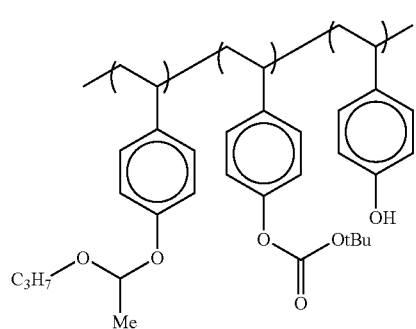 (B-34)

-continued
(B-35)
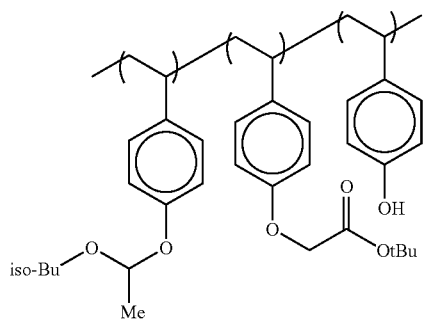
(B-36)
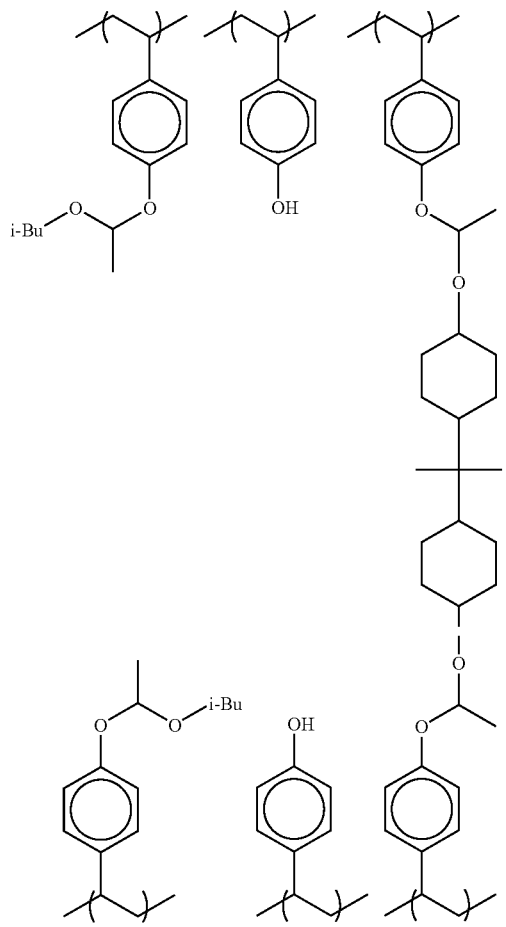
(B-37)
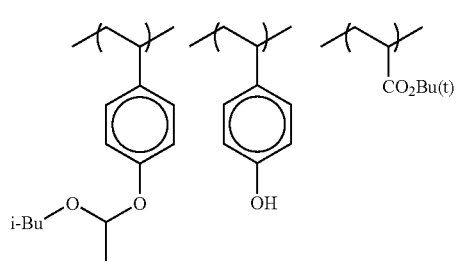
(B-38)

-continued
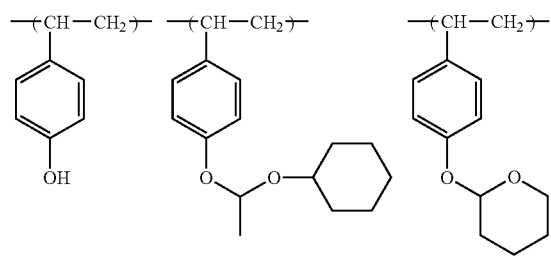 (B-39)
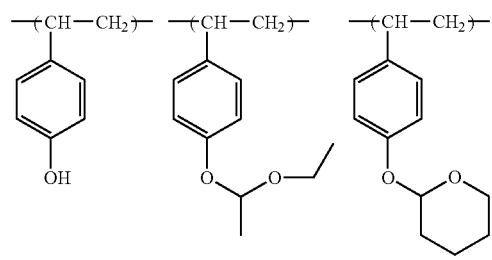 (B-40)
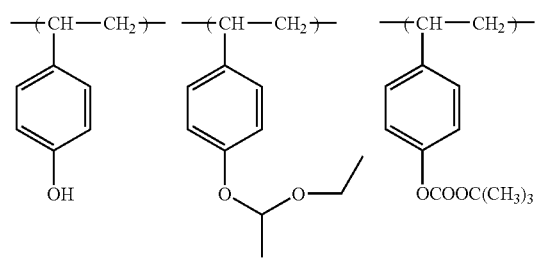 (B-41)
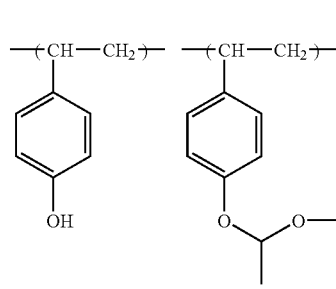 (B-42)
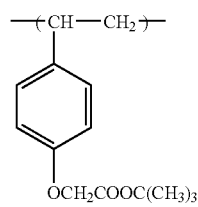
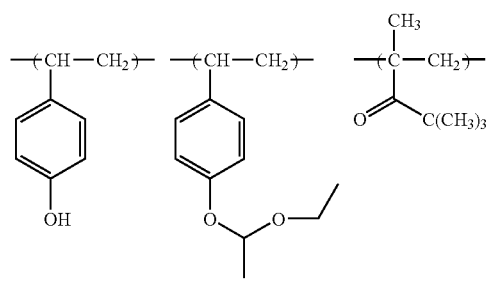 (B-43)
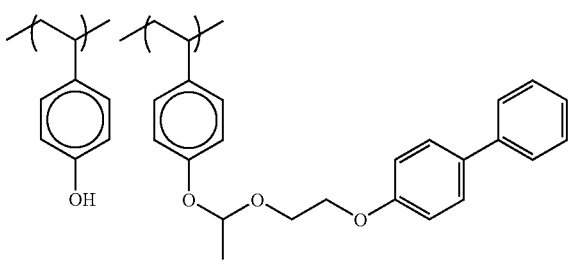 (B-44)
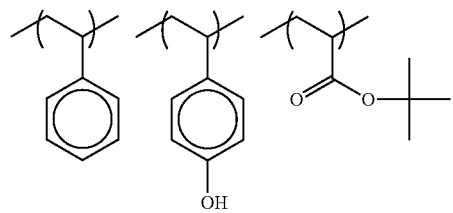 (B-45)
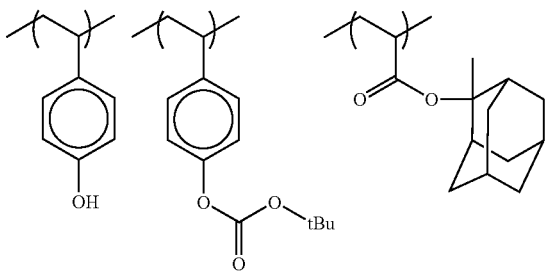 (B-46)
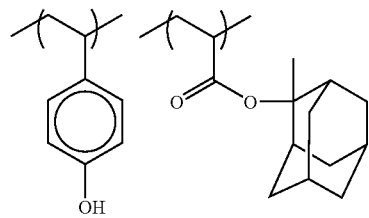 (B-47)
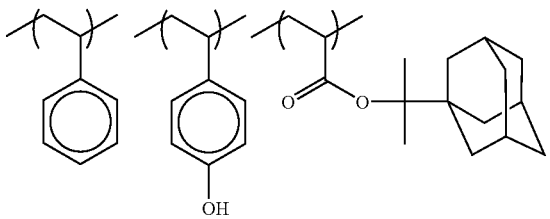 (B-48)

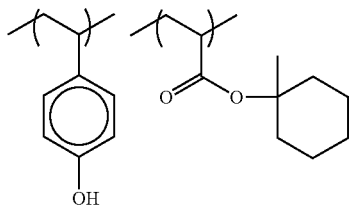
(B-49)

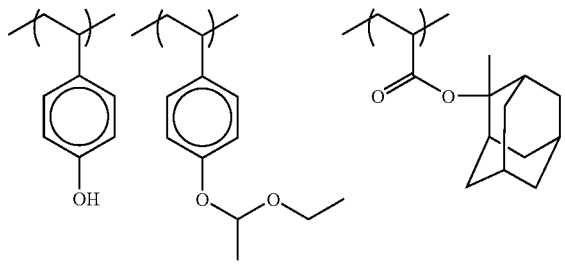
(B-50)

The content of the group capable of decomposing by an acid is expressed by B/(B+S) using the number (B) of groups capable of decomposing by an acid in the resin and the number (S) of alkali-soluble groups not protected by a group capable of decomposing by an acid. The content is preferably from 0.01 to 0.7, more preferably from 0.05 to 0.50, still more preferably from 0.05 to 0.40. With B/(B+S)<0.7, film shrinkage after PEB, adhesion failure to the substrate, summing and the like can be prevented, and with B/(B+S)>0.01, significant remaining of standing wave on the pattern side wall can be prevented.

When ArF excimer laser light is irradiated to the positive resist composition of the present invention, it is preferable that the component (B) has the repeating unit represented by formula (A2) and $A_2$ in formula (A2) is a resin having a monocyclic or polycyclic alicyclic hydrocarbon structure (hereinafter, also referred to as alicyclic hydrocarbon-based acid-decomposable resin).

The monocyclic or polycyclic alicyclic hydrocarbon structure in $A_2$ in formula (A2) is preferably represented by the following formula (pI) or (pII).

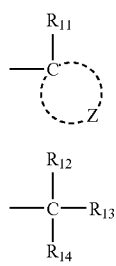

In formulae (pI) to (pII), $R_{11}$ represents a linear or branched alkyl group; Z represents an atomic group necessary for forming a cycloalkyl group together with a carbon atom; $R_{12}$ to $R_{14}$ each independently represents a linear or branched alkyl group or cycloalkyl group, provided that at least one of $R_{12}$ to $R_{14}$ represents a cycloalkyl group.

In formulae (pI) to (pII), as an alkyl group in $R_{11}$ to $R_{14}$, a linear or branched alkyl group having a carbon number of 1 to 4 is preferred. Specific examples thereof include a methyl group, an ethyl group, an n-propyl group, an isopropyl group, an n-butyl group, an isobutyl and a sec-butyl group.

A cycloalkyl group or a cycloalkyl group formed by Z and a carbon atom in $R_{12}$ to $R_{14}$ may be monocyclic or polycyclic. Specifically, mention may be made of a group having a structure of monocyclo, bicyclo, tricyclo or tetracyclo, each having 5 or more carbon atoms. They preferably comprise 6 to 30 carbon atoms, particularly 7 to 25 carbon atoms. These cycloalkyl groups may have at least one substituent.

Preferable examples of the cycloalkyl group include an adamantyl group, a noradamantyl group, a decalin residue, a tricyclodecanyl group, a tetracyclododecanyl group, a norbornyl group, a cedorol group, a cyclopentyl group, a cyclohexyl group, a cycloheptyl group, a cyclooctyl group, a cyclodecanyl group and a cyclododecanyl group. More preferably, mention may be made of an adamantyl group, a noradamantyl group, a cyclohexyl group, a cyclopentyl group, a tetracyclododecanyl group and a tricyclodecanyl group.

As for the additional substituents of these alkyl groups and cycloalkyl groups, an alkyl group having a carbon number of 1 to 4, a halogen atom, a hydroxyl group, an alkoxy group having a carbon number of 1 to 4, a carboxyl group and an alkoxycarbonyl group having a carbon number of 2 to 6 can be mentioned. As for the additional substituents of the foregoing alkyl group, alkoxy group and alkoxycarbonyl group, mention may be made of a hydroxyl group, a halogen atom and an alkoxy group.

Specific examples of the repeating unit having a monocyclic or polycyclic hydrocarbon structure represented by formula (pI) or (pII) are shown below. However, the present invention is not limited thereto.

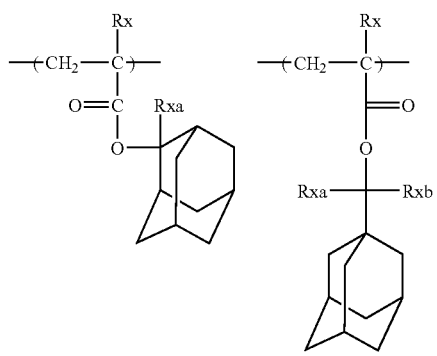

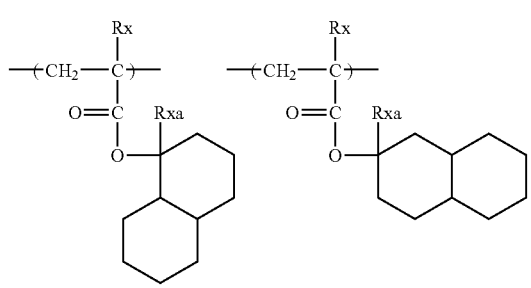

-continued

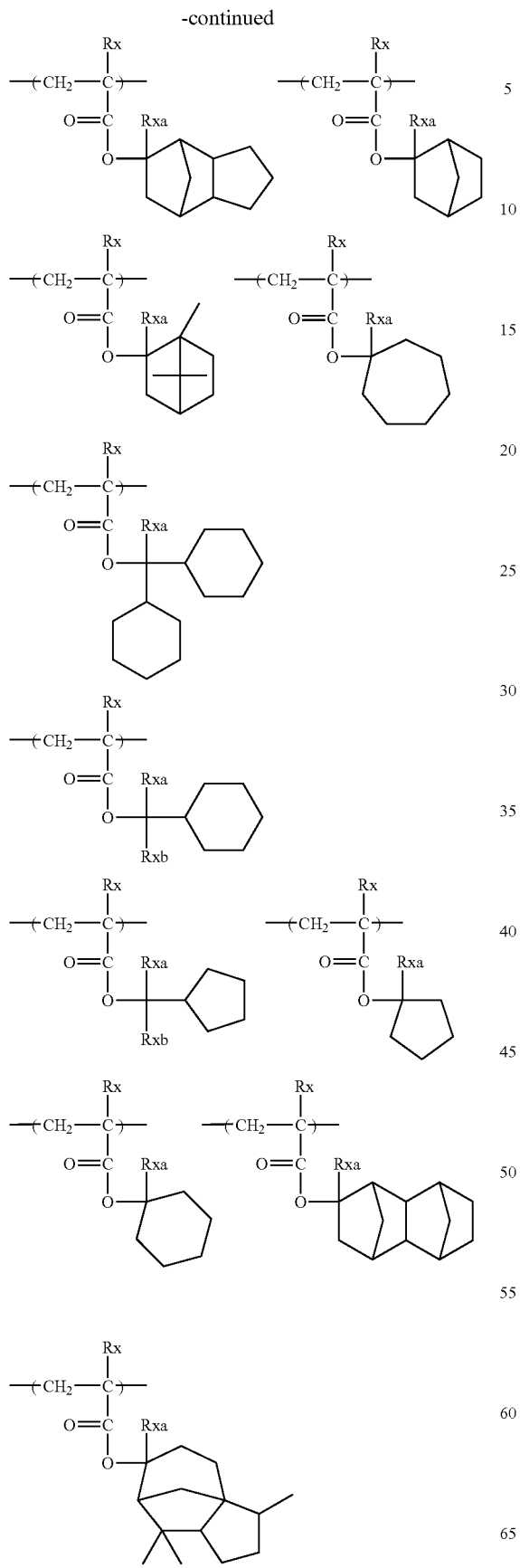
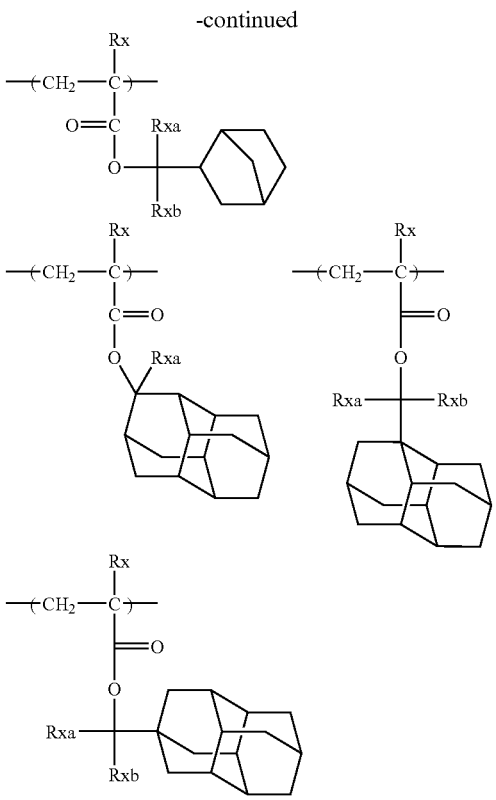

In these specific examples, Rx represents H, $CH_3$, $CF_3$ or $CH_2OH$; Rxa and Rxb each independently represents an alkyl group having a carbon number of 1 to 4.

In the alicyclic hydrocarbon-based acid-decomposable resin, a content of the repeating unit having a partial structure including an alicyclic hydrocarbon represented by formulae (pI) to (pII) is preferably from 20 to 70 mol %, more preferably from 20 to 50 mol % and further preferably from 25 to 40 mol % in all repeating structural units.

The alicyclic hydrocarbon-based acid-decomposable resin preferably has a repeating unit having a lactone structure. As the lactone structure, any group can be used as long as a lactone structure is included. However, a 5 to 7-membered lactone structure is preferable. Specifically, those wherein another ring structure is condensed with a 5 to 7-membered lactone structure so as to form a polycyclic structure or a spiro structure are preferable.

A content of a repeating unit having a lactone structure is preferably from 15 to 60 mol %, more preferably from 20 to 50 mol % and further preferably from 30 to 50 mol % based on the amount of all repeating units in a polymer.

An alicyclic hydrocarbon-based acid-decomposable resin preferably comprises a repeating unit having an alicyclic hydrocarbon structure which is substituted with a polar group, which gives improvement in adhesiveness to a substrate and developer affinity. As the alicyclic hydrocarbon structure of the alicyclic hydrocarbon structure which is substituted with at least one polar group, an adamantyl group, a diamantyl group and a norbornyl group are preferable. As the polar group, a hydroxyl group and a cyano group are preferable.

A content of a repeating unit having an alicyclic hydrocarbon structure which is substituted with at least one polar group is preferably from 5 to 40 mol %, more preferably from 5 to 30 mol % and further preferably from 10 to 25 mol % based on the amount of all repeating units in a polymer.

An alicyclic hydrocarbon-based acid-decomposable resin preferably comprises a repeating unit having an alkali-soluble group. As the alkali-soluble group, mention may be made of a carboxyl group, a sulfonamide group, a sulfonylimide group, a vinyl sulfonylimide group, and an aliphatic alcohol group wherein a position is replaced with an electron-attracting group. The alicyclic hydrocarbon-based acid-decomposable resin preferably comprises a repeating unit having a carboxyl group.

A content of a repeating unit having the alkali-soluble group is preferably from 1 to 20 mol %, more preferably from 3 to 15 mol % and further preferably from 5 to 10 mol % based on the amount of all repeating units in a polymer.

Examples of an alicyclic hydrocarbon-based acid-decomposable resin are shown below. However, the present invention is not limited thereto.

(1)

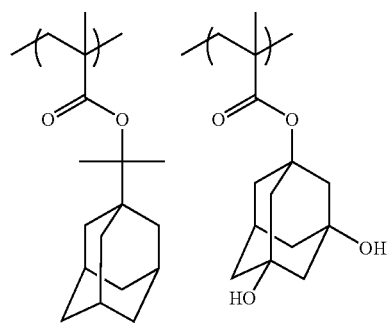

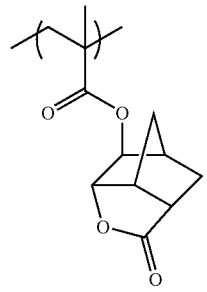

(2)

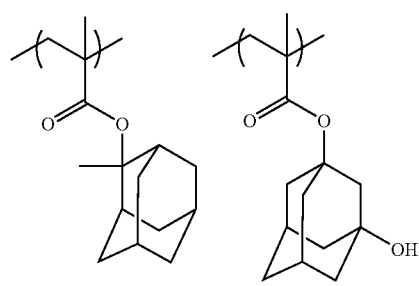

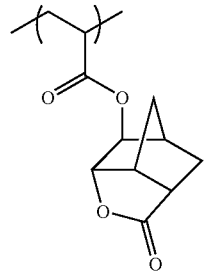

-continued (3)

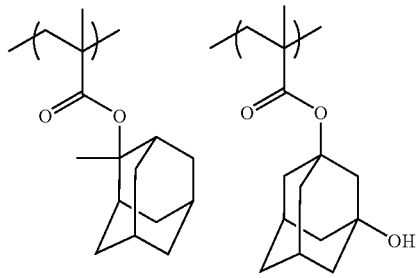

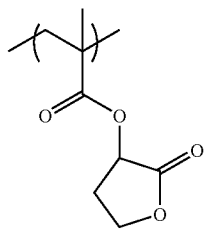

(4)

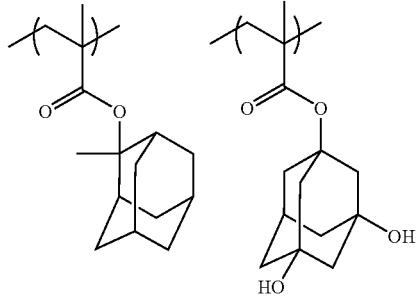

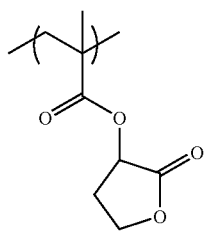

(5)

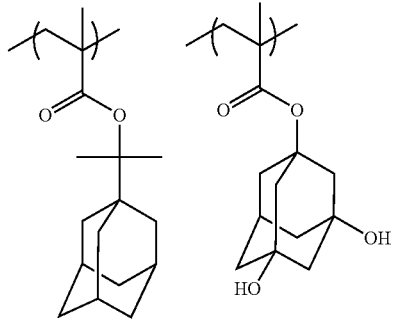

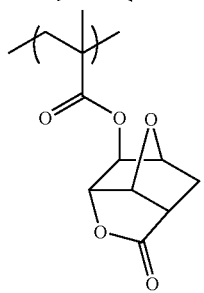

-continued
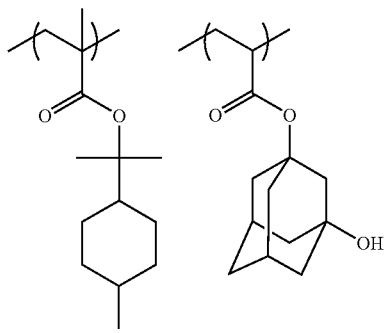
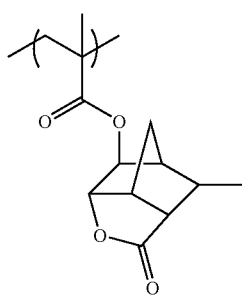
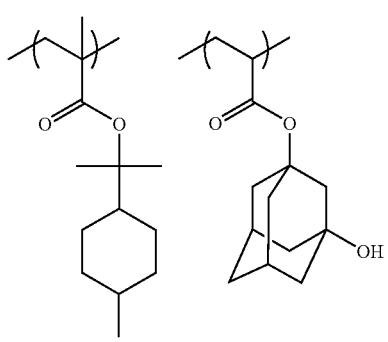
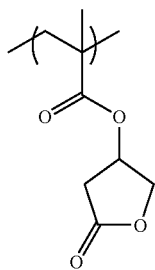
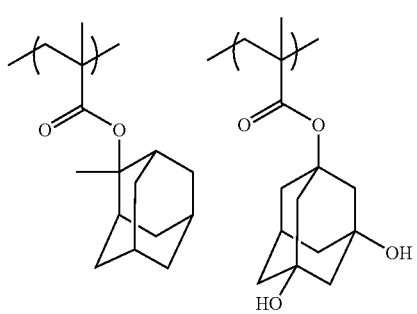
-continued
(6)
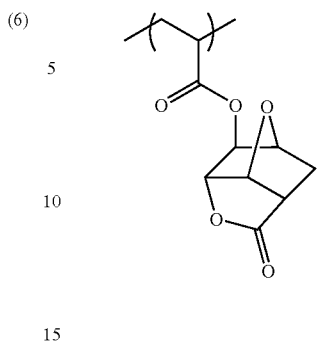
(7)
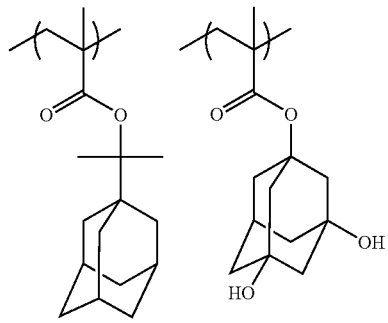
(8)
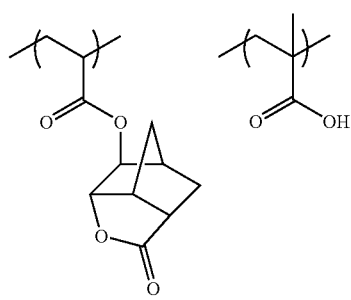
(9)
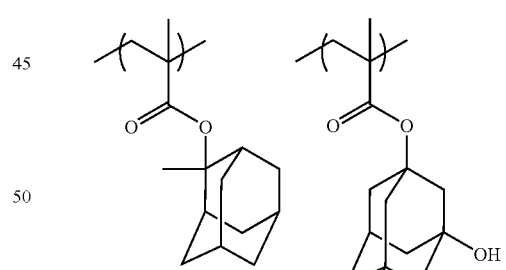
(10)
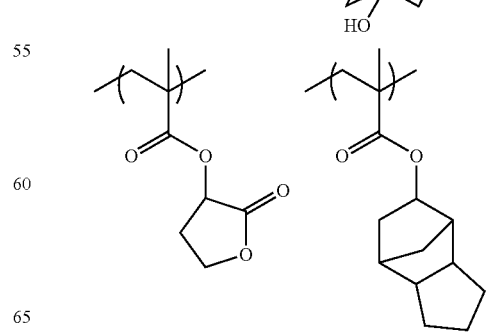

(11)
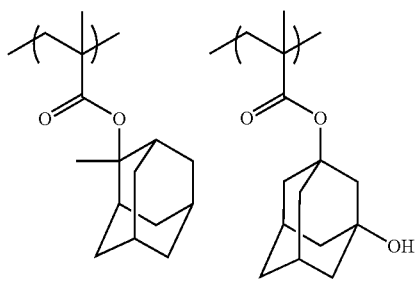
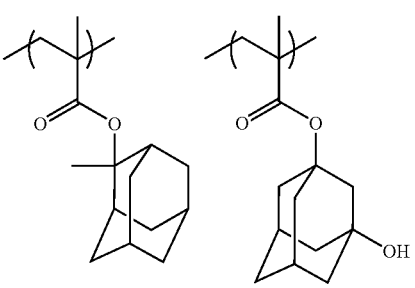
(14)
(12)
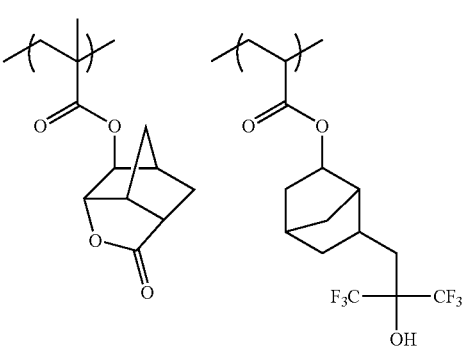
(15)
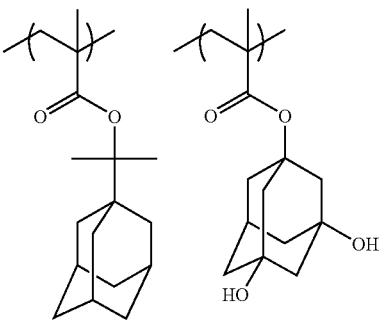
(13)
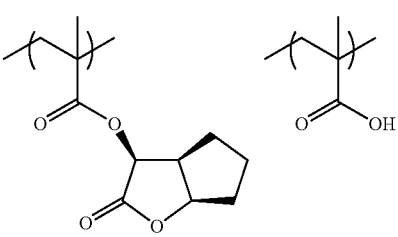
(16)
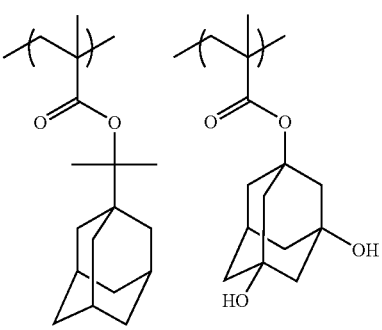

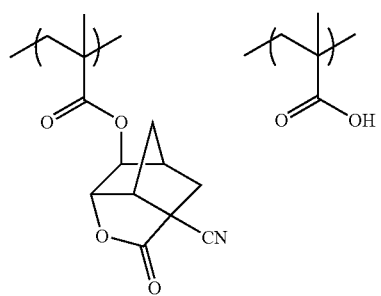
(17)
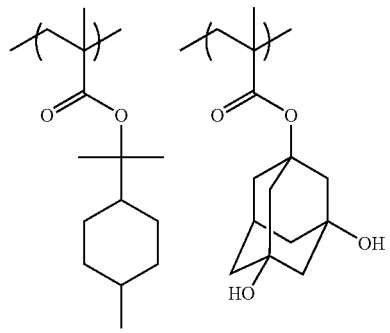
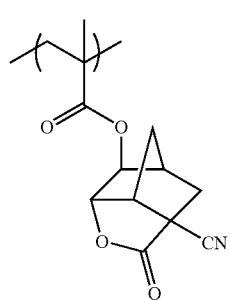
(18)
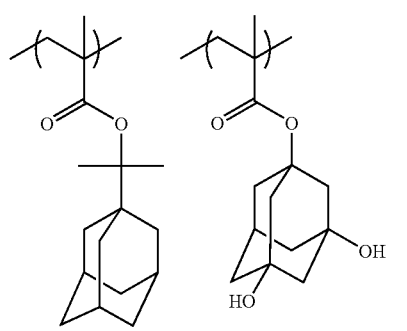
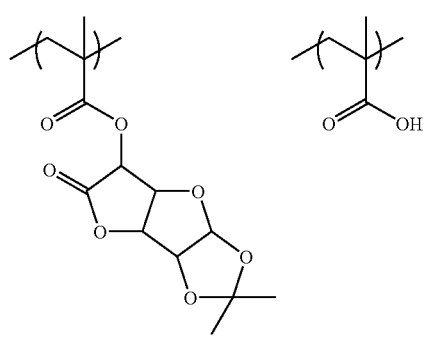
(19)
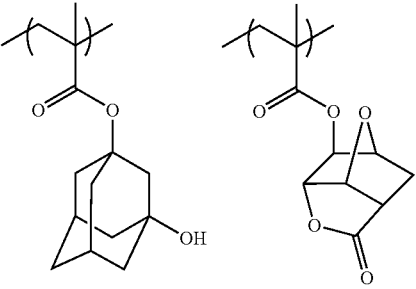
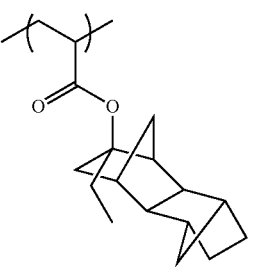
(20)
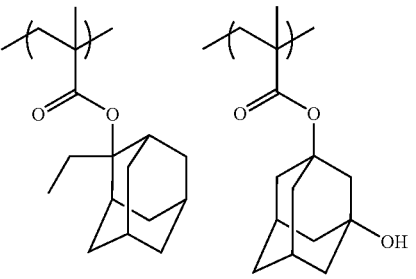
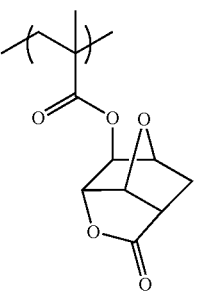
(21)
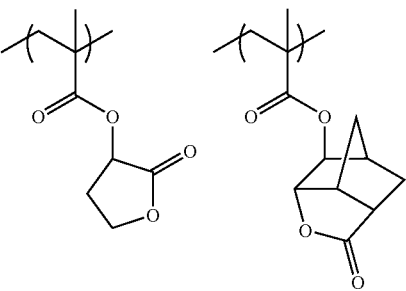

-continued

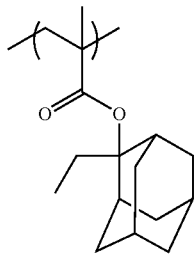
(22)
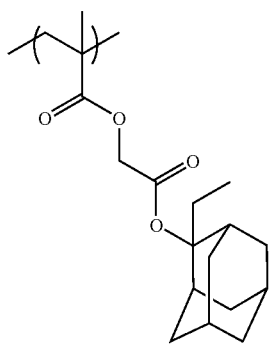

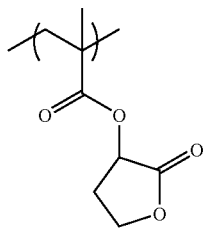

(23)
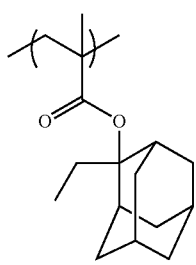

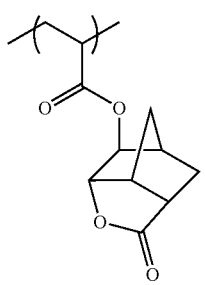

-continued
(24)
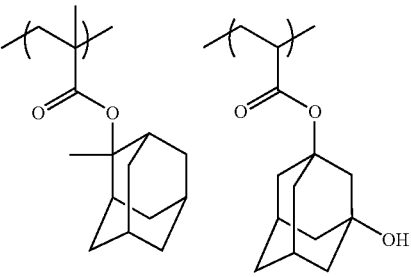

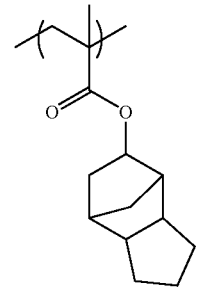

(25)
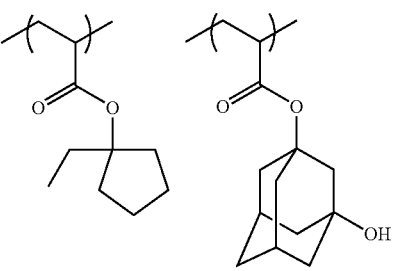

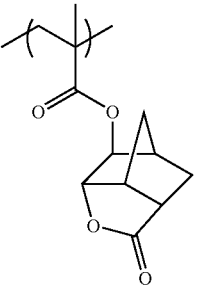

When the component (B) is a resin, the weight average molecular weight (Mw) of the component (B) is preferably from 2,000 to 200,000, more preferably from 5,000 to 100,000, still more preferably from 8,000 to 50,000.

The molecular weight distribution (dispersion degree) (Mw/Mn) is preferably from 1.0 to 4.0, more preferably from 1.0 to 2.0, still more preferably from 1.0 to 1.6.

The weight average molecular weight here is defined as a polystyrene-reduced value determined by gel permeation chromatography.

As for the component (B), two or more species may be used in combination.

The amount of the component (B) added is suitably from 80 to 98 wt %, preferably from 85 to 96 wt %, based on the solid content of the positive resist composition.

The component (B) is preferably a resin having the repeating unit represented by the following formula (A3) (hereinafter, also referred to as secondary benzyl-based acid-decomposable resin):

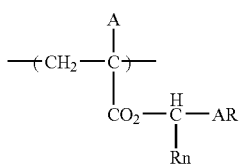

(A3)

In formula (A3), AR represents a benzene ring or a naphthalene ring, preferably p-methyl benzene; Rn represents an alkyl group, a cycloalkyl group or an aryl group; Rn and AR may be combined together to form a ring; and A represents a hydrogen atom, an alkyl group, a cycloalkyl group, a halogen atom, a cyano group or an alkyloxycarbonyl group, preferably a hydrogen atom or a methyl group.

As an alkyl group or a cycloalkyl group in Rn, those having a carbon number of 20 or less are preferable. Examples thereof include a methyl group, an ethyl group, a propyl group, an i-propyl group, an n-butyl group, an i-butyl group, a tert-butyl group, a pentyl group, a cyclopentyl group, a hexyl group, a cyclohexyl group, an octyl group and a dodecyl group. These groups may have at least one substituent. Preferable examples thereof include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophencarbonyloxy group, a thiophenmethylcarbonyloxy group, and a heterocyclic residue such as a pyrrolidone residue. Those having a carbon number of 8 or less are preferable. In particular, an alkoxy group, a hydroxyl group, a halogen atom, a nitro group, an acyl group, an acyloxy group, an acylamino group and a sulfonylamino group are preferable.

An aryl group as Rn preferably has a carbon number of 6 to 14. Examples thereof include a phenyl group, a xylyl group, a toluyl group, a cumenyl group, a naphthyl group and an anthracenyl group.

As an alkyl group or a cycloalkyl group in A, those having a carbon number of 20 or less are preferable. Examples thereof include a methyl group, an ethyl group, a propyl group, an i-propyl group, an n-butyl group, an i-butyl group, a tert-butyl group, a pentyl group, a cyclopentyl group, a hexyl group, a cyclohexyl group, an octyl group and a dodecyl group. These groups may have at least one substituent. Preferable examples thereof include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophencarbonyloxy group, a thiophenmethylcarbonyloxy group, and a heterocyclic residue such as a pyrrolidone residue. Those having a carbon number of 8 or less are preferable. In particular, a $CF_3$ group, an alkyloxycarbonylmethyl group, an alkyl-carbonyloxymethyl group, a hydroxymethyl group and an alkoxymethyl group are preferable.

As a halogen atom in A, mention may be made of a fluorine, chlorine, bromine and iodine atom. A fluorine atom is preferable.

As an alkyl group included in an alkyloxycarbonyl group in A, alkyl groups which are the same as those in the foregoing A can be mentioned.

Specific examples of the repeating unit represented by formula (A3) are set forth below, but the present invention is not limited thereto.

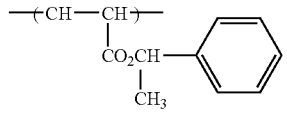
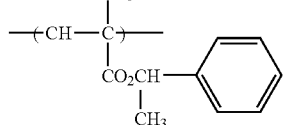
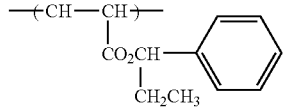
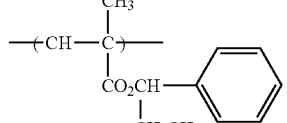
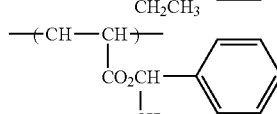
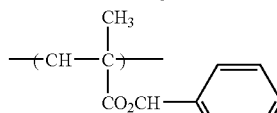
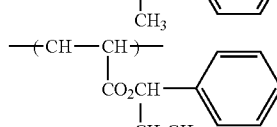
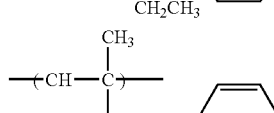
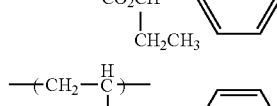
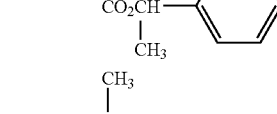
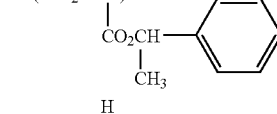
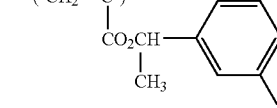
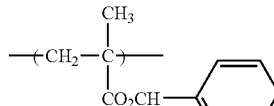
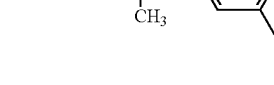

-continued
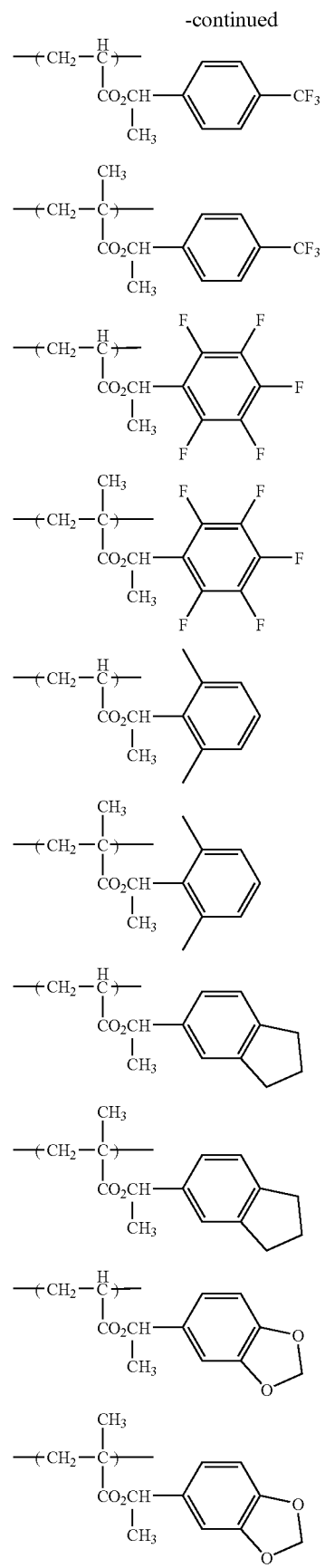
-continued
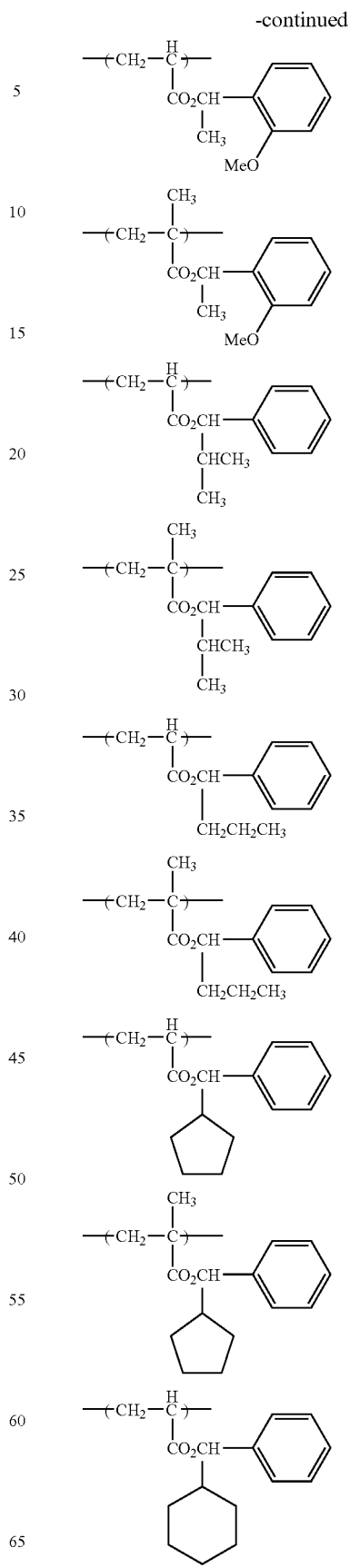

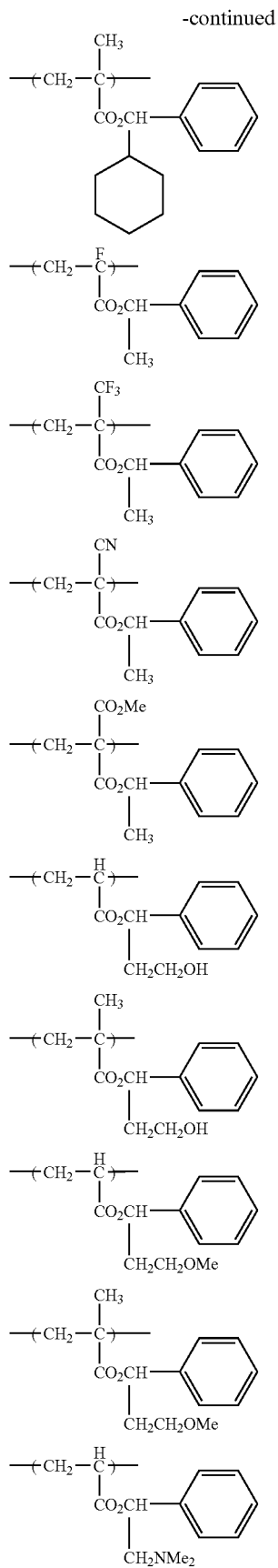
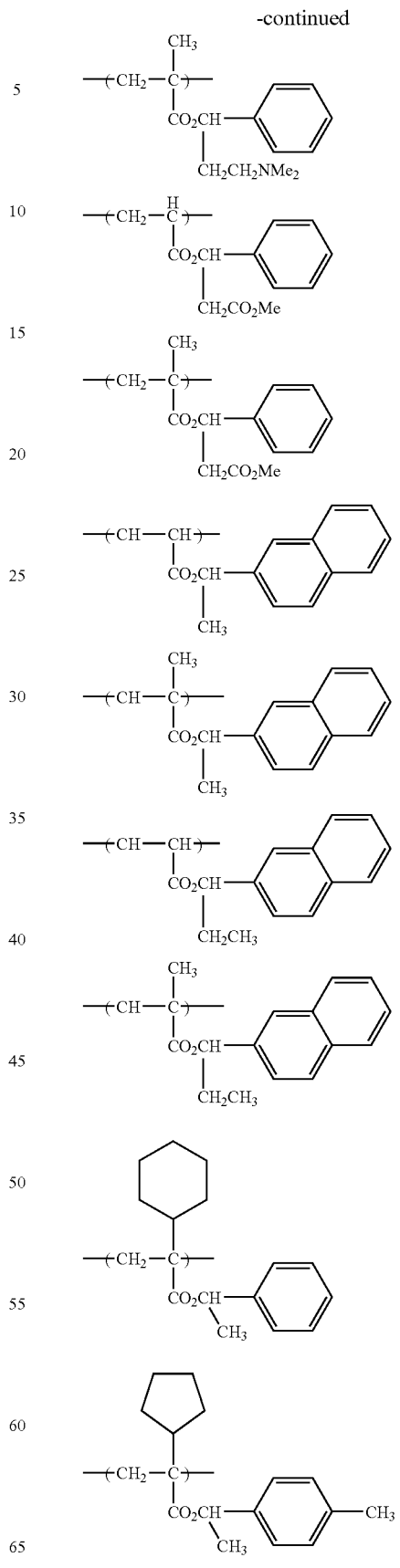

-continued

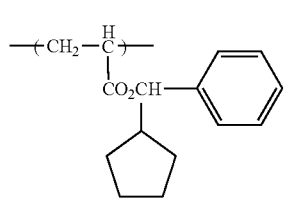 (M-3')

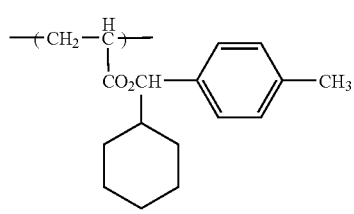 (M-4')

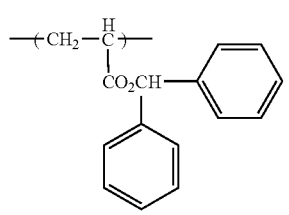 (M-5')

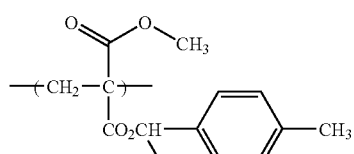 (M-6')

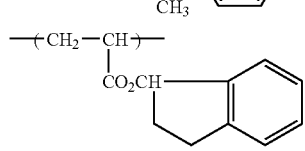

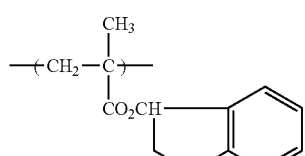

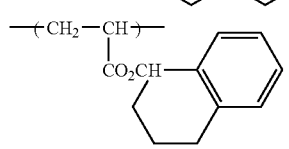

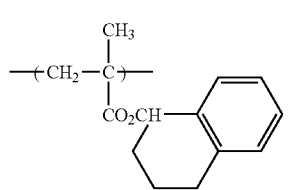

It is also preferable that a secondary benzyl-based acid-decomposable resin further comprises the repeating unit represented by formula (A4).

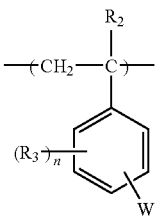 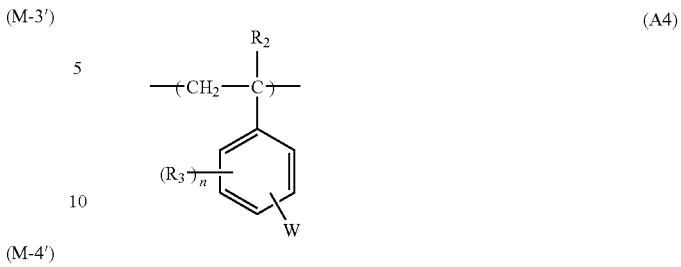 (A4)

In formula (A4), $R_2$ represents a hydrogen atom, a methyl group, a cyano group, a halogen atom or a perfluoro group (preferably a carbon number of 1 to 4); $R_3$ represents a hydrogen atom, an alkyl group, a cycloalkyl group, a halogen atom, an aryl group, an alkoxy group or an acyl group; n is an integer of 0 to 4; and W represents a group which does not decompose under the action of an acid.

W represents a group which does not decompose under the action of an acid (also referred to as an acid-stable group). Specifically, mention may be made of a hydrogen atom, a halogen atom, an alkyl group, a cycloalkyl group, an alkenyl group, an aryl group, an acyl group, an alkylamide group, an arylamidemethyl group and an arylamide group. As the acid-stable group, mention may be made of preferably an acyl group, an alkylamide group, more preferably an acyl group, an alkylcarbonyloxy group, an alkyloxy group, a cycloalkyloxy group and an aryloxy group.

In an acid-stable group of W, as an alkyl group, preferably mention may be made of those having a carbon number of 1 to 4 such as a methyl group, an ethyl group, a propyl group, an n-butyl group, a sec-butyl group and a t-butyl group; as a cycloalkyl group, preferably mention may be made of those having a carbon number of 3 to 10 such as a cyclopropyl group, a cyclobutyl group, a cyclohexyl group and an adamantly group; as an alkenyl group, preferably mention may be made of those having a carbon number of 2 to 4 such as a vinyl group, a propenyl group, an allyl group and a butenyl group; and as an aryl group, preferably mention may be made of those having a carbon number of 6 to 14 such as a phenyl group, a xylyl group, a toluyl group, a cumenyl group, a naphthyl group and an anthracenyl group. W can be present in any position in a benzene ring, preferably, meta- or para-position of styrene skeleton, particularly preferably para-position.

Specific preferred examples of the repeating unit represented by formula (A4) are set forth below, but the present invention is not limited thereto.

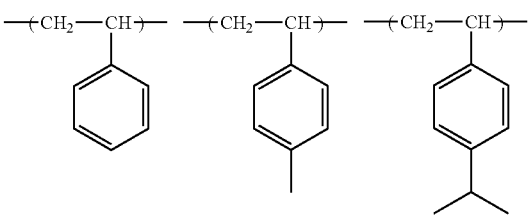

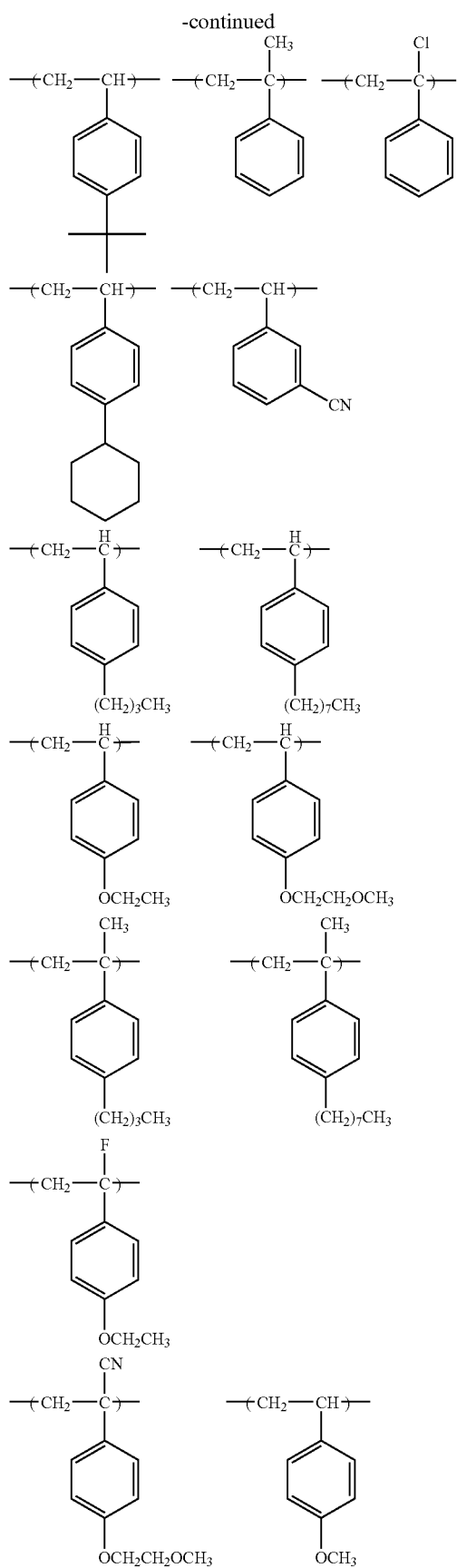
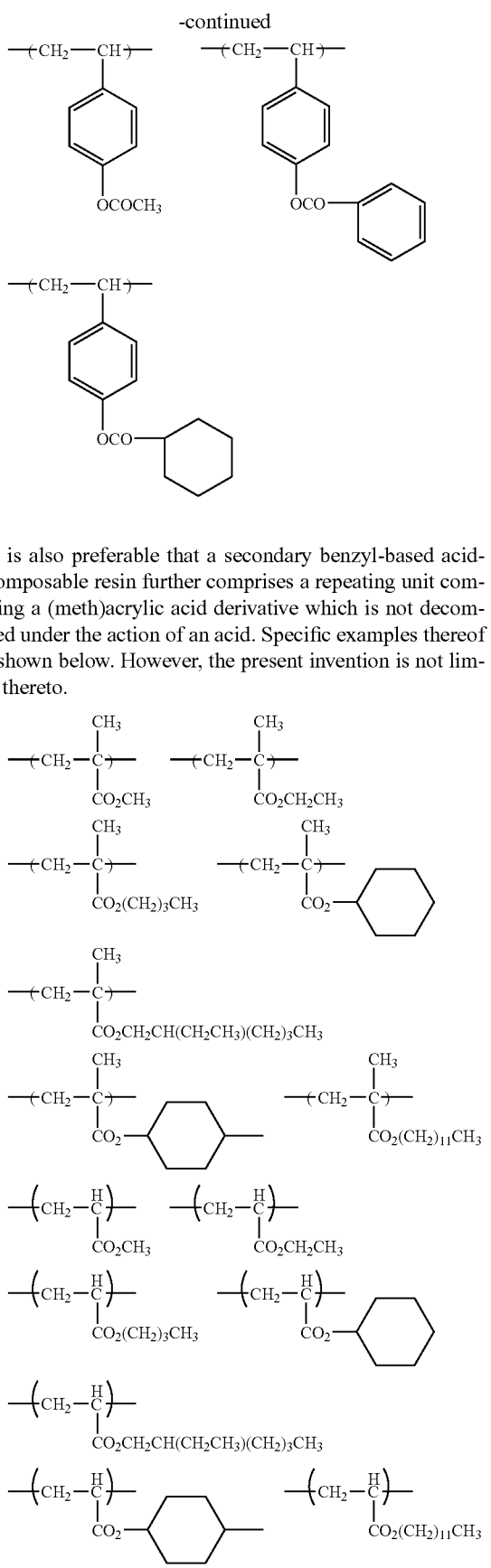
It is also preferable that a secondary benzyl-based acid-decomposable resin further comprises a repeating unit comprising a (meth)acrylic acid derivative which is not decomposed under the action of an acid. Specific examples thereof are shown below. However, the present invention is not limited thereto.

-continued

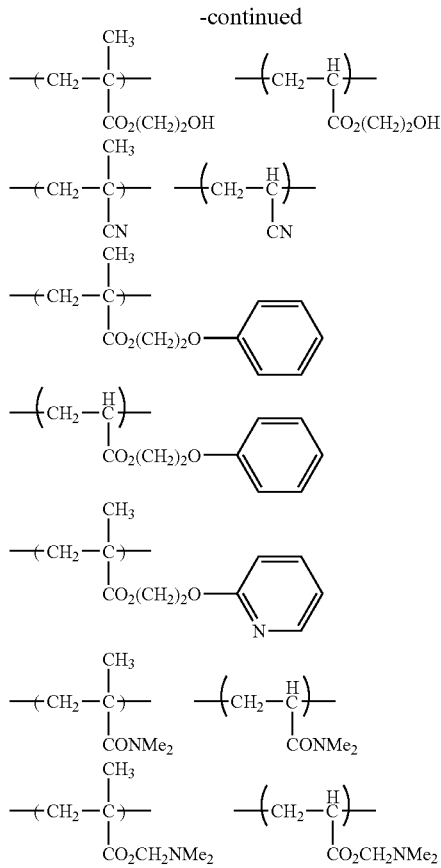

The secondary benzyl-based acid-decomposable resin comprises the repeating unit represented by formula (A3) which is generated from a carboxyl group in its side chain under the action of an acid. It is a resin wherein its solubility in an alkali developer increases under the action of an acid (acid-decomposable resin).

The secondary benzyl-based acid-decomposable resin may also comprise the repeating unit represented by the foregoing formula (A1) or (A2). In these other repeating units, an acid-decomposable group may also be included.

In addition to the above-described groups, as the acid-decomposable group, for example, those represented by $-(C=O)-X_1-R^0$ can be mentioned.

In the above formula, $R^0$ represents a tertiary alkyl group such as t-butyl, t-amyl, etc.; an isoboronyl group; a 1-alkoxyethyl group such as 1-ethoxyethyl, 1-butoxyethyl, 1-isobutoxyethyl, 1-cyclohexyloxyethyl, etc.; an alkoxymethyl group such as 1-methoxymethyl, 1-ethoxymethyl, etc.; a 3-oxoalkyl group, a tetrahydropyranyl group, a tetrahydrofuranyl group, a trialkylsilyl ester group, a 3-oxocyclohexyl ester group, a 2-methyl-2-adamantyl group, a mevalonic lactone residue, etc. $X_1$ represents an oxygen atom, a sulfur atom, $-NH-$, $-NHSO_3-$ or $-NHSO_3NH-$.

In a secondary benzyl-based acid-decomposable resin, a content of a repeating unit having an acid-decomposable group is preferably from 1 to 50 mol %, more preferably from 3 to 40 mol % and particularly preferably from 5 to 35 mol % based on the amount of all repeating units.

In a secondary benzyl-based acid-decomposable resin, a content of the repeating unit represented by formula (A3) is preferably from 10 to 60 mol %, more preferably from 15 to 50 mol % and particularly preferably from 20 to 40 mol % based on the amount of all repeating units.

In a secondary benzyl-based acid-decomposable resin, a content of the repeating unit represented by formula (A1) is preferably from 40 to 90 mol %, more preferably from 50 to 85 mol % and particularly preferably from 60 to 80 mol % based on the amount of all repeating units.

In a secondary benzyl-based acid-decomposable resin, a content of the repeating unit represented by formula (A2) is preferably from 5 to 60 mol %, more preferably from 10 to 50 mol % and particularly preferably from 15 to 35 mol % based on the amount of all repeating units.

A secondary benzyl-based acid-decomposable resin may further comprise the repeating unit represented by formula (A4), which is preferable in view of improvement in a film quality, the suppression of reduction of a film thickness in an unexposed area. A content of the repeating unit represented by formula (A4) is preferably from 0 to 50 mol %, more preferably from 0 to 40 mol % and particularly preferably from 0 to 30 mol % in all respective repeating units.

A secondary benzyl-based acid-decomposable resin can be copolymerized with other appropriate polymerizable monomers so that at least one alkali-soluble group, for example, a phenolic hydroxyl group or a carboxyl group, may be introduced in order to maintain a desirable developing ability to an alkali developer. While, for improving a film quality, other hydrophobic polymerizable monomers such as an alkyl acrylate or an alkyl methacrylate can be copolymerized therewith.

The weight average molecular weight (Mw) of respective secondary benzyl-based acid-decomposable resins is preferably from 1,000 to 15,000, more preferably from 3,000 to 12,000. The molecular weight distribution (Mw/Mn) is preferably from 1.0 to 2.0, more preferably from 1.0 to 1.8, still more preferably from 1.0 to 1.7.

The weight average molecular weight here is defined as a polystyrene-reduced value determined by gel permeation chromatography.

A radical polymerization is effected using an azo-based polymerization initiator to be able to produce a secondary benzyl-based acid-decomposable resin having a molecular weight distribution of from 1.5 to 2.0. Further preferable secondary benzyl-based acid-decomposable resins having a molecular weight distribution of from 1.0 to 1.7 can be synthesized according to living radical polymerization.

A secondary benzyl-based acid-decomposable resin also can be used in combination of two or more kinds thereof.

An amount of the secondary benzyl-based acid-decomposable resin to be added is in total generally from 10 to 96 mass %, preferably from 15 to 96 mass %, more preferably from 20 to 95 mass % based on the total solid content of the positive resist composition.

Specific examples of a secondary benzyl-based acid-decomposable resin are shown below. However, the present invention is not limited thereto.

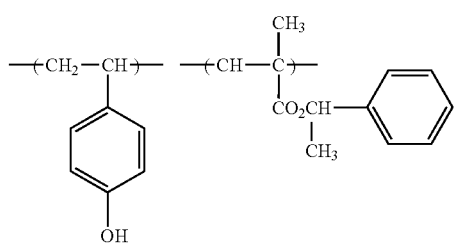

-continued
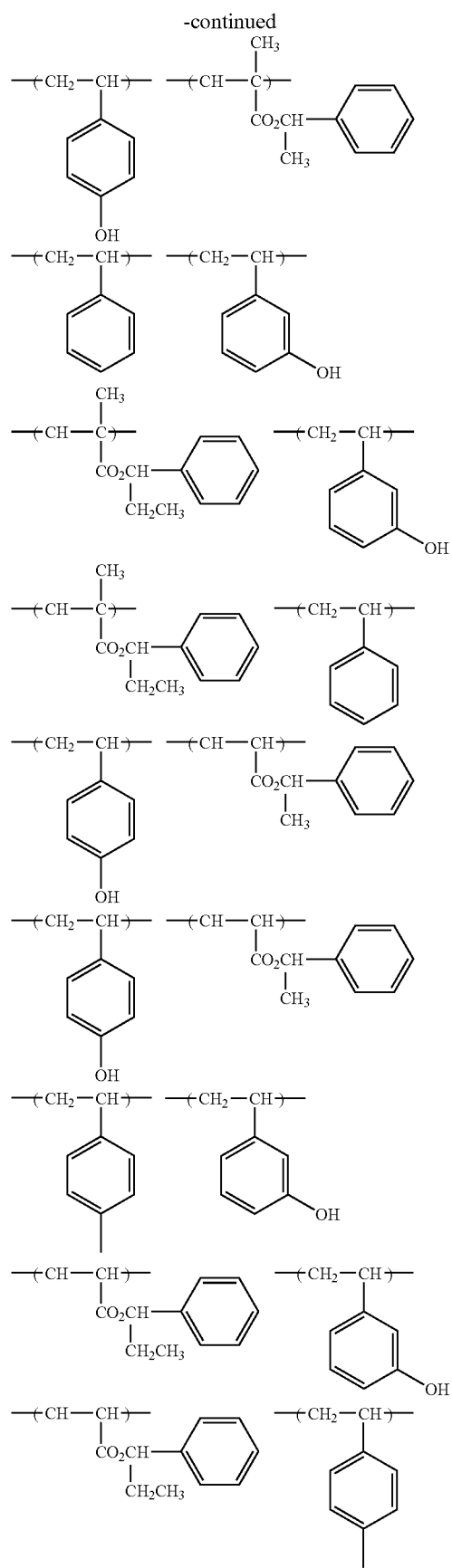
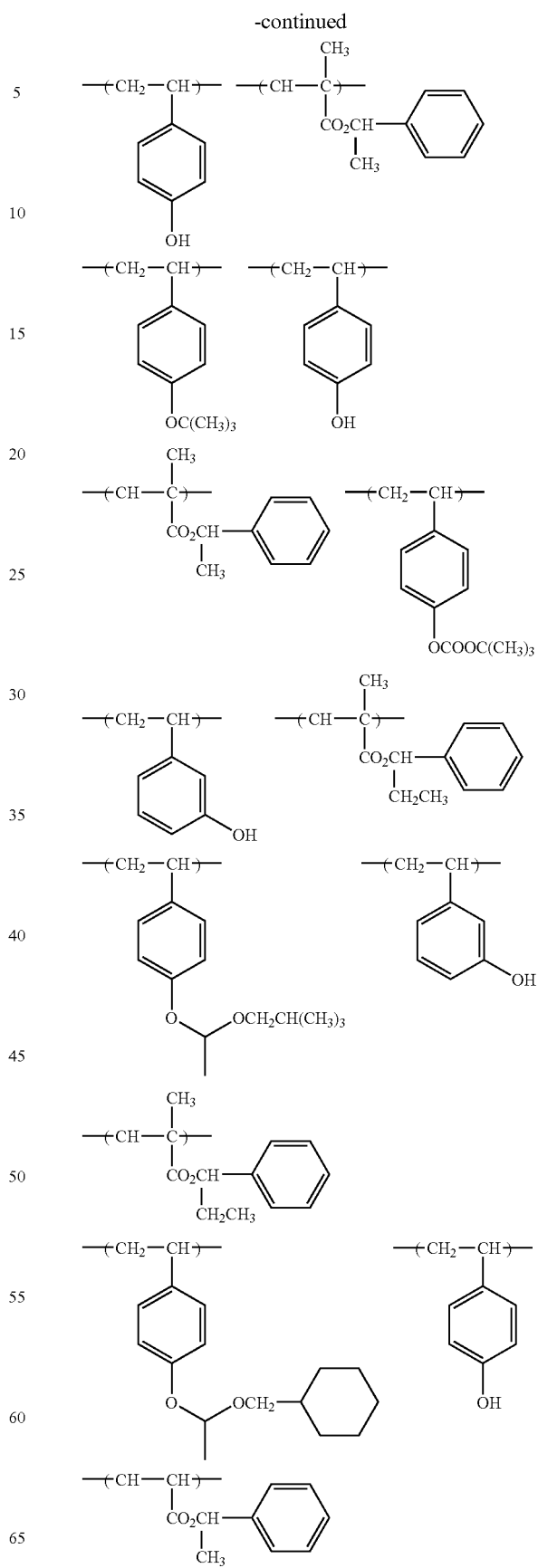

-continued
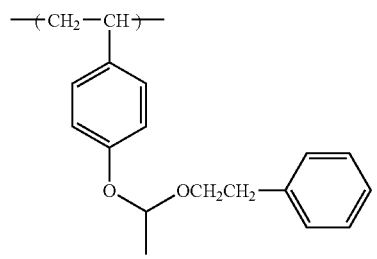
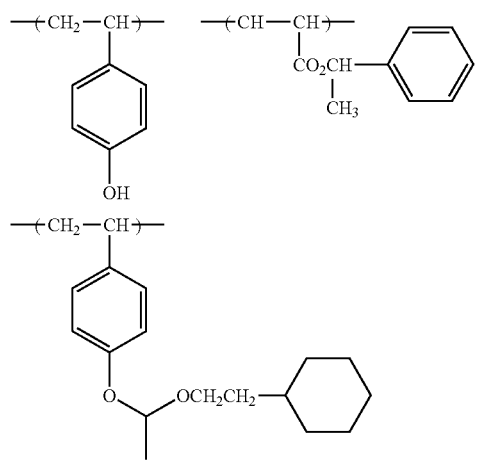
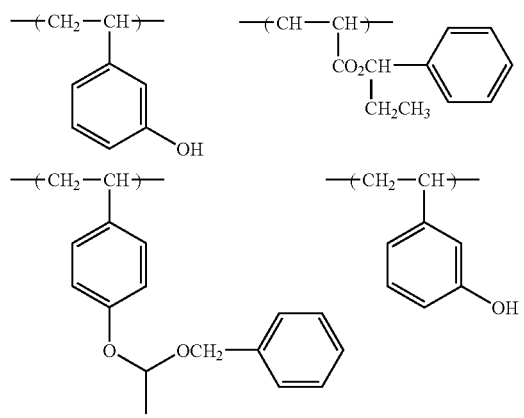
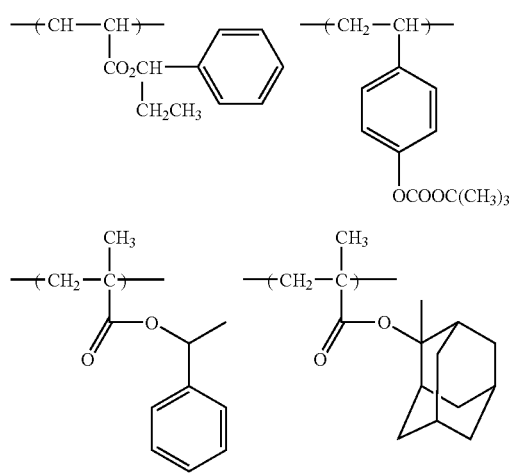
-continued
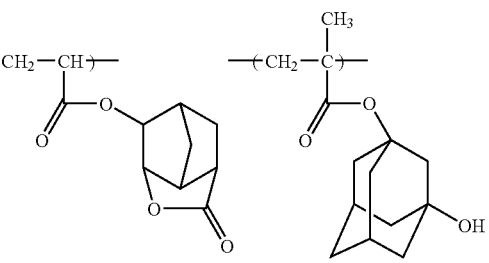
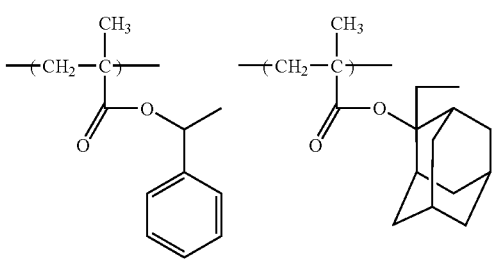
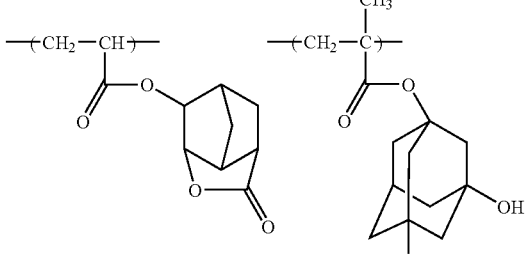
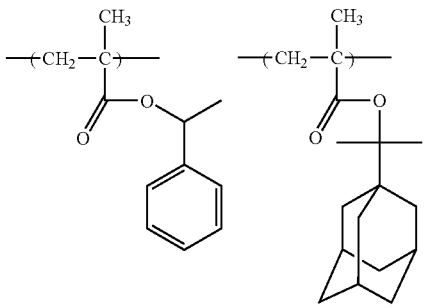
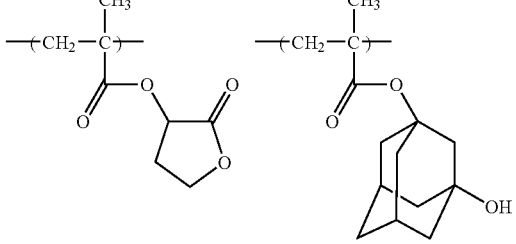
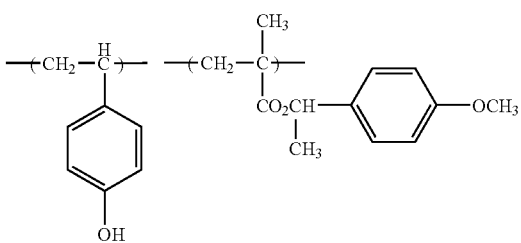

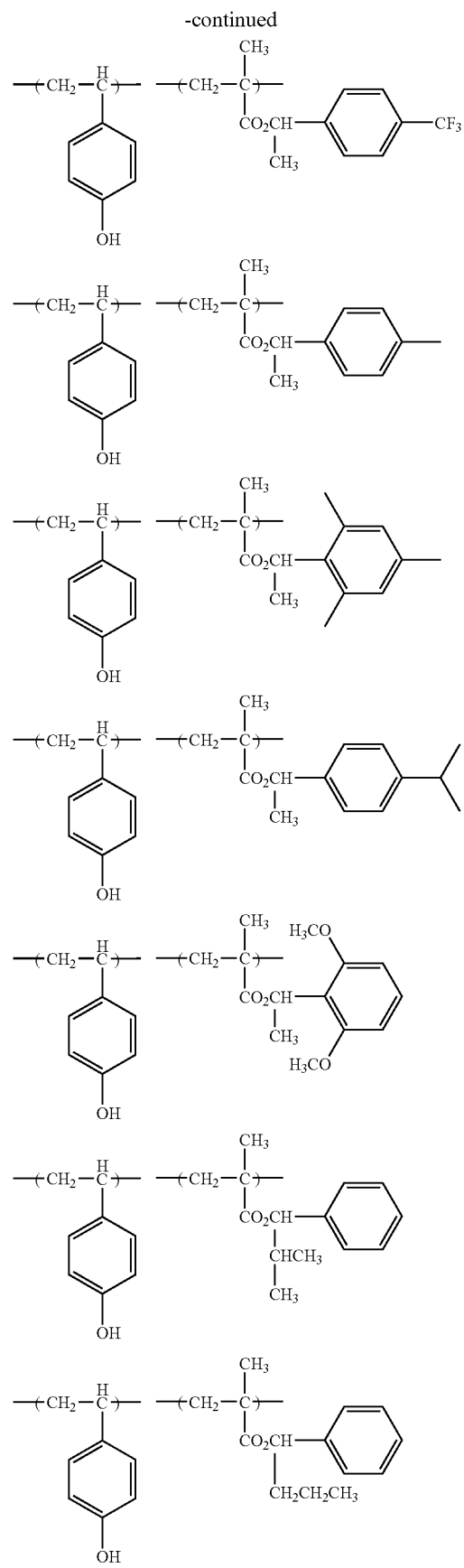
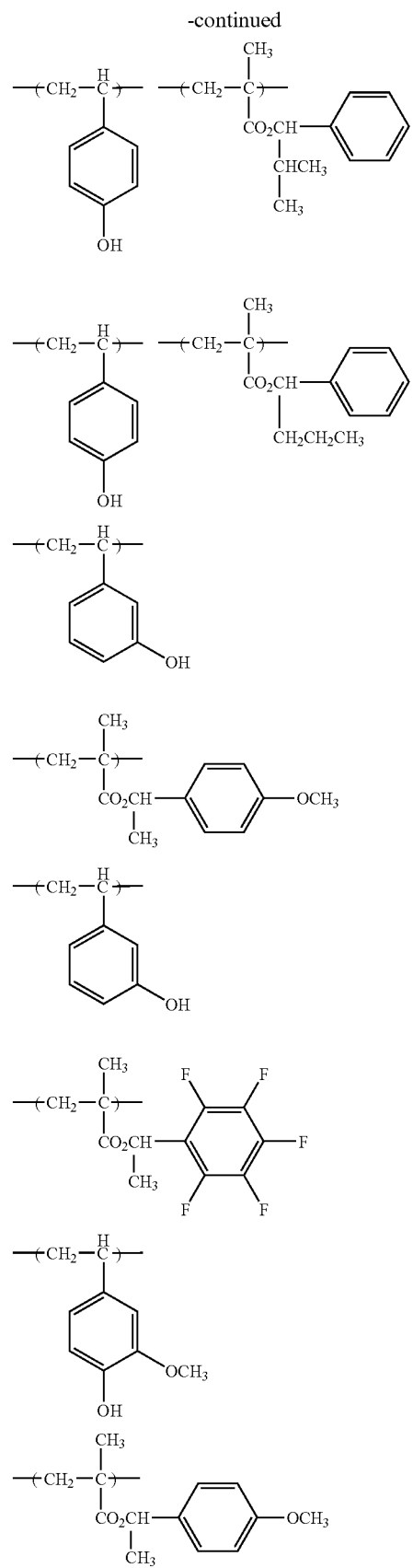

-continued
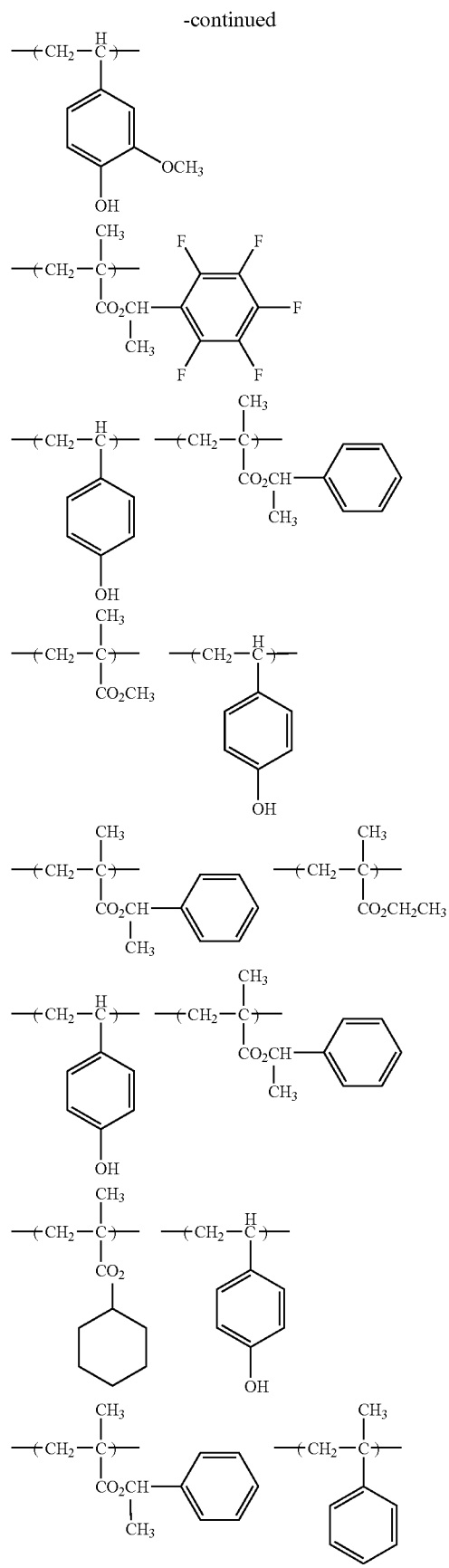
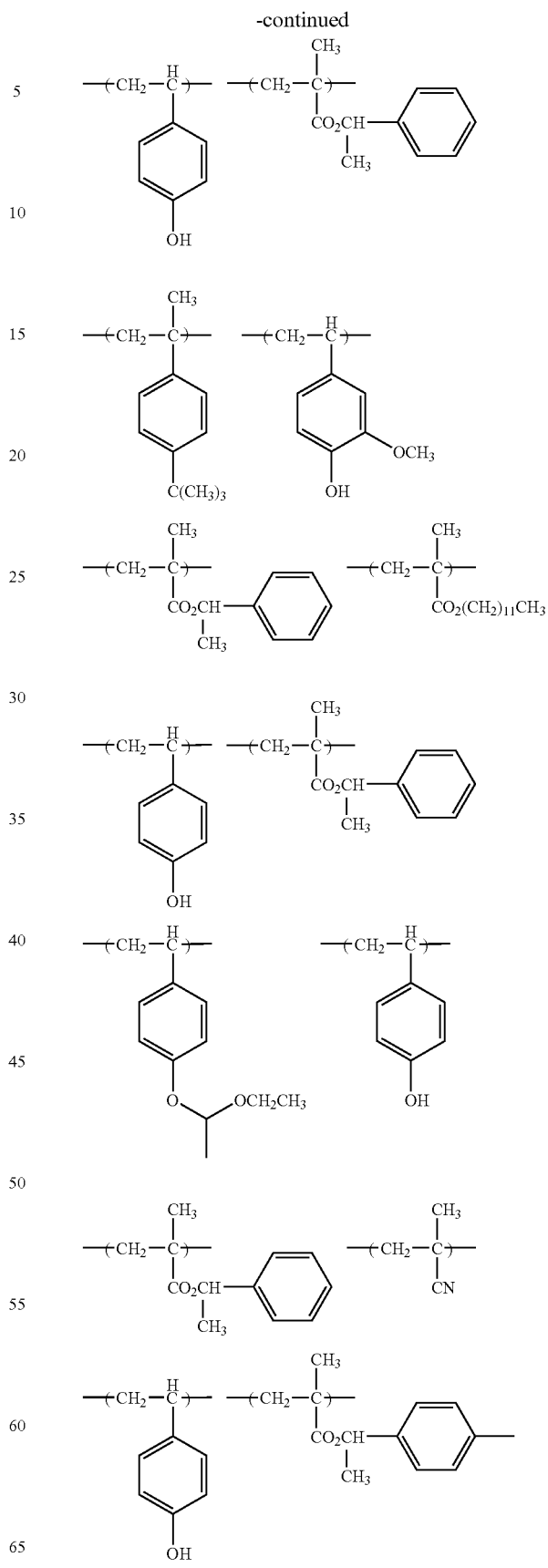

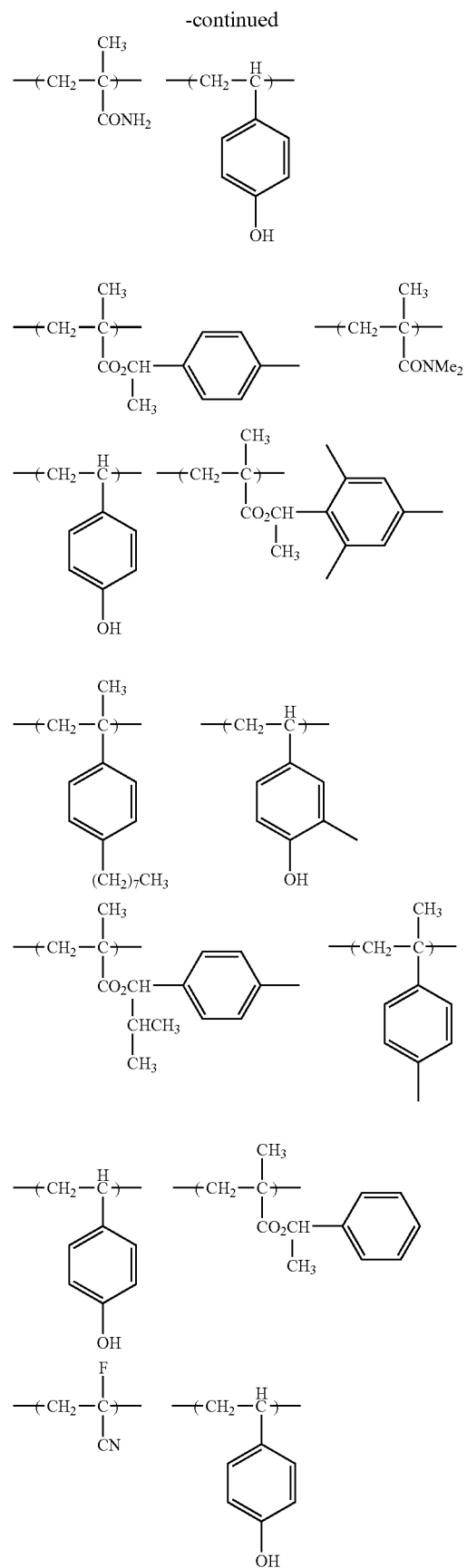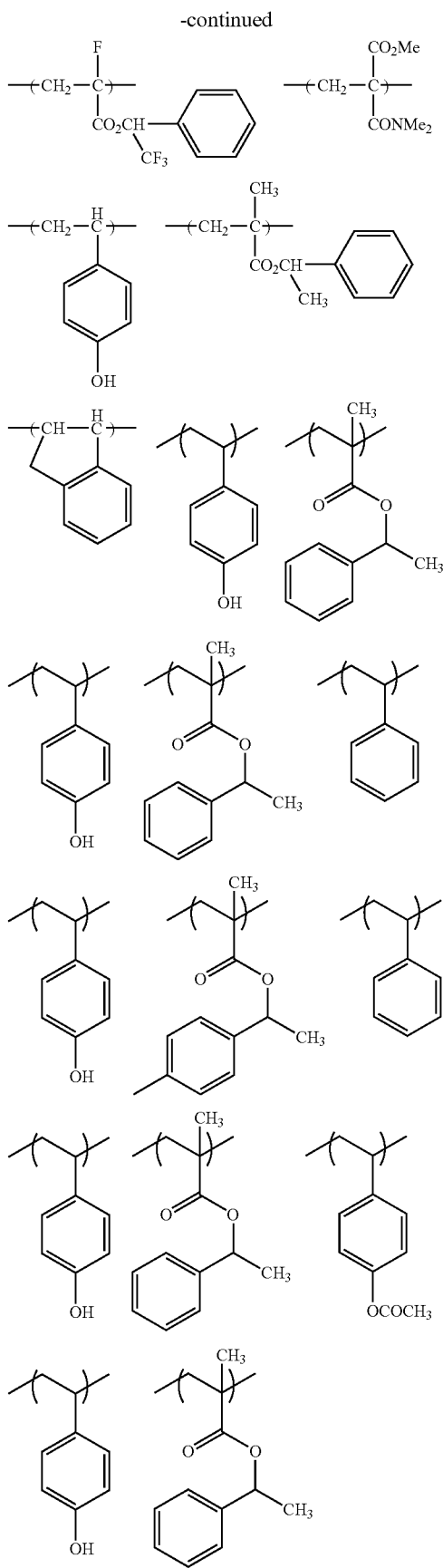

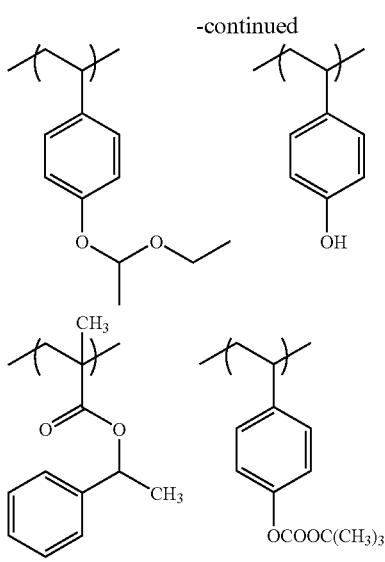

When KrF excimer laser, electron beam, X ray or high energy light beam (EUV) having a wavelength of 50 nm or less is irradiated to the positive photosensitive composition of the present invention, component (B) preferably comprises a hydroxystyrene/hydroxystyrene copolymer protected by a group capable of decomposing by an acid or a hydroxystyrene/(meth)acrylilic acid tertiary alkylester copolymer.

Specific examples thereof are shown below. However, the present invention is not limited thereto.

(R-1)

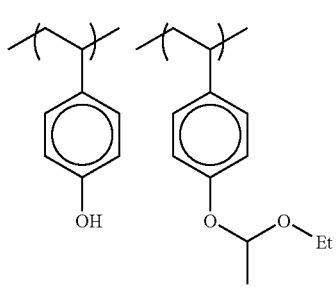

(R-2)

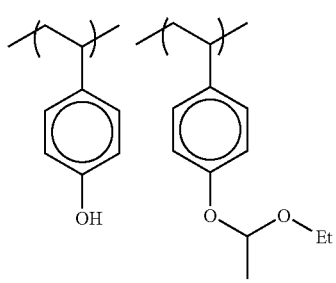

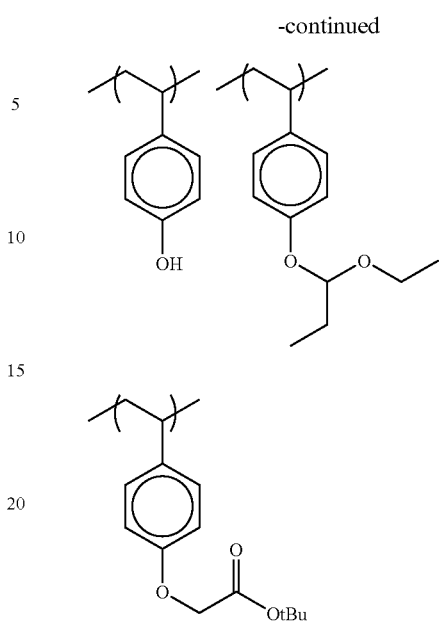

(R-3)

(R-4)

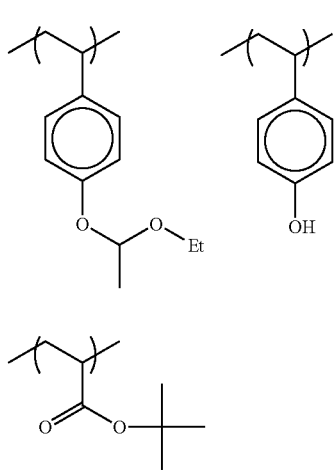

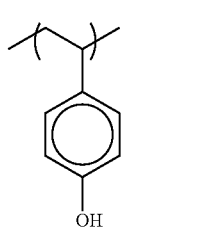

(R-5)

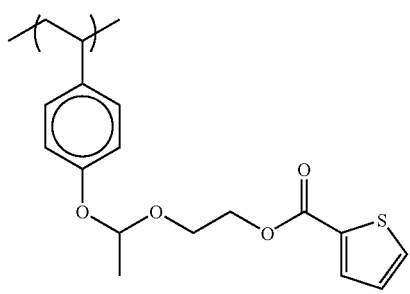

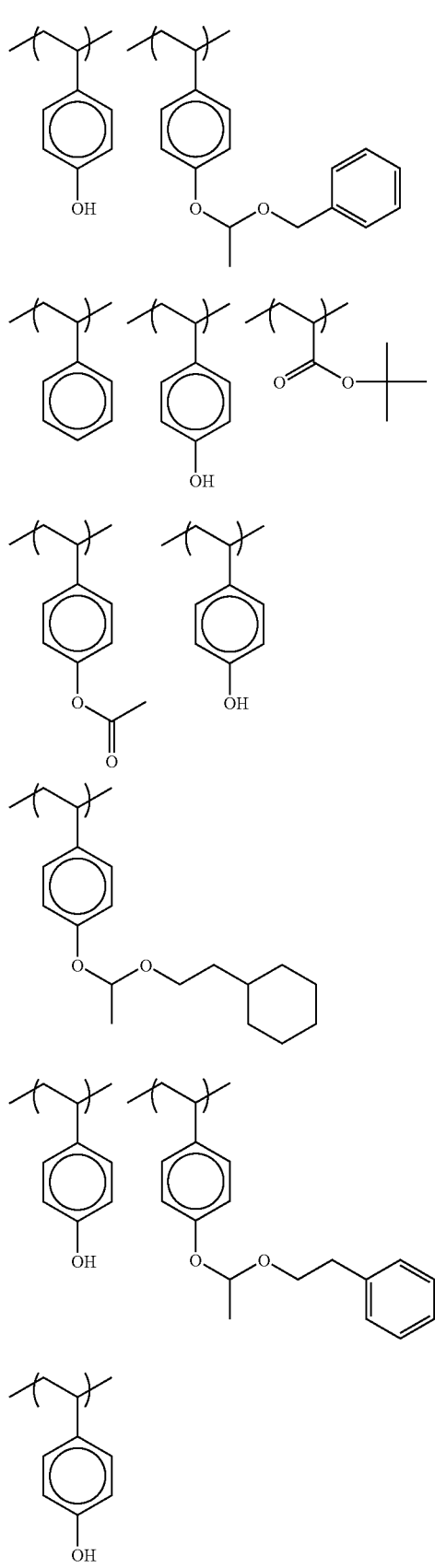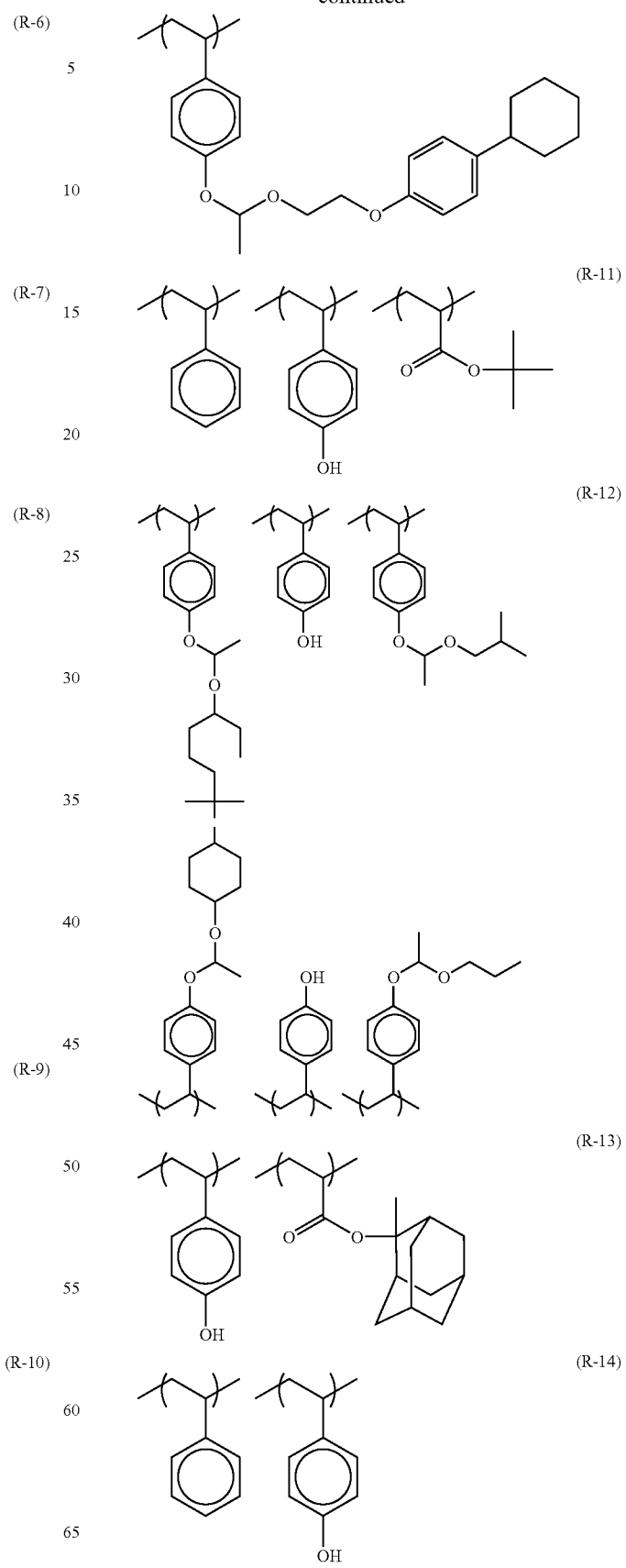

-continued

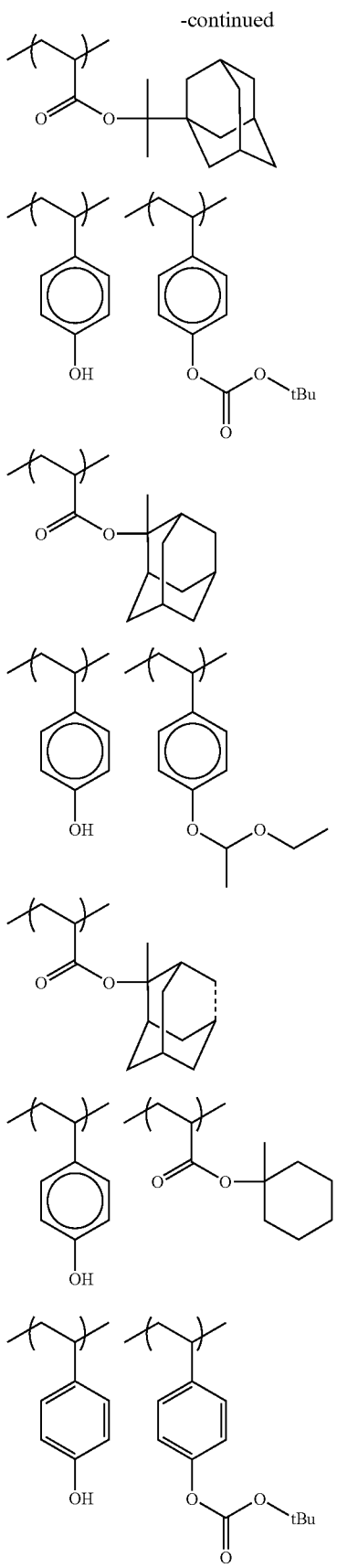

(R-15)

(R-16)

(R-17)

(R-18)

In the above specific examples, tBu represents t-butyl group.

The content of the group capable of decomposing by an acid is expressed by B/(B+S) using the number (B) of groups capable of decomposing by an acid in the resin and the number (S) of alkali-soluble groups not protected by a group capable of decomposing by an acid. The content is preferably from 0.01 to 0.7, more preferably from 0.05 to 0.50, still more preferably from 0.05 to 0.40.

[4] (D) Alkali-soluble Compound

The resist composition of the present invention uses (D) an alkali-soluble compound instead of (B) a compound of which solubility in an alkali developer increases under the action of an acid so that it can be also used in a negative resist composition.

The alkali-soluble compound is preferably an alkali-soluble resin.

The alkali dissolution rate of the alkali-soluble resin is preferably 20 Å/sec or more, more preferably 200 Å/sec or more, as measured (at 23° C.) in 0.261N tetramethylammonium hydroxide (TMAH).

Examples of the alkali-soluble resin include, but are not limited to, a novolak resin, a hydrogenated novolak resin, an acetone-pyrogallol resin, an o-polyhydroxystyrene, an m-polyhydroxystyrene, a p-polyhydroxystyrene, a hydrogenated polyhydroxystyrene, a halogen- or alkyl-substituted polyhydroxystyrene, a hydroxystyrene-N-substituted maleimide copolymer, an o/p- or m/p-hydroxystyrene copolymer, a polyhydroxystyrene with the hydroxyl group being partially O-alkylated (for example, O-methylated, O-(1-methoxy)ethylated, O-(1-ethoxy)ethylated, O-2-tetrahydropyranylated or O-(tert-butoxycarbonyl)methylated at a percentage of 5 to 30 mol %) or O-acylated product (for example, O-acetylated or O-(tert-butoxy)carbonylated at a percentage of 5 to 30 mol %), a styrene-maleic anhydride copolymer, a styrene-hydroxystyrene copolymer, an α-methylstyrene-hydroxystyrene copolymer, a carboxy group-containing methacrylic resin and a derivative thereof, and a polyvinyl alcohol derivative.

Among these alkali-soluble resins, preferred are a novolak resin, an o-polyhydroxystyrene, an m-polyhydroxystyrene, a p-polyhydroxystyrene, a copolymer thereof, an alkyl-substituted polyhydroxystyrene, a partially O-alkylated or partially O-acylated polyhydroxystyrene, a styrene-hydroxystyrene copolymer, and an α-methylstyrenehydroxystyrene copolymer.

The above-described novolak resin can be obtained by subjecting a predetermined monomer as the main component to addition condensation with aldehydes in the presence of an acidic catalyst.

The weight average molecular weight of the alkali-soluble resin is 2,000 or more, preferably from 5,000 to 200,000, more preferably from 5,000 to 100,000.

The weight average molecular weight here is defined as a polystyrene-reduced value determined by gel permeation chromatography.

As for the alkali-soluble resin, two or more species may be used in combination.

The amount of the alkali-soluble resin used is from 40 to 97 wt %, preferably from 60 to 90 wt %, based on the solid content of the entire resist composition.

[5] (E) Acid-crosslinking Agent Capable of Crosslinking the Alkali-soluble Compound Under the Action of an Acid When the resist composition of the present invention is used in a negative resist, (E) an acid-crosslinking agent capable of crosslinking the alkali-soluble compound under the action of an acid is used.

As for the acid-crosslinking agent, any compound may be used as long as it can crosslink the alkali-soluble compound under the action of an acid, but the following (1) to (3) are preferred:

(1) a hydroxymethyl, alkoxymethyl or acyloxymethyl form of a phenol derivative, (2) a compound having an N-hydroxymethyl group, an N-alkoxymethyl group or an N-acyloxymethyl group, and (3) a compound having an epoxy group.

The carbon number of the alkoxymethyl group is preferably 6 or less, and the carbon number of the acyloxymethyl group is preferably 6 or less.

Among these acid-crosslinking agents, particularly preferred compounds are set forth below.

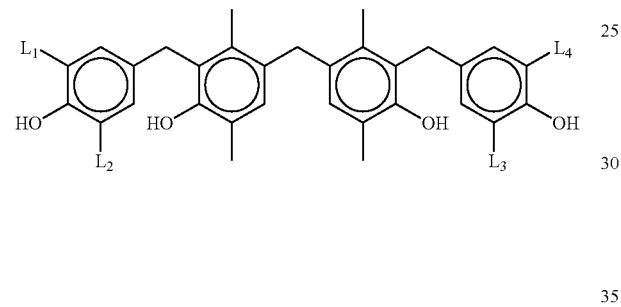

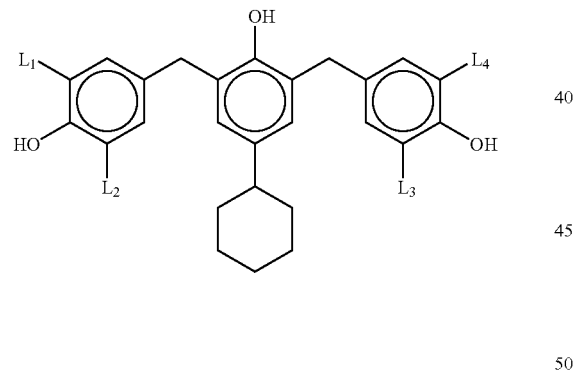

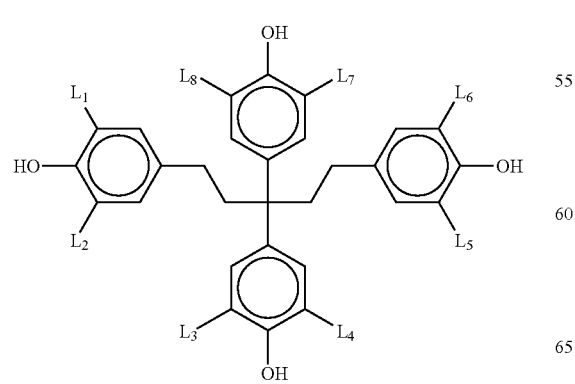

-continued

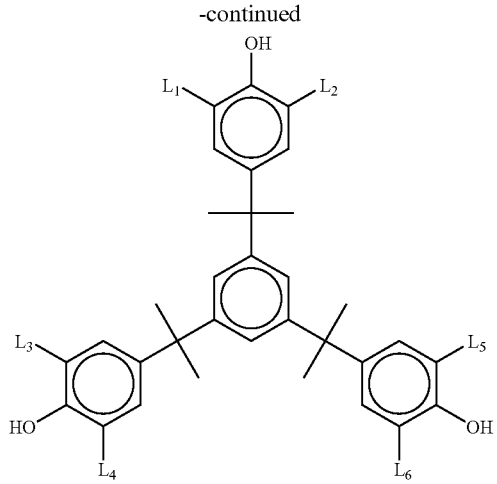

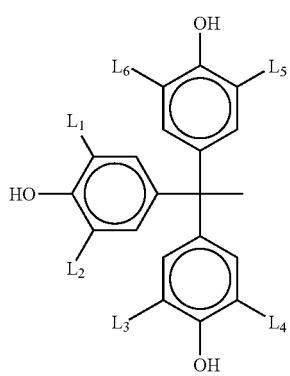

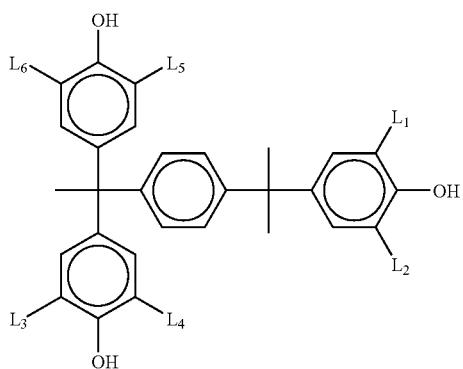

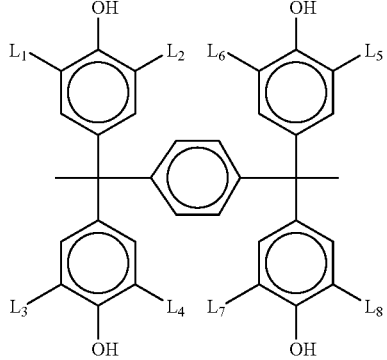

-continued

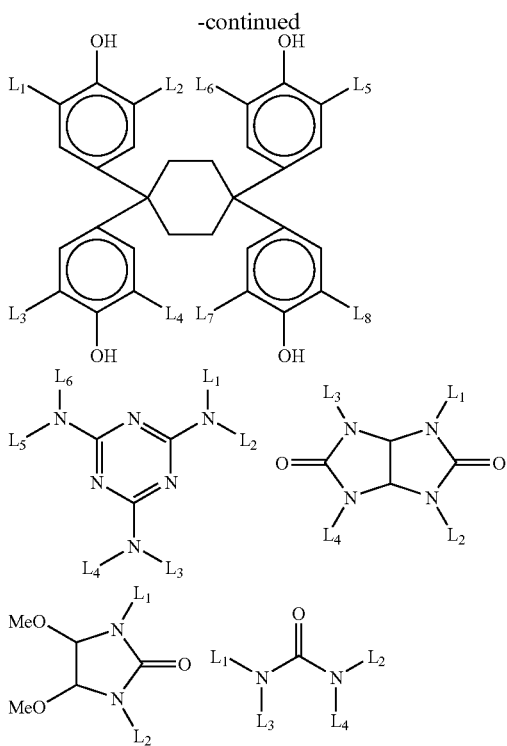

In the formulae, $L_1$ to $L_8$, which may be the same or different, each represents a hydrogen atom, a hydroxymethyl group, a methoxymethyl group, an ethoxymethyl group or an alkyl group having a carbon number of 1 to 6.

The acid-crosslinking agent is usually used in an amount of 3 to 70 mass %, preferably from 5 to 50 mass %, based on the solid content of the negative resist composition.

[6] Other Components Used in the Resist Composition of the Present Invention

The resist composition of the present invention may further contain a radical generator, a nitrogen-containing basic compound, a dye, a surfactant and the like, if desired.

(6)-1 Nitrogen-containing Basic Compound

The resist composition of the present invention may further contain a nitrogen-containing basic compound in addition to the nitrogen-containing compound (C).

The nitrogen-containing basic compound for use in the present invention is preferably a nitrogen-containing basic compound having basicity stronger than that of phenol.

The preferred chemical environment thereof includes structures of the following formulae (A) to (E).

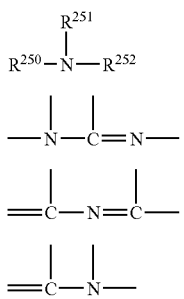

-continued

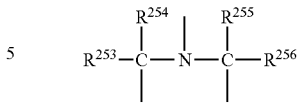

In the formulae, $R^{250}$, $R^{251}$ and $R^{252}$, which may be the same or different, each represents a hydrogen atom, an alkyl group having a carbon number of 1 to 20, a cycloalkyl group having a carbon number of 3 to 20 or an aryl group having a carbon number of 6 to 20. The alkyl group, cycloalkyl group and aryl group each may be substituted by an amino group, a hydroxyl group or the like. $R^{251}$ and $R^{252}$ may combine with each other to form a ring.

$R^{253}$, $R^{254}$, $R^{255}$ and $R^{256}$, which may be the same or different, each represents an alkyl group having a carbon number of 1 to 6.

The compound is more preferably a nitrogen-containing basic compound having two or more nitrogen atoms differing in the chemical environment within one molecule, still more preferably a compound containing both a substituted or unsubstituted amino group and a nitrogen atom-containing ring structure, or a compound having an alkylamino group.

Specific preferred examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, an imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

More preferred examples of the compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

The amount of the nitrogen-containing basic compound used is usually from 0.001 to 10 mass %, preferably from 0.01 to 5 mass %, based on the solid content of the resist composition. The amount is preferably 0.001 mass % or more for obtaining a sufficiently high addition effect and is preferably 10 mass % or less in view of sensitivity and developability of the unexposed area.

One of these nitrogen-containing basic compounds may be used alone, or two or more species thereof may be used in combination.

(6)-2 Dye

The suitable dye includes an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industries Co., Ltd.), Crystal Violet (CI42555), Methyl Violet (CI42535), Rhodamine B (CI45170B), Malachite Green (CI42000) and Methylene Blue (CI52015).

(6)-3 Solvents

The composition of the present invention is dissolved in a solvent capable of dissolving respective components described above and then coated on a support. Preferred examples of the solvent used here include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. One of these solvents is used alone, or several species thereof are mixed and used.

(6)-4 Surfactants

The resist composition of the present invention preferably contains a surfactant.

Specific examples of the surfactant which can be used include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethyleneepolyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); a fluorine-containing surfactant such as EFtop EF301, EF303 and EF352 (produced by Shin-Akita Chemical Co., Ltd.), Megafac F171 and F173 (produced by Dainippon Ink & Chemicals, Inc.), Florad FC430 and FC431 (produced by Sumitomo 3M Inc.), Asahiguard AG710, Surflon S-382, SC101, SC102, SC103, SC104, SC105 and SC106 (produced by Asahi Glass Co., Ltd.); Troysol S-366 (produced by Troy Chemical Industries, Inc.); Organosiloxane Polymer KP-341 (produced by Shin-Etsu Chemical Co., Ltd.); and acrylic acid-based or methacrylic acid-based (co)polymers, Polyflow No. 75 and No. 95 (produced by Kyoeisha Yushi Kagaku Kogyo Co., Ltd.).

The amount of the surfactant blended is usually 2 parts by weight or less, preferably 1 part by weight or less, per 100 parts by weight of the solid content in the composition of the present invention.

One of these surfactants may be used alone or several species thereof may be added in combination.

In the production or the like of a precision integrated circuit device, the step of forming a pattern on a resist film is performed by coating the resist composition of the present invention on a substrate (for example, a silicon/silicon dioxide-coated transparent substrate such as glass substrate and ITO substrate), irradiating thereon actinic rays or radiation, and then subjecting the resist film to heating, development, rinsing and drying, whereby a good resist pattern can be formed. Preferred examples of the actinic rays or radiation include electron beam, X-ray and light at a wavelength of 150 to 250 nm (e.g., KrF excimer laser (248 nm), ArF excimer laser (193 nm), F2 excimer laser (157 nm)). Among these, electron beam and KrF excimer laser are more preferred.

Upon irradiation with actinic rays or radiation, a liquid having a higher refractive index (liquid impregnation medium) than that of air may be filled between a resist film and a lens to effect exposure (liquid impregnation exposure). According to such exposure, resolution can be elevated. As a liquid impregnation medium to be used, any liquid having a higher refractive index than that of air can be used. However, pure water is preferable.

When a resist film comprising the positive resist composition of the present invention is exposed via a liquid impregnation medium, a hydrophobic resin (HR) can be optionally added. The hydrophobic resin (HR) added is localized over a resist film surface layer. Thus, when a liquid impregnation medium is water, a backward contact angle of the resist film surface is improved so that the dependency of water impregnation may be improved. Any hydrophobic resin (HR) can be used as long as they can improve a backward contact angle over the film surface. However, the resin preferably comprises at least one of a fluorine atom and a silicon atom. A backward contact angle of a resist film is preferably 60 to 90°, more preferably 70° or more. An amount of the hydrophobic resin to be added can be optionally controlled so that a backward contact angle of a resist film may reside in the foregoing range. The amount of the resin is preferably from 0.1 to 10 mass %, more preferably from 0.1 to 5 mass % based on the total solid content of the positive resist composition. A hydrophobic resin (HR) is localized in the interface as described above. However, different from a surfactant, it does not necessarily have a hydrophilic group in the molecular and is not required to contribute to uniform mixing of a polar/nonpolar material.

A fluorine atom or a silicon atom in a hydrophobic resin (HR) may be present either in the main chain or in the side chain by substituting therewith.

A hydrophobic resin (HR) is preferably one wherein its partial structure containing a fluorine atom is an alkyl group having a fluorine atom, a cycloalkyl group having a fluorine atom or an aryl group having a fluorine atom.

The alkyl group having a fluorine atom (a carbon number of preferably 1 to 10, more preferably 1 to 4) is a linear or branched alkyl group wherein at least one hydrogen atom is substituted with a fluorine atom, and may further have other substituents.

The cycloalkyl group having a fluorine atom is a monocyclic or polycyclic alkyl group wherein at least one hydrogen atom is substituted with a fluorine atom, and may further have other substituents.

As the aryl group having a fluorine atom, mention may be made of aryl groups such as a phenyl group and a naphthyl group wherein at least one hydrogen atom is substituted with a fluorine atom, and the aryl group may further have other substituents.

Specific examples of the repeating unit having at least one fluorine atom are shown below. However, the present invention is not limited thereto.
In these specific examples, $X_1$ represents a hydrogen atom, $CH_3$, —F or $CF_3$; $X_2$ represents —F or $CF_3$.
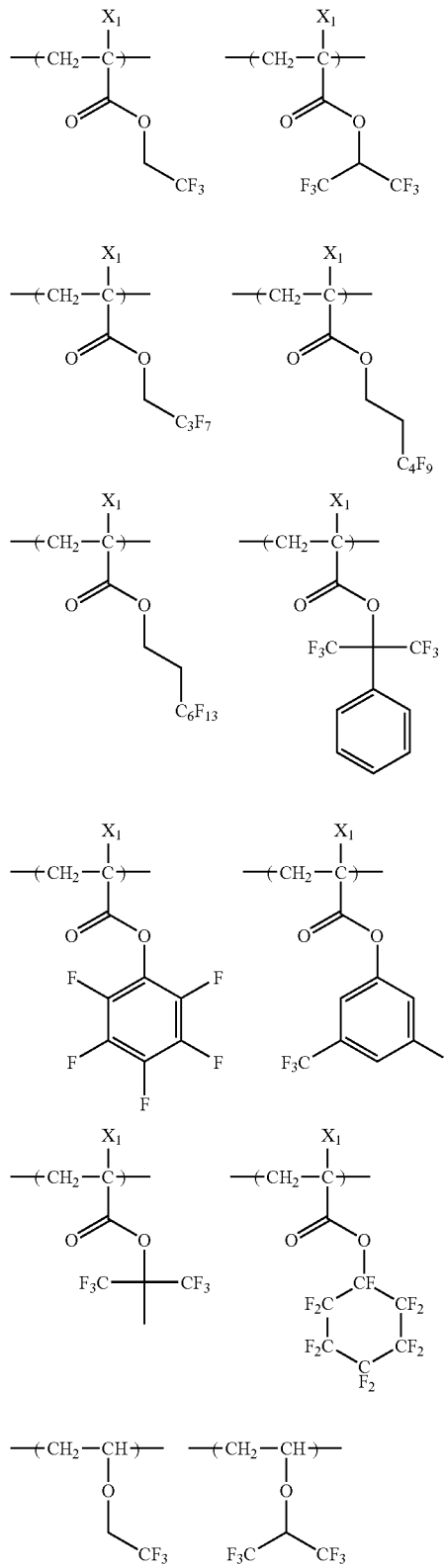
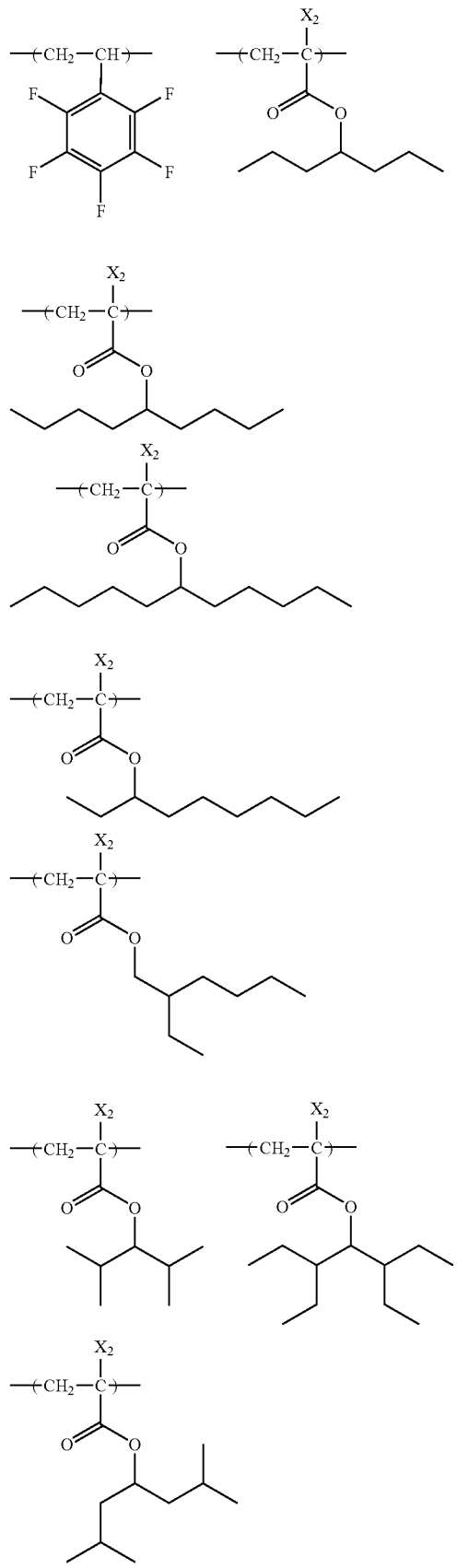
-continued

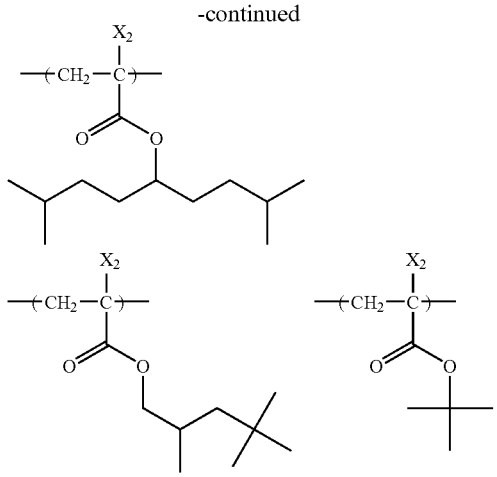

A hydrophobic resin (HR) is preferably a resin having, as a partial structure having at least one silicon atom, an alkylsilyl structure (preferably trialkylsilyl group) or a cyclic siloxane structure.

As the alkylsilyl structure or the cyclic siloxane structure, specifically mention may be made of groups represented by formulae (CS-1) to (CS-3).

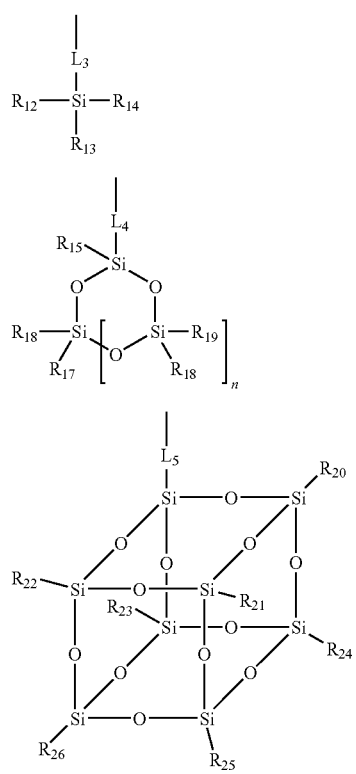

In formulae (CS-1) to (CS-3), $R_{12}$ to $R_{26}$ are preferably each independently a linear or branched alkyl group preferably having a carbon number of 1 to 20 or a cycloalkyl group preferably having a carbon number of 3 to 20.

$L_3$ to $L_5$ represents a single bond or a divalent linking group. As the divalent linking group, an alkylene group, a phenyl group, an ether group, a thioether group, a carbonyl group, an ester group, an amide group, a urethane group or a urea group can be used alone or in any combination of two or more thereof.

Specific examples of the repeating unit having at least one silicon atom are shown below. However, the present invention is not limited thereto.

In these specific examples, $X_1$ represents a hydrogen atom, $CH_3$, —F or $CF_3$.

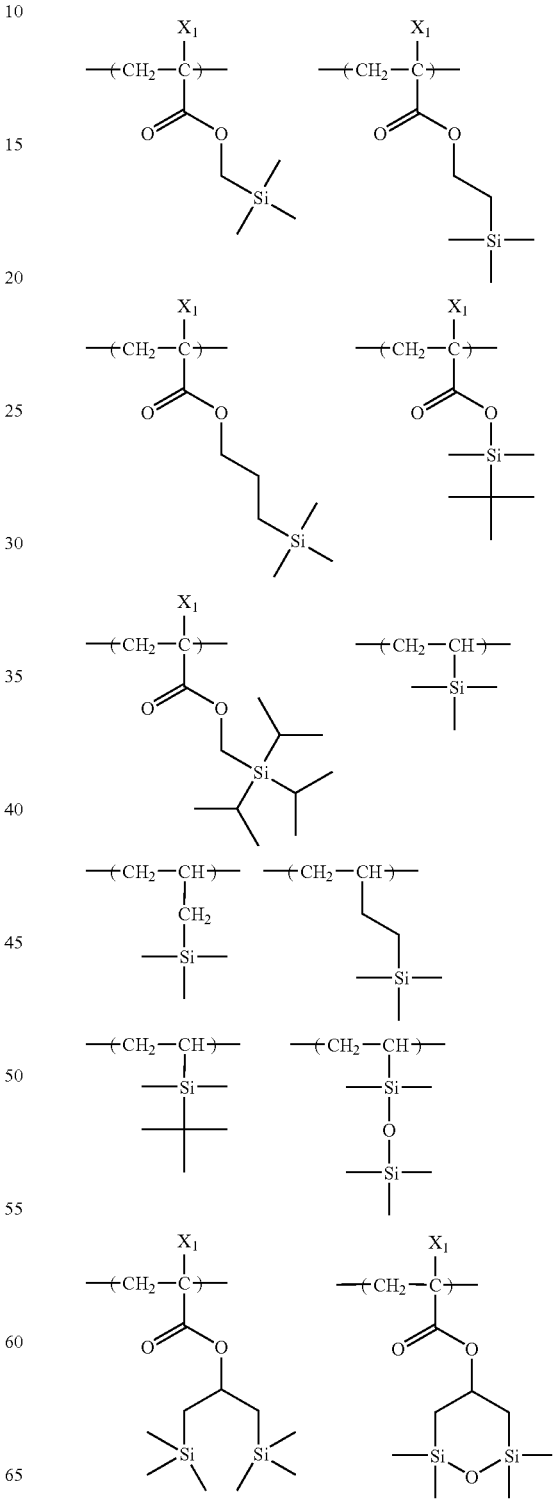

-continued

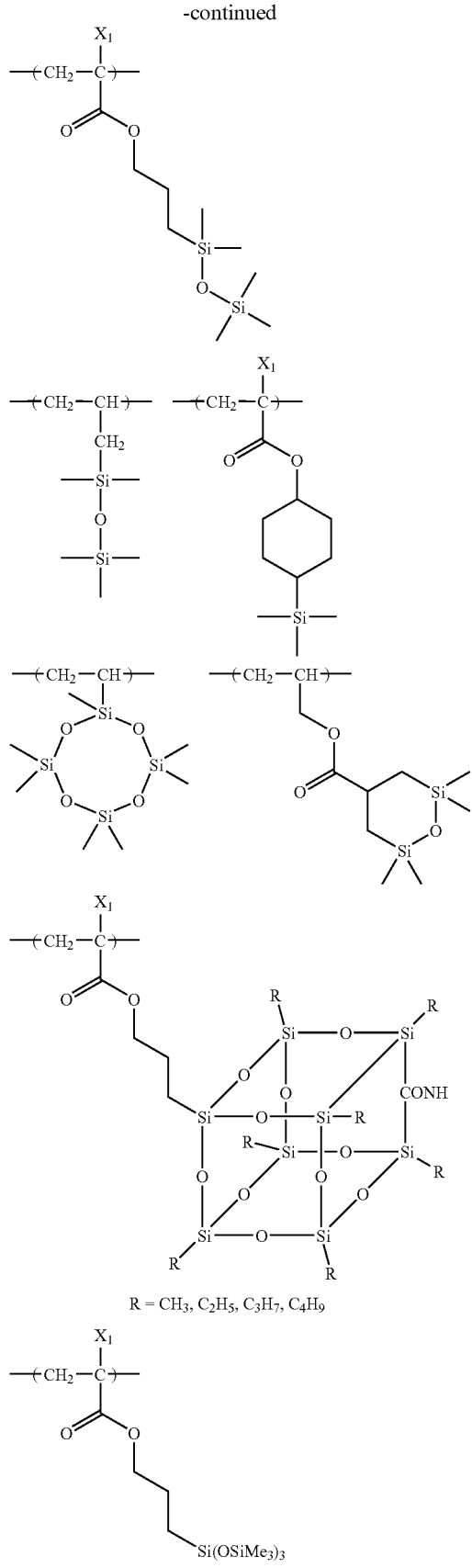

The hydrophobic resin (HR) may further comprise a repeating unit having at least one alkali-soluble group.

As the alkali-soluble group, mention may be made of a phenolic hydroxyl group, a carboxylic group, a fluorinated alcohol group, a sulfonic group, a sulfonamide group, a sulfonylimide group, a (alkylsulfonyl)(alkylcarbonyl)methylene group, a (alkylsulfonyl)(alkylcarbonyl)imide group, a bis(alkylcarbonyl)methylene group, a bis(alkylcarbonyl)imide group, a bis(alkylsulfoyl)methylene group, bis(alkylsulfonyl)imide group, a tris(alkylcarbonyl)methylene group, and a tris(alkylsulfonyl)methylene group.

Specific examples of the repeating unit having at least one alkali-soluble group are shown below. However, the present invention is not limited thereto.

In the formula, $R_x$ represents H, $CH_3$, $CF_3$ or $CH_2OH$

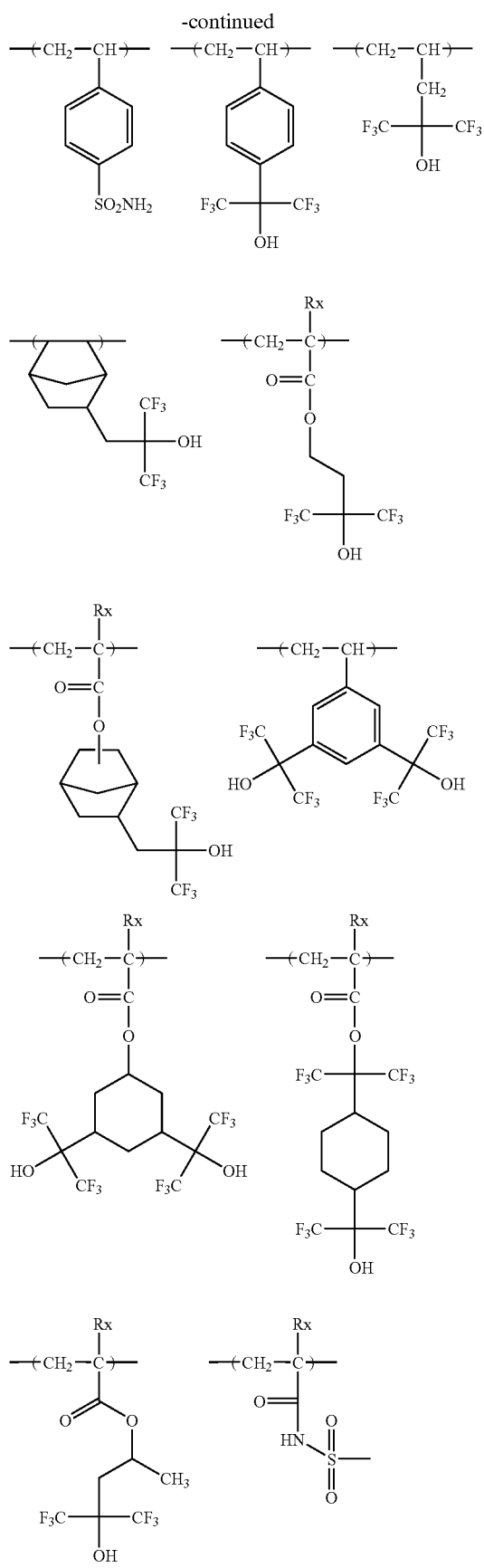
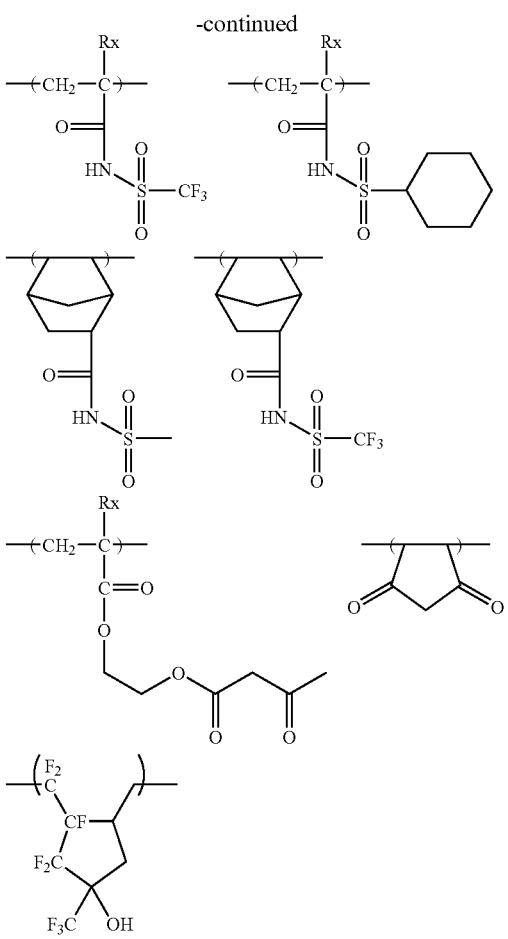

When a hydrophobic resin (HR) comprises a fluorine atom, the content of the fluorine atom is preferably from 5 to 80 mass %, more preferably from 10 to 80 mass %, based on the molecular weight of the hydrophobic resin (HR). A repeating unit containing a fluorine atom is included in a hydrophobic resin (HR) in an amount of preferably from 10 to 100 mass %, more preferably from 30 to 100 mass %.

When a hydrophobic resin (HR) comprises a silicon atom, the content of the silicon atom is preferably from 2 to 50 mass %, more preferably from 2 to 30 mass % based on the molecular weight of the hydrophobic resin (HR). A repeating unit containing a silicon atom is included in a hydrophobic resin (HR) in an amount of preferably from 10 to 100 mass %, more preferably from 20 to 100 mass %.

When a hydrophobic resin (HR) comprises an alkali-soluble group, a content of a repeating unit having an alkali-soluble group is preferably from 1 to 50 mol %, more preferably from 3 to 35 mol % and further preferably from 5 to 20 mol % based on the amount of all repeating units in a polymer.

The weight average molecular weight of a hydrophobic resin (HR) defined as a standard polystyrene-reduced value is preferably from 1,000 to 100,000, more preferably from 1,000 to 50,000, still more preferably from 2,000 to 15,000.

As a hydrophobic resin (HR), commercially available products can be used or those synthesized by radical polymerization can be used.

In the present invention, a commercially available inorganic or organic antireflection film may be used, if desired. Furthermore, the antireflection film may be used by coating it on the upper layer of resist.

The antireflection film used as the underlayer of resist may be either an inorganic film type such as titanium, titanium dioxide, titanium nitride, chromium oxide, carbon and amorphous silicon, or an organic film type comprising a light absorbent and a polymer material. The former requires equipment for the film formation, such as vacuum deposition apparatus, CVD apparatus and sputtering apparatus. Examples of the organic antireflection film include a film comprising a diphenylamine derivative/formaldehyde-modified melamine resin condensate, an alkali-soluble resin and a light absorbent described in JP-B-7-69611 (the term "JP-B" as used herein means an "examined Japanese patent publication"), a reaction product of a maleic anhydride copolymer and a diamine-type light absorbent described in U.S. Pat. No. 5,294,680, a film containing a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising a methylolmelamine and a benzophenone-based light absorbent described in JP-A-8-87115, and a film obtained by adding a low molecular light absorbent to a polyvinyl alcohol resin described in JP-A-8-179509.

As for the organic antireflection film, a commercially available organic antireflection film such as DUV-30 Series and DUV-40 Series produced by Brewer Science, Inc., and AR-2, AR-3 and AR-5 produced by Shipley Co., Ltd. may also be used.

The alkali developer which can be used for the positive resist composition of the present invention is an aqueous solution of alkalis such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimetylethanolamine, triethanolamine), quaternary ammonium salts (e.g., tetramethylammonium hydroxide, tetraethylammonium hydroxide, choline) and cyclic amines (e.g., pyrrole, piperidine). This aqueous solution of alkalis may be used after adding thereto alcohols such as isopropyl alcohol or a surfactant such as nonionic surfactant in an appropriate amount.

Among these developers, a quaternary ammonium salt is preferred, and tetramethylammonium hydroxide and choline are more preferred.

EXAMPLES

The present invention is described in greater detail below by referring to Examples, but the present invention should not be construed as being limited thereto.

Synthesis Example 1

Synthesis of Resin (B-21)

p-Acetoxystyrene (32.4 g (0.2 mol)) and 7.01 g (0.07 mol) of tert-butyl methacrylate were dissolved in 120 ml of butyl acetate and in a nitrogen stream, 0.033 g of azobisisobutyronitrile (AIBN) was added thereto with stirring at 80° C. three times every 2.5 hours. The stirring was further continued for 5 hours, thereby performing the polymerization reaction. The reaction solution was poured in 1,200 ml of hexane to precipitate a white resin, and the obtained resin was dried and then dissolved in 200 ml of methanol.

Subsequently, an aqueous solution containing 7.7 g (0.19 mol) of sodium hydroxide/50 ml of water was added thereto, and the resulting solution was refluxed under heating for 1 hour, thereby effecting hydrolysis. This reaction solution was diluted by adding 200 ml of water and neutralized with hydrochloric acid to precipitate a white resin. The precipitated resin was separated by filtration, washed with water, dried and further dissolved in 200 ml of tetrahydrofuran, and the resulting solution was added dropwise in 5 L of ultrapure water with vigorous stirring, thereby effecting reprecipitation. This reprecipitation operation was repeated three times. The obtained resin was dried in a vacuum drier at 120° C. for 12 hours to obtain a poly(p-hydroxystyrene/tert-butyl methacrylate) copolymer.

Synthesis Example 2

Synthesis of Resin (B-3)

Poly(p-hydroxystyrene) (VP-8000, produced by Nippon Soda Co., Ltd.) (10 g) was dissolved in 50 ml of pyridine and thereto, 3.63 g of di-tert-butyl dicarbonate was added dropwise at room temperature with stirring.

The resulting solution was stirred at room temperature for 3 hours and then added dropwise to a solution containing 1 L of ion exchanged water/20 g of concentrated hydrochloric acid. The powder precipitated was collected by filtration, washed with water and dried to obtain Resin (B-3).

Synthesis Example 3

Synthesis of Resin (B-32)

p-Cyclohexylphenol (83.1 g (0.5 mol)) was dissolved in 300 ml of toluene and subsequently, 150 g of 2-chloroethyl vinyl ether, 25 g of sodium hydroxide, 5 g of tetrabutylammonium bromide and 60 g of triethylamine were added and reacted at 120° C. for 5 hours. The reaction solution was washed with water, excess chloroethyl vinyl ether and toluene were distilled off, and the obtained oil was purified by distillation under reduced pressure to obtain 4-cyclohexylphenoxyethyl vinyl ether.

Thereafter, 20 g of poly(p-hydroxystyrene) (VP-8000, produced by Nippon Soda Co. Ltd.) and 6.5 g of 4-cyclohexylphenoxyethyl vinyl ether were dissolved in 80 ml of THF and thereto, 0.01 g of p-toluenesulfonic acid was added and reacted at room temperature for 18 hours. The reaction solution was added dropwise to 5 L of distilled water with vigorous stirring and the powder precipitated was filtered and dried, as a result, Resin (B-32) was obtained.

Other resins were synthesized by the same method. The weight average molecular weight and the molar ratio of repeating units of each of the resins used in Examples are as follows.

| Resin | Weight Average Molecular Weight | Molar Ratio* of Repeating Units |
| --- | --- | --- |
| (B-2) | 7500 | 30/70 |
| (B-3) | 8500 | 25/75 |
| (B-4) | 8500 | 25/75 |
| (B-5) | 13500 | 40/60 |
| (B-13) | 8000 | 65/35 |
| (B-21) | 12000 | 65/35 |
| (B-22) | 15000 | 20/80 |

-continued

| Resin | Weight Average Molecular Weight | Molar Ratio* of Repeating Units |
|---|---|---|
| (B-24) | 14000 | 30/70 |
| (B-25) | 10000 | 27/73 |
| (B-26) | 11500 | 15/60/25 |
| (B-28) | 15000 | 78/22 |
| (B-30) | 8000 | 80/20 |
| (B-31) | 15000 | 65/10/25 |
| (B-32) | 12000 | 82/18 |
| (B-33) | 12000 | 15/75/10 |
| (B-37) | 6000 | 20/70/10 |
| (B-38) | 7000 | 65/25/10 |
| (B-39) | 8000 | 70/20/10 |
| (B-40) | 6500 | 65/20/15 |
| (B-41) | 7000 | 65/15/20 |
| (B-43) | 6500 | 70/20/10 |
| (B-45) | 8000 | 10/70/20 |
| (B-47) | 9000 | 70/30 |
| (B-48) | 10000 | 10/70/20 |
| (B-50) | 9000 | 70/20/10 |

*Repeating units in parentheses from the left of each resin structure shown above.

<Evaluation of Resolving Power and Line Edge Roughness with Electron Beam>

Example 1

| (1) Coating of Resist | |
|---|---|
| (Component A): Acid Generator (A-2) | 0.05 g |
| (Component B): Resin (B-21) | 0.94 g |

These components were dissolved in 8.5 g of propylene glycol monomethyl ether acetate, 0.1 g of (C1-1) was added thereto as the component C, and furthermore, 0.005 g of 1,5-diazabicyclo[4.3.0]-5-nonene (hereinafter simply referred to as "D-1") and 0.001 g of Megafac F176 (produced by Dainippon Ink & Chemicals, Inc., hereinafter simply referred to as "W-1") as the surfactant were added and dissolved. The obtained solution was microfiltered through a membrane filter having a pore size of 0.1 µm to obtain a resist solution.

This resist solution was coated on a 6-inch silicon wafer by using a spin coater, Mark 8, manufactured by Tokyo Electron Ltd. and then baked at 110° C. for 90 seconds to obtain a uniform film having a thickness of 0.30 µm.

(2) Formation and Evaluation of Resist Pattern

The thus-formed resist film was irradiated with electron beams by using an electron beam image-drawing apparatus (HL750, manufactured by Hitachi, Ltd., acceleration voltage: 50 KeV). After the irradiation, the resist film was baked at 110° C. for 90 seconds, dipped in an aqueous 2.38 mass % tetramethylammonium hydroxide (TMAH) solution for 60 seconds, rinsed with water for 30 seconds and dried. The obtained pattern was evaluated by the following methods.

(2-1) Resolving Power

The cross-sectional profile of the pattern obtained was observed by a scanning electron microscope. The minimum irradiation energy when resolving a 0.20 µm-line (line: space=1:1) was used as the sensitivity.

The limiting resolving power (where the line and space were separated and resolved) at the irradiation dose giving the above-described sensitivity was used as the resolving power.

(2-2) Line Edge Roughness:

With respect to the region of 5 µm-edge in the longitudinal direction of the line pattern, the distance from a reference line where the edge should be present was measured at 30 points by a length-measuring SEM (S-8840, manufactured by Hitachi, Ltd.) and after determining the standard deviation, 3σ was calculated. As the value is smaller, the performance is better.

The results of Example 1 were good, that is, the resolving power was 0.100 µm and the edge roughness was 8.5 nm.

Examples 2 to 25, Examples 56 to 60 and Comparative Example 1

Using the compounds shown in Table 1, the coating of resist and the evaluation in electron beam exposure were performed thoroughly in the same manner as in Example 1. The evaluation results are shown in Table 1.

The components shown in Tables 2 and 3 below were dissolved in 8.5 g of propylene glycol monomethyl ether acetate to prepare a solution, and the obtained solution was micro-filtered through a membrane filter having a pore size of 0.1 µm to obtain a resist solution. Using the resist solution obtained, the coating of resist and the evaluation in electron beam exposure were performed in the same manner as in Example 1. The evaluation results are shown in Tables 2 and 3.

Other compounds used in Tables 1 and 3 are shown below.
Nitrogen-Containing Basic Compound (D-2): 2-phenylbenzimidazole
Nitrogen-Containing Basic Compound (D-3): dicyclohexylmethylamine
Nitrogen-Containing Basic Compound (D-4): tributylamine
Nitrogen-Containing Basic Compound (D-5): triethanolamine
Surfactant (W-2): Polysiloxane Polymer KP-341 (produced by Shin-Etsu Chemical Co., Ltd.)

TABLE 1

| | Component A | Component B | Component C | Other Nitrogen-Containing Basic Compounds | Surfactant | Resolving Power (µm) | Line Edge Roughness (nm) |
|---|---|---|---|---|---|---|---|
| Example 1 | A-2 | B-21 | C1-1 | D-1 | W-1 | 0.100 | 8.5 |
| Example 2 | A-16 | B-3 | C1-2 | D-2 | W-1 | 0.095 | 9.5 |
| Example 3 | A-12 | B-26 | C1-5 | none | W-2 | 0.090 | 10.0 |
| Example 4 | A-17 | B-28 | C1-4 | D-1 | W-1 | 0.095 | 8.8 |
| Example 5 | A-19 | B-30 | C1-7 | none | W-1 | 0.100 | 9.2 |
| Example 6 | A-27 | B-32 | C2-1 | D-3 | W-2 | 0.095 | 10.3 |
| Example 7 | A-42 | B-4 | C3-1 | none | W-1 | 0.100 | 9.0 |
| Example 8 | A-59 | B-26 | C2-4 | D-1 | W-2 | 0.095 | 8.5 |

TABLE 2

| | Component A | Component B | Component C (0.1 g) | Other Nitrogen-Containing Basic Compounds (0.005 g) | Surfactant (0.001 g) | Resolving Power (μm) | Line Edge Roughness (nm) |
|---|---|---|---|---|---|---|---|
| Example 9 | A-2 (0.05 g) | B-26 (0.64 g)<br>B-4 (0.30 g) | C1-8 | D-4 | W-1 | 0.095 | 8.5 |
| Example 10 | A-20 (0.05 g) | B-3 (0.60 g)<br>B-30 (0.34 g) | C1-9 | none | W-1 | 0.105 | 9.5 |
| Example 11 | A-17 (0.05 g) | B-32 (0.58 g)<br>B-28 (0.38 g) | C1-10 | D-5 | W-1 | 0.090 | 9.5 |
| Example 12 | A-16 (0.05 g) | B-3 (0.70 g)<br>B-30 (0.30 g) | C1-13 | none | W-1 | 0.105 | 9.0 |
| Example 13 | A-4 (0.05 g)<br>C-1 (0.005 g) | B-3 (0.94 g) | C1-11 | D-4 | W-2 | 0.105 | 10.2 |
| Example 14 | A-17 (0.05 g)<br>C-2 (0.005 g) | B-28 (0.94 g) | C1-18 | D-4 | W-1 | 0.090 | 10.8 |
| Example 15 | A-8 (0.05 g)<br>C-8 (0.005 g) | B-26 (0.94 g) | C1-19 | none | W-1 | 0.095 | 9.8 |
| Example 16 | A-16 (0.05 g)<br>C-9 (0.005 g) | B-37 (0.94 g) | C1-12 | D-5 | W-1 | 0.105 | 9.5 |
| Example 17 | A-82 (0.05 g) | B-38 (0.94 g) | C1-14 | D-4 | W-1 | 0.100 | 8.9 |
| Example 18 | C-2 (0.005 g)<br>A-58 (0.05 g) | B-40 (0.94 g) | C1-20 | D-4 | W-1 | 0.095 | 10.4 |
| Example 19 | A-2 (0.05 g)<br>A-57 (0.005 g) | B-3 (0.70 g)<br>B-30 (0.30 g) | C1-13 | D-5 | W-1 | 0.105 | 9.0 |
| Example 20 | A-2 (0.05 g)<br>C-1 (0.005 g) | B-41 (0.94 g) | C1-11 | D-4 | W-2 | 0.105 | 10.0 |
| Example 21 | A-2 (0.05 g)<br>C-2 (0.005 g) | B-43 (0.94 g) | C1-12 | D-1 | W-1 | 0.090 | 10.5 |
| Example 22 | A-2 (0.05 g)<br>A-83 (0.005 g) | B-45 (0.94 g) | C1-17 | none | W-1 | 0.095 | 9.8 |
| Example 23 | A-2 (0.05 g)<br>A-62 (0.05 g) | B-47 (0.94 g) | C1-11 | D-4 | W-1 | 0.100 | 9.5 |
| Example 24 | A-58 (0.05 g)<br>C-26 (0.02 g) | B-48 (0.94 g) | C1-20 | D-5 | W-1 | 0.095 | 10.6 |
| Example 25 | A-2 (0.05 g)<br>A-82 (0.005 g) | B-3 (0.70 g)<br>B-50 (0.30 g) | C1-12 | none | W-1 | 0.100 | 9.0 |
| Comparative Example 1 | A-2 (0.05 g) | B-26 (0.64 g)<br>B-4 (0.30 g) | triethylamine | D-4 | W-1 | 0.125 | 13.8 |

TABLE 3

| | Component A | Component B | Component C (0.1 g) | Other Nitrogen-Containing Basic Compounds (0.005 g) | Surfactant (0.001 g) | Resolving Power (μm) | Line Edge Roughness (nm) |
|---|---|---|---|---|---|---|---|
| Example 56 | A-2 (0.05 g) | B-51 (0.94 g) | C1-8 | D-4 | W-1 | 0.090 | 8.2 |
| Example 57 | A-2 (0.05 g) | B-52 (0.94 g) | C1-8 | none | W-1 | 0.095 | 8.5 |
| Example 58 | A-2 (0.05 g) | B-53 (0.94 g) | C1-20 | D-4 | W-1 | 0.090 | 8.2 |
| Example 59 | A-2 (0.05 g) | B-54 (0.94 g) | C1-20 | none | W-1 | 0.090 | 8.2 |
| Example 60 | A-2 (0.05 g) | B-55 (0.94 g) | C1-17 | D-4 | W-1 | 0.095 | 8.5 |

Structures of resins (B-51) to (B-56) in Table 3 are shown below.

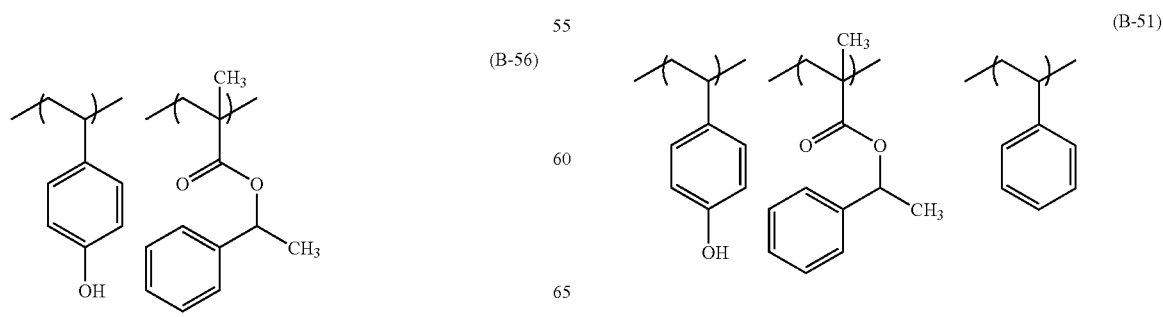

-continued

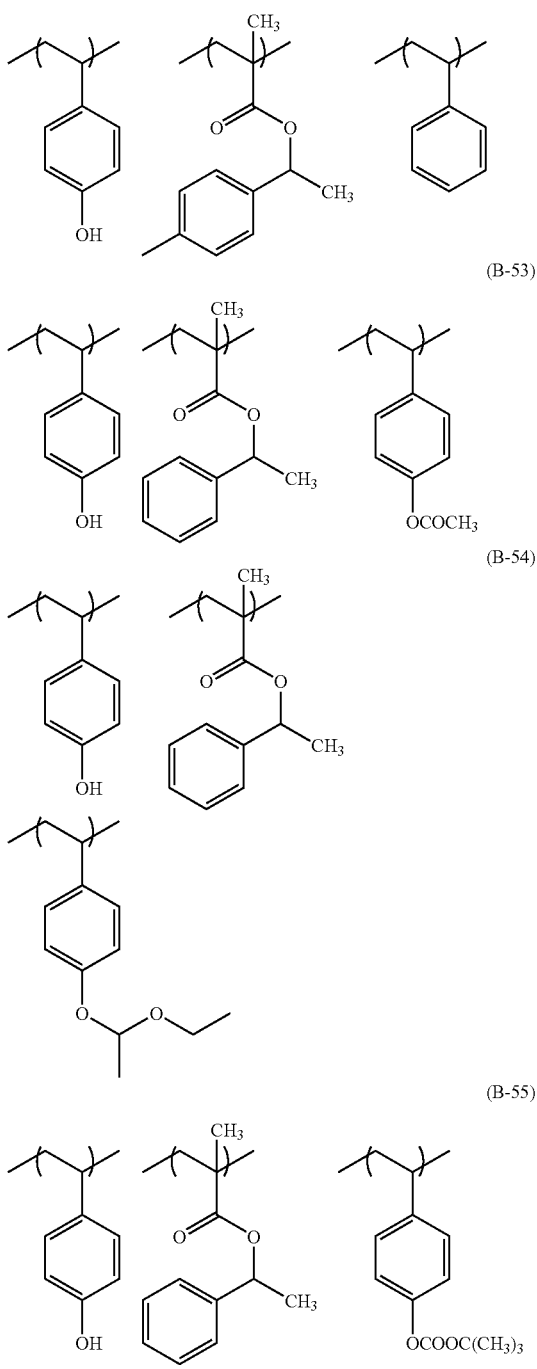

In Table 4 below, compositions of repeating units (molar ratio corresponds to each of the repeating units starting from the left), weight average molecular weights and dispersion degrees of the resins (B-51) to (B-56) are shown.

TABLE 4

| | Composition (molar ratio) | Weight Average Molecular Weight (Dispersion Degree) |
|---|---|---|
| (B-56) | 65/35 | 12000 (1.65) |
| (B-51) | 60/25/15 | 10000 (1.55) |
| (B-52) | 60/27/13 | 9000 (1.75) |

TABLE 4-continued

| | Composition (molar ratio) | Weight Average Molecular Weight (Dispersion Degree) |
|---|---|---|
| (B-53) | 60/27/13 | 13000 (1.05) |
| (B-54) | 60/24/16 | 10500 (1.20) |
| (B-55) | 60/25/15 | 10000 (1.15) |

It is apparent from the results in Tables 1 to 3 that as regards the irradiation with radiation, the positive resist composition of the present invention exhibits high resolving power and is excellent in the line edge roughness.

<Evaluation of Resolving Power with KrF>

The resist solutions of Examples 1 to 25, Examples 56 to 60 and Comparative Example 1 each was coated and baked in the same manner as in Example 1 to obtain a uniform film having a thickness of 0.30 µm.

The resist film obtained was pattern-exposed using a KrF excimer laser stepper (FPA-3000EX-5, manufactured by Canon Inc., wavelength: 248 nm). The processing after the exposure was performed in the same manner as in Example 1, and the resolving power was evaluated in the same manner as in Example 1. The evaluation results are shown in Tables 5 to 7 below.

<Evaluation of Sidelobe Margin with KrF>

On a silicon substrate treated with hexamethyldisilazane, an antireflection film, DUV-44, produced by Brewer Science, Inc. was uniformly coated to a thickness of 85 nm by a spin coater, dried at 100° C. for 90 seconds on a hot plate and further dried under heating at 200° C. for 240 seconds. Thereafter, the resist solutions of Examples 1 to 25 and Comparative Example 1 each was coated thereon by a spin coater and dried at 110° C. for 90 seconds to form a resist film of 0.40 µm. This resist film was exposed using a KrF excimer laser stepper through a halftone phase shift mask having a transmittance of 6% and immediately after the exposure, heated at 115° C. for 90 seconds on a hot plate. Thereafter, the resist film was developed with an aqueous 2.38 wt % tetramethylammonium hydroxide solution at 23° C. for 60 seconds, rinsed with pure water for 30 seconds and then dried to obtain a contact hole pattern.

A pattern produced by exposing a mask pattern having a hole size of 180 nm and a duty ratio of 1:2 was observed by a length-measuring SEM, S-9260, manufactured by Hitachi, Ltd. and assuming that the exposure amount reproducing a 140 nm contact hole is the optimal exposure amount Eopt and the exposure amount causing generation of sidelobe is Elimit, the sidelobe margin defined by the following formula was calculated. A larger value indicates higher sidelobe resistance.

Sidelobe Margin (%)=[(Elimit−Eopt)/Eopt]×100

The results are shown in Tables 5 to 7.

TABLE 5

| | Resolving Power (µm) | Sidelobe Margin |
|---|---|---|
| Example 1 | 0.150 | 1.40 |
| Example 2 | 0.155 | 1.45 |
| Example 3 | 0.165 | 1.35 |
| Example 4 | 0.150 | 1.40 |
| Example 5 | 0.150 | 1.35 |
| Example 6 | 0.165 | 1.45 |
| Example 7 | 0.160 | 1.35 |
| Example 8 | 0.165 | 1.40 |

TABLE 6

|  | Resolving Power (μm) | Sidelobe Margin |
|---|---|---|
| Example 9 | 0.155 | 1.40 |
| Example 10 | 0.160 | 1.45 |
| Example 11 | 0.165 | 1.40 |
| Example 12 | 0.150 | 1.40 |
| Example 13 | 0.155 | 1.35 |
| Example 14 | 0.155 | 1.45 |
| Example 15 | 0.160 | 1.35 |
| Example 16 | 0.160 | 1.40 |
| Example 17 | 0.170 | 1.40 |
| Example 18 | 0.170 | 1.50 |
| Example 19 | 0.160 | 1.45 |
| Example 20 | 0.165 | 1.35 |
| Example 21 | 0.150 | 1.40 |
| Example 22 | 0.155 | 1.35 |
| Example 23 | 0.155 | 1.45 |
| Example 24 | 0.160 | 1.35 |
| Example 25 | 0.170 | 1.40 |
| Comparative Example 1 | 0.180 | 1.15 |

TABLE 7

|  | Resolving Power (μm) | Sidelobe Margin |
|---|---|---|
| Example 56 | 0.155 | 1.4 |
| Example 57 | 0.150 | 1.45 |
| Example 58 | 0.155 | 1.45 |
| Example 59 | 0.150 | 1.45 |
| Example 60 | 0.155 | 1.40 |

It is apparent from Tables 5 to 7 that as regards the exposure with KrF excimer laser light, the positive resist composition of the present invention is excellent in the resolving power and sidelobe margin.

Synthesis Example 4

Synthesis of Resin (1)

A 8.6 g amount of cyclohexanon was placed into a three-necked flask under a nitrogen stream, and heated to 80° C. Then 9.8 g of 2-adamantylisopropyl methacrylate, 4.4 g of dihydroxyadamantyl methacrylate, 8.9 g of norbornanelactone methacrylate and a solution obtained by dissolving 8 mol % of polymerization initiator V-60 1 (produced by Wako Pure Chemical Industries) based on the amount of monomers in 79 g of cyclohexane were dropwise added thereto for 6 hours. After terminating the dropwise-addition, the resulting reaction mixture was further reacted at 80° C. for 2 hours. The reaction mixture was allowed to stand to be cooled, successively, a mixed solution of hexane 800 ml/ethyl acetate 200 ml was dropwise-added thereto for 20 minutes. The precipitated powder was separated by filtration and dried to obtain 19 g of resin (1). The weight average molecular weight of the resin obtained was 8800 in terms of a standard polystyrene-reduced value. The molecular weight distribution (Mw/Mn) thereof was 1.9.

Resins (2) to (25) were synthesized according to the same manner as that of Synthesis Example 4.

In the following Tables 8 to 10, are shown compositions of repeating units in respective resins (1) to (25) (molar ratio, corresponding to the structural formulae in the foregoing specific examples starting from the left), weight average molecular weights (Mw) and molecular weight distributions (dispersion degrees) (Mw/Mn).

TABLE 8

| Resin | Composition (molar ratio) | Mw | Mw/Mn |
|---|---|---|---|
| 1 | 50/10/40 | 8800 | 1.9 |
| 2 | 40/22/38 | 12000 | 2.0 |
| 3 | 34/33/33 | 11000 | 2.3 |
| 4 | 45/15/40 | 10500 | 2.1 |
| 5 | 30/25/45 | 8400 | 2.3 |
| 6 | 39/20/41 | 10500 | 2.1 |
| 7 | 49/10/41 | 9500 | 2.5 |
| 8 | 35/32/33 | 14000 | 2.6 |
| 9 | 40/20/35/5 | 12500 | 2.4 |
| 10 | 40/15/40/5 | 10000 | 1.8 |
| 11 | 40/15/40/5 | 9800 | 2.3 |
| 12 | 35/20/40/5 | 6100 | 2.3 |
| 13 | 50/50 | 5200 | 2.1 |
| 14 | 30/30/30/10 | 8600 | 2.5 |
| 15 | 40/20/35/5 | 12000 | 2.1 |

TABLE 9

| Resin | Composition (molar ratio) | Mw | Mw/Mn |
|---|---|---|---|
| 16 | 30/20/40/10 | 8000 | 2.0 |
| 17 | 40/10/50 | 6000 | 1.8 |
| 18 | 30/20/40/10 | 8500 | 1.5 |

TABLE 10

| Resin | Composition (molar ratio) | Mw | Mw/Mn |
|---|---|---|---|
| 19 | 35/30/35 | 9800 | 1.8 |
| 20 | 30/40/30 | 9500 | 1.9 |
| 21 | 25/25/50 | 6700 | 2.0 |
| 22 | 50/25/25 | 12000 | 2.0 |
| 23 | 50/30/20 | 10000 | 2.0 |
| 24 | 40/20/20/10 | 6400 | 2.1 |
| 25 | 40/10/50 | 7700 | 2.0 |

Examples 26 to 40 and Comparative Example 2

<Formation or Resist>

Components shown in the following Table 11 were dissolved in a solvent to prepare a solution wherein each component has a solid concentration of 6 mass %. The resulting solution was filtered through 0.1 μm polyethylene filter to prepare a positive resist solution. The prepared positive resist composition was evaluated according to the following method. The results are shown in Table 11. Regarding respective components in Table 11, a ratio in the case of using plural number of components is by mass.

<Imaging Performance Test>

On silicon wafer was coated an organic antireflection film ARC29A (produced by Nissan Kagaku Co., Ltd.), followed by baking at 205° C. for 60 seconds to prepare 78 nm antireflective film. The positive resist composition prepared was coated thereon, followed by baking at 130° C. for 60 seconds to prepare a 250 nm-thick resist film. The wafer obtained was pattern-exposed using an ArF excimer laser scanner (produced by ASML Co., Ltd., PAS5500/1100, NAO. 75, σo/σi=0.85/0.55), followed by heating at 130° C. for 60 seconds. Successively, development was effected with an aqueous 2.38 mass % tetramethylammonium hydroxide (TMAH) solution for 30 seconds, rinsed with pure water and spin-dried to obtain a resist pattern. The obtained pattern was evaluated with regard to resolving power and line edge roughness according to the same manner as in Example 1.

TABLE 11

| | Component A | Component B | Component C (0.1 g) | Surfactant (0.001 g) | Resolving Power (μm) | Line Edge Roughness (nm) |
|---|---|---|---|---|---|---|
| Example 26 | A-2 (0.05 g) | (1) (0.94 g) | C1-8 | W-1 | 0.075 | 7.0 |
| Example 27 | A-2 (0.05 g) | (3) (0.94 g) | C1-9 | W-1 | 0.075 | 7.5 |
| Example 28 | A-2 (0.05 g) | (5) (0.94 g) | C1-10 | W-1 | 0.080 | 7.5 |
| Example 29 | A-2 (0.05 g) | (7) (0.94 g) | C1-13 | W-1 | 0.075 | 7.0 |
| Example 30 | A-4 (0.05 g) C-1 (0.005 g) | (9) (0.94 g) | C1-11 | W-2 | 0.075 | 7.5 |
| Example 31 | A-2 (0.05 g) C-2 (0.005 g) | (11) (0.94 g) | C1-18 | W-1 | 0.080 | 7.0 |
| Example 32 | A-55 (0.05 g) C-8 (0.005 g) | (13) (0.94 g) | C1-19 | W-1 | 0.080 | 7.5 |
| Example 33 | A-83 (0.05 g) C-9 (0.005 g) | (14) (0.94 g) | C1-12 | W-1 | 0.080 | 7.0 |
| Example 34 | A-82 (0.05 g) | (15) (0.94 g) | C1-14 | W-1 | 0.075 | 7.0 |
| Example 35 | C-2 (0.005 g) A-2 (0.05 g) | (17) (0.94 g) | C1-20 | W-1 | 0.075 | 7.5 |
| Example 36 | A-2 (0.05 g) A-57 (0.005 g) | (20) (0.94 g) | C1-13 | W-1 | 0.080 | 7.0 |
| Example 37 | A-2 (0.05 g) C-1 (0.005 g) | (21) (0.94 g) | C1-11 | W-2 | 0.075 | 7.5 |
| Example 38 | A-2 (0.05 g) C-2 (0.005 g) | (22) (0.94 g) | C1-12 | W-1 | 0.075 | 7.0 |
| Example 39 | A-2 (0.05 g) A-83 (0.005 g) | (23) (0.94 g) | C1-17 | W-1 | 0.080 | 7.5 |
| Example 40 | A-2 (0.05 g) A-62 (0.05 g) | (8) (0.94 g) | C1-11 | W-1 | 0.075 | 7.0 |
| Comp. Ex. 2 | A-2 (0.05 g) | (1) (0.94 g) | Triethylamine | W-1 | 0.095 | 9.5 |

From the results in Table 11, it can be seen that the resist composition of the present invention is excellent in resolving Power and line edge roughness in ArF resist.

Examples 41 to 55 and Comparative Example 3

<Formation or Resist>

Components shown in the following Table 12 were dissolved in a solvent to prepare a solution wherein each component has a solid concentration of 6 mass %. The resulting solution was filtered through 0.1 μm polyethylene filter to prepare a positive resist solution. The prepared positive resist composition was evaluated according to the following method. The results are shown in Table 12. Regarding respective components in Table 12, a ratio in the case of using plural number of components is by mass.

<Imaging Performance Test>

On silicon wafer was coated an organic antireflection film ARC29A (produced by Nissan Kagaku Co., Ltd.), followed by baking at 205° C. for 60 seconds to prepare 78 nm-thick antireflective film. The positive resist composition prepared was coated thereon, followed by baking at 130° C. for 60 seconds to prepare a 250 nm-thick resist film. The wafer obtained was pattern-exposed using an ArF excimer laser liquid impregnation scanner (NA0.85). As the liquid for liquid impregnation, pure water was used. Then, after heating at 130° C. for 60 second, development was effected with an aqueous 2.38 mass % tetramethylammonium hydroxide solution for 30 seconds, rinsed with pure water and spin-dried to obtain a resist pattern.

The obtained resist pattern was evaluated with regard to resolving Power and line edge roughness according to the same manner as in Example 1.

TABLE 12

| | Component A | Component B | Component C (0.1 g) | Surfactant (0.001 g) | Hydrophobic resin | Resolving Power (μm) | Line Edge Roughness (nm) |
|---|---|---|---|---|---|---|---|
| Example 41 | A-2 (0.05 g) | (1) (0.94 g) | C1-8 | W-1 | AD-1 (0.05 g) | 0.065 | 6.2 |
| Example 42 | A-2 (0.05 g) | (3) (0.94 g) | C1-9 | W-1 | AD-2 (0.05 g) | 0.065 | 6.0 |
| Example 43 | A-2 (0.05 g) | (5) (0.94 g) | C1-10 | W-1 | AD-3 (0.05 g) | 0.065 | 6.0 |
| Example 44 | A-2 (0.05 g) | (7) (0.94 g) | C1-13 | W-1 | AD-2 (0.05 g) | 0.070 | 6.2 |
| Example 45 | A-4 (0.05 g) C-1 (0.005 g) | (9) (0.94 g) | C1-11 | W-2 | AD-1 (0.05 g) | 0.065 | 6.3 |
| Example 46 | A-2 (0.05 g) C-2 (0.005 g) | (11) (0.94 g) | C1-18 | W-1 | AD-1 (0.05 g) | 0.075 | 6.0 |
| Example 47 | A-55 (0.05 g) C-8 (0.005 g) | (13) (0.94 g) | C1-19 | W-1 | AD-1 (0.05 g) | 0.065 | 6.2 |
| Example 48 | A-83 (0.05 g) C-9 (0.005 g) | (14) (0.94 g) | C1-12 | W-1 | AD-2 (0.05 g) | 0.070 | 6.4 |
| Example 49 | A-82 (0.05 g) | (15) (0.94 g) | C1-14 | W-1 | AD-1 (0.05 g) | 0.070 | 6.4 |

TABLE 12-continued

| | Component A | Component B | Component C (0.1 g) | Surfactant (0.001 g) | Hydrophobic resin | Resolving Power (μm) | Line Edge Roughness (nm) |
|---|---|---|---|---|---|---|---|
| Example 50 | C-2 (0.005 g) A-2 (0.05 g) | (17) (0.94 g) | C1-20 | W-1 | AD-1 (0.05 g) | 0.070 | 6.4 |
| Example 51 | A-2 (0.05 g) A-57 (0.005 g) | (20) (0.94 g) | C1-13 | W-1 | AD-3 (0.05 g) | 0.065 | 6.5 |
| Example 52 | A-2 (0.05 g) C-1 (0.005 g) | (21) (0.94 g) | C1-11 | W-2 | AD-1 (0.05 g) | 0.070 | 6.1 |
| Example 53 | A-2 (0.05 g) C-2 (0.005 g) | (22) (0.94 g) | C1-12 | W-1 | AD-1 (0.05 g) | 0.075 | 6.4 |
| Example 54 | A-2 (0.05 g) A-83 (0.005 g) | (23) (0.94 g) | C1-17 | W-1 | AD-2 (0.05 g) | 0.065 | 6.5 |
| Example 55 | A-2 (0.05 g) A-62 (0.05 g) | (8) (0.94 g) | C1-11 | W-1 | AD-1 (0.05 g) | 0.070 | 6.2 |
| Comp. Ex. 3 | A-2 (0.05 g) | (1) (0.94 g) | Triethylamine | W-1 | AD-1 (0.05 g) | 0.080 | 7.5 |

Abbreviations in the table are shown below.

AD-1

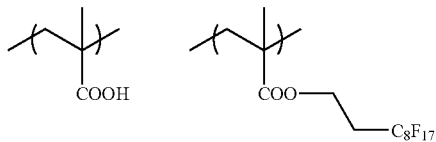

Molar ratio of repeating units 10/90
Weight average molecular weight 7000

AD-2

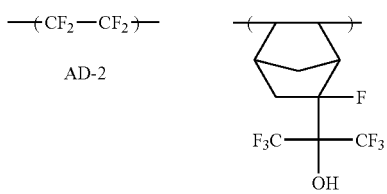

Molar ratio of repeating units 60/40
Weight average molecular weight 5000

AD-3

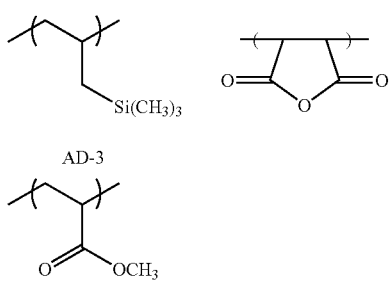

Molar ratio of repeating units 35/35/30
Weight average molecular weight 8000

From the results in Table 12, it can be seen that also in the liquid impregnation exposure, the resist composition of the present invention in ArF resist is excellent in resolving Power and line edge roughness.

According to the present invention, a resist composition excellent in the resolution, line edge roughness and sidelobe margin and a pattern forming method using the composition can be provided.

The entire disclosure of each and every foreign patent application from which the benefit of foreign priority has been claimed in the present application is incorporated herein by reference, as if fully set forth.

What is claimed is:

1. A resist composition, which comprises:
at least one nitrogen-containing compound selected from the group consisting of an amine compound having a phenoxy group and an ammonium salt compound having a phenoxy group,
wherein the at least one nitrogen-containing compound has at least one oxyalkylene group between the phenoxy group and the nitrogen atom.

2. The resist composition according to claim 1,
wherein the at least one nitrogen-containing compound is an amine compound having a phenoxy group, and
the amine compound having a phenoxy group is a tertiary amine compound.

3. The resist composition according to claim 1,
wherein the at least one nitrogen-containing compound is an amine compound having a phenoxy group, and
the amine compound having a phenoxy group has a molecular weight of from 300 to 1000.

4. The resist composition according to claim 1, which further comprises
(B) a compound of which solubility in an alkali developer increases under an action of an acid; and
(A) a compound capable of generating an acid upon irradiation with actinic rays or radiation,
wherein the resist composition is a positive resist composition.

5. The resist composition according to claim 4,
wherein the (B) compound of which solubility in an alkali developer increases under an action of an acid is a resin having a repeating unit represented by formula (A1) or (A2):

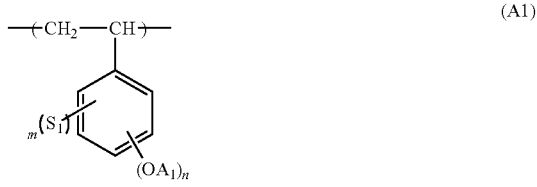

(A1)

(A2)

wherein in formula (A1),

A$_1$ represents a group which is eliminated under an action of an acid, represented by —C(R$^{01}$)(R$^{02}$)(R$^{03}$) or —C(R$^{04}$)(R$^{05}$)—O—R$^{06}$, wherein R$^{01}$ to R$^{03}$ each independently represents an alkyl group, a cycloalkyl group or an aryl group and may combine with each other to form a ring or a crosslinked ring; R$^{04}$ and R$^{05}$ each independently represents a hydrogen atom, an alkyl group, a cycloalkyl group or an aryl group; and R$^{06}$ represents an alkyl group, a cycloalkyl group or an aryl group;

S$_1$ represents a substituent, and when a plurality of S$_1$s are present, the plurality of S$_1$s may be the same or different;

n represents an integer of 0 to 3; and m represents an integer of 0 to 3, provided that m+n≦5, and in formula (A2), A$_2$ represents a group which is eliminated under an action of an acid, represented by —C(R$^{01}$)(R$^{02}$)(R$^{03}$), wherein R$^{01}$ to R$^{03}$ each independently represents an alkyl group, a cycloalkyl group or an aryl group and may combine with each other to form a ring or a crosslinked ring; and X represents a hydrogen atom, an alkyl group, a halogen atom, a cyano group or an alkyloxycarbonyl group.

6. The resist composition according to claim 4, wherein the (B) compound of which solubility in an alkali developer increases under an action of an acid is a resin having a repeating unit represented by formula (A3):

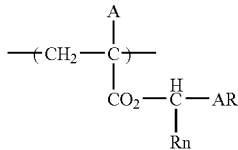

(A3)

wherein in formula (A3), AR represents a benzene ring or a naphthalene ring;

Rn represents an alkyl group, a cycloalkyl group or an aryl group;

Rn and AR may be combined together to form a ring; and

A represents a hydrogen atom, an alkyl group, a cycloalkyl group, a halogen atom, a cyano group or an alkyloxycarbonyl group.

7. The resist composition according to claim 4, which comprises at least one compound selected from the group consisting of a triarylsulfonium salt of an organosulfonic acid; and at least one compound selected from the group consisting of a diazodisulfone derivative and an oxime ester of an organosulfonic acid, as the (A) compound capable of generating an acid upon irradiation with actinic rays or radiation.

8. The resist composition according to claim 4, which comprises:

at least one compound selected from the group consisting of a compound capable of generating an organosulfonic acid upon irradiation with actinic rays or radiation; and at least one compound selected from the group consisting of a compound capable of generating a carboxylic acid or an imide acid upon irradiation with actinic rays or radiation, as the (A) compound capable of generating an acid upon irradiation with actinic rays or radiation.

9. A pattern forming method, which comprises:

forming a resist film from a resist composition according to claim 1; and exposing and developing the resist film.

10. A resist composition, which comprises:

(C2) at least one nitrogen-containing compound selected from the group consisting of an amine compound having a sulfonic acid ester group and an ammonium salt compound having a sulfonic acid ester group, wherein the at least one nitrogen-containing compound has at least one oxyalkylene group between the sulfonic acid ester group and the nitrogen atom;

(B) a compound of which solubility in an alkali developer increases under an action of an acid; and (A) a compound capable of generating an acid upon irradiation with actinic rays or radiation.

11. A pattern forming method, which comprises:

forming a resist film from a resist composition according to claim 10; and exposing and developing the resist film.

12. A resist composition, which comprises:

at least one nitrogen-containing compound selected from the group consisting of an amine compound having a phenoxy group and an ammonium salt compound having a phenoxy group; and an alicyclic hydrocarbon-based acid decomposable resin containing a repeating unit having a lactone structure.

13. The resist composition according to claim 12, wherein the at least one nitrogen-containing compound selected from the group consisting of an amine compound having a phenoxy group and an ammonium salt compound having a phenoxy group has at least one oxyalkylene group between the phenoxy group and the nitrogen atom.

14. The resist composition according to claim 12, wherein the at least one nitrogen-containing compound is an amine compound having a phenoxy group, and the amine compound having a phenoxy group is a tertiary amine compound.

15. The resist composition according to claim 12, wherein the at least one nitrogen-containing compound is an amine compound having a phenoxy group, and the amine compound having a phenoxy group has a molecular weight of from 300 to 1000.

16. A pattern forming method, which comprises:

forming a resist film from a resist composition according to claim 12; and exposing and developing the resist film.

17. A resist composition, which comprises:

at least one nitrogen-containing compound selected from the group consisting of an amine compound having a sulfonic acid ester group and an ammonium salt compound having a sulfonic acid ester group, wherein the at least one nitrogen-containing compound has at least one oxyalkylene group between the sulfonic acid ester group and the nitrogen atom;

an alkali-soluble compound, and an acid-crosslinking agent.

18. A pattern forming method, which comprises:

forming a resist film from a resist composition according to claim 17; and exposing and developing the resist film.

* * * * *